United States Patent
Liaw

(10) Patent No.: US 10,685,966 B2
(45) Date of Patent: Jun. 16, 2020

(54) INTEGRATED CIRCUITS WITH CONTACTING GATE STRUCTURES

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 9 days.

(21) Appl. No.: 15/981,004

(22) Filed: May 16, 2018

(65) Prior Publication Data
US 2019/0355729 A1 Nov. 21, 2019

(51) Int. Cl.
| H01L 29/78 | (2006.01) |
| H01L 27/11 | (2006.01) |
| H01L 29/66 | (2006.01) |
| H01L 29/417 | (2006.01) |
| H01L 27/088 | (2006.01) |

(52) U.S. Cl.
CPC .... H01L 27/1104 (2013.01); H01L 29/41791 (2013.01); H01L 29/66795 (2013.01); H01L 29/785 (2013.01); H01L 27/0886 (2013.01); H01L 2029/7858 (2013.01)

(58) Field of Classification Search
CPC ........... H01L 27/1104; H01L 29/41791; H01L 29/66795; H01L 29/785; H01L 27/0886; H01L 2029/7858
See application file for complete search history.

(56) References Cited

U.S. PATENT DOCUMENTS

| 6,914,338 | B1 | 7/2005 | Liaw |
| 7,394,155 | B2 | 7/2008 | Liaw |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 11/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2016/0284705 | A1* | 9/2016 | Chung ................ H01L 27/0924 |

* cited by examiner

*Primary Examiner* — Matthew C Landau
*Assistant Examiner* — Dmitriy Yemelyanov
(74) *Attorney, Agent, or Firm* — Haynes and Boone, LLP

(57) ABSTRACT

Examples of an integrated circuit with a contacting gate structure and a method for forming the integrated circuit are provided herein. In some examples, an integrated circuit device includes a memory cell that includes a plurality of fins and a gate extending over a first fin of the plurality of fins and a second fin of the plurality of fins. The gate includes a gate electrode that physically contacts the first fin and a gate dielectric disposed between the gate electrode and the second fin. In some such examples, the first fin includes a source/drain region and a doped region that physically contacts the gate electrode.

20 Claims, 66 Drawing Sheets

INTEGRATED CIRCUITS WITH CONTACTING GATE STRUCTURES

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, advances in fabrication have enabled three-dimensional designs, such as a fin-like field effect transistor (FinFET). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

The transistors that make up the integrated circuit, whether planar transistors, FinFETS, or other non-planar devices may serve a number of purposes from computation to storage. An integrated circuit device may include millions or billions of transistors arranged in computational cores, memory cells (such as Static Random Access Memory (SRAM) cells), I/O units, and/or other structures. Accordingly, the minimum transistor size and minimum spacing between transistors in the memory cells and elsewhere may have a profound effect on the size of the completed circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
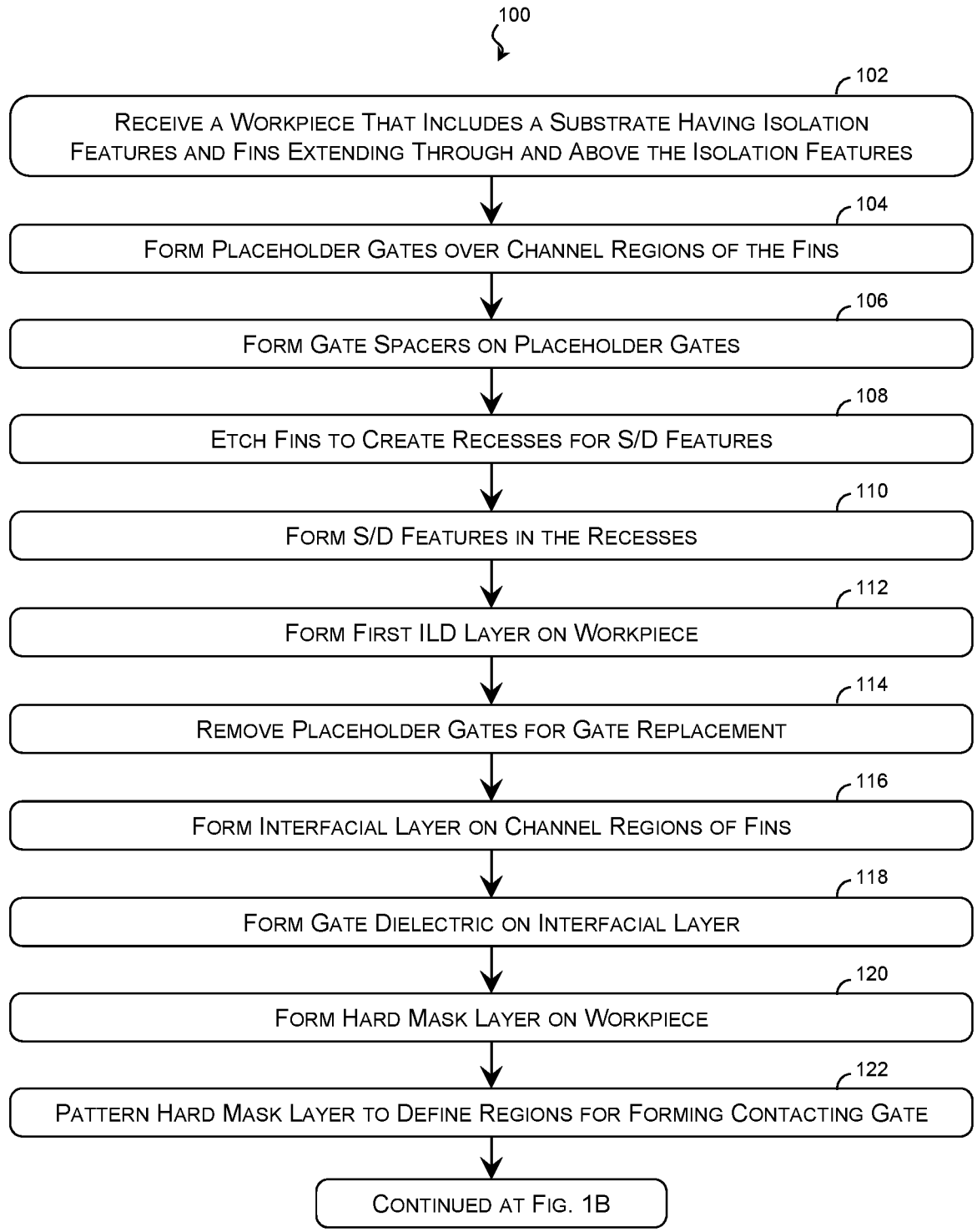
FIGS. 1A and 1B are flow diagrams of a method of fabricating a workpiece with a contacting gate according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

An exemplary integrated circuit includes a number of circuit devices (e.g., Fin-like Field Effect Transistors (FinFETs), planar FETs, Bipolar-Junction Transistors (BJTs), Light-Emitting Diodes (LEDs), memory devices, other active and/or passive devices, etc.) electrically coupled by an interconnect structure. The interconnect structure may include any number of dielectric layers stacked vertically with conductive lines running horizontally within the layers. Vias may extend vertically to connect conductive lines in one layer with conductive lines in an adjacent layer. Similarly, contacts may extend vertically between the conductive lines and substrate-level features. Together, the lines, vias, and contacts carry signals, power, and ground between the devices and allow them to operate as a circuit.

In examples where a feature of a first transistor (e.g., a source/drain feature) is to be electrically coupled to a feature of a second adjacent transistor (e.g., a gate structure), a butted contact may be used. The butted contact may be a single conductor or conductor layers extending through the lowest dielectric layer of the interconnect structure to physically and electrically couple the transistor features without an intervening conductive line. However, interconnect features, including contacts, have generally resisted attempts to reduce circuit size. In particular, as the spacing between transistors is reduced, butted contacts tend to inadvertently couple (i.e., short) to other transistors.

To address this issue and others, as an alternative to a butted contact, a gate structure of a transistor may be configured so that the conductive electrode directly contacts a semiconductor portion of an adjacent transistor to directly physically and electrically couple the transistors. Compared to a butted contact, a contacting gate may reduce the chance of unintended shorting. This improved control may allow the gate pitch and/or fin pitch to be reduced while still maintaining an acceptable yield. When used in SRAM areas and other dense areas, contacting gates provide a significant reduction in device size and spacing and provide a corresponding increase in device density.

As a further benefit, a contacting gate may free up routing areas that a butted contact may occupy. For example, because a butted contact is a contact, it may extend up through the dielectric layer to a height sufficient to couple to a metal line. When the butted contact is intended to couple a source/drain feature to a gate structure without also coupling to a metal line, a reserved area may be set aside at the metal line level to prevent shorting. In contrast, in many examples, a contacting gate does not extend high enough to couple to a metal line, and thus, metal lines may be run above the contacting gate without shorting.

Even when a contacting gate has a greater resistance than a butted contact, this may prove to be a benefit. In an example where the contacting gate is used in a SRAM device, the higher resistance may slow untended discharge of the SRAM due to charge injection (e.g., alpha particle injection, neutron injection, etc.), noisy conditions, or other causes of soft errors. In other words, the contacting gate may improve the Soft Error Rate (SER) of the device when compared with a butted contact. In these ways and others, the contacting gate may lead to reduced device size, increased device density, and/or improved reliability. However, unless otherwise noted, no embodiment is required to provide any particular advantage.

Figure 1B:
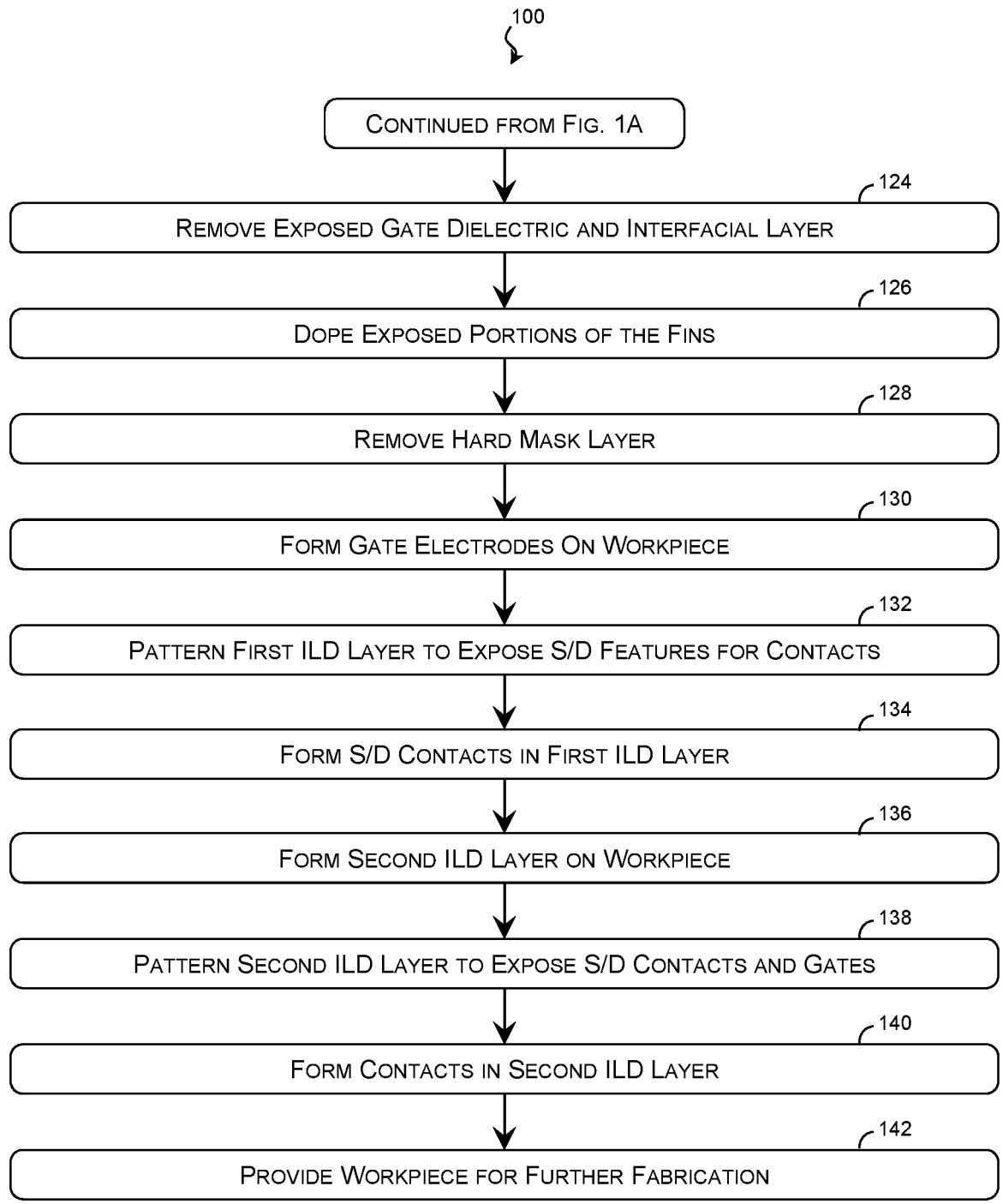

The present disclosure provides examples of a contacting gate and techniques for forming the gate. Examples of a circuit with a contacting gate that couples FinFET devices and a method of forming such are described with reference to FIGS. 1A-20C. In that regard, FIGS. 1A and 1B are flow diagrams of a method 100 of fabricating a workpiece 200 with a contacting gate according to various aspects of the present disclosure. Additional steps can be provided before, during, and after the method 100, and some of the steps described can be replaced or eliminated for other embodiments of the method 100.

FIGS. 2A, 3A, 4A, 5A, 6A, 7A, 8A, 9A, 10A, 11A, 12A, 13A, 14A, 15A, 16A, 17A, 18A, 19A, and 20A are top view diagrams of the workpiece 200 at various points in the method 100 of fabrication according to various aspects of the present disclosure. FIGS. 2B, 3B, 4B, 5B, 6B, 7B, 8B, 9B, 10B, 11B, 12B, 13B, 14B, 15B, 16B, 17B, 18B, 19B, and 20B are cross-sectional diagrams of the workpiece 200 taken along a gate plane 202 at various points in the method 100 of fabrication according to various aspects of the present disclosure. FIGS. 2C, 3C, 4C, 5C, 6C, 7C, 8C, 9C, 10C, 11C, 12C, 13C, 14C, 15C, 16C, 17C, 18C, 19C, and 20C are cross-sectional diagrams of the workpiece 200 taken along a fin-length plane 204 at various points in the method 100 of fabrication according to various aspects of the present disclosure. FIGS. 2A-20C have been simplified for the sake of clarity and to better illustrate the concepts of the present disclosure. Additional features may be incorporated into the workpiece 200, and some of the features described below may be replaced or eliminated for other embodiments of the workpiece 200.

Figure 2A:
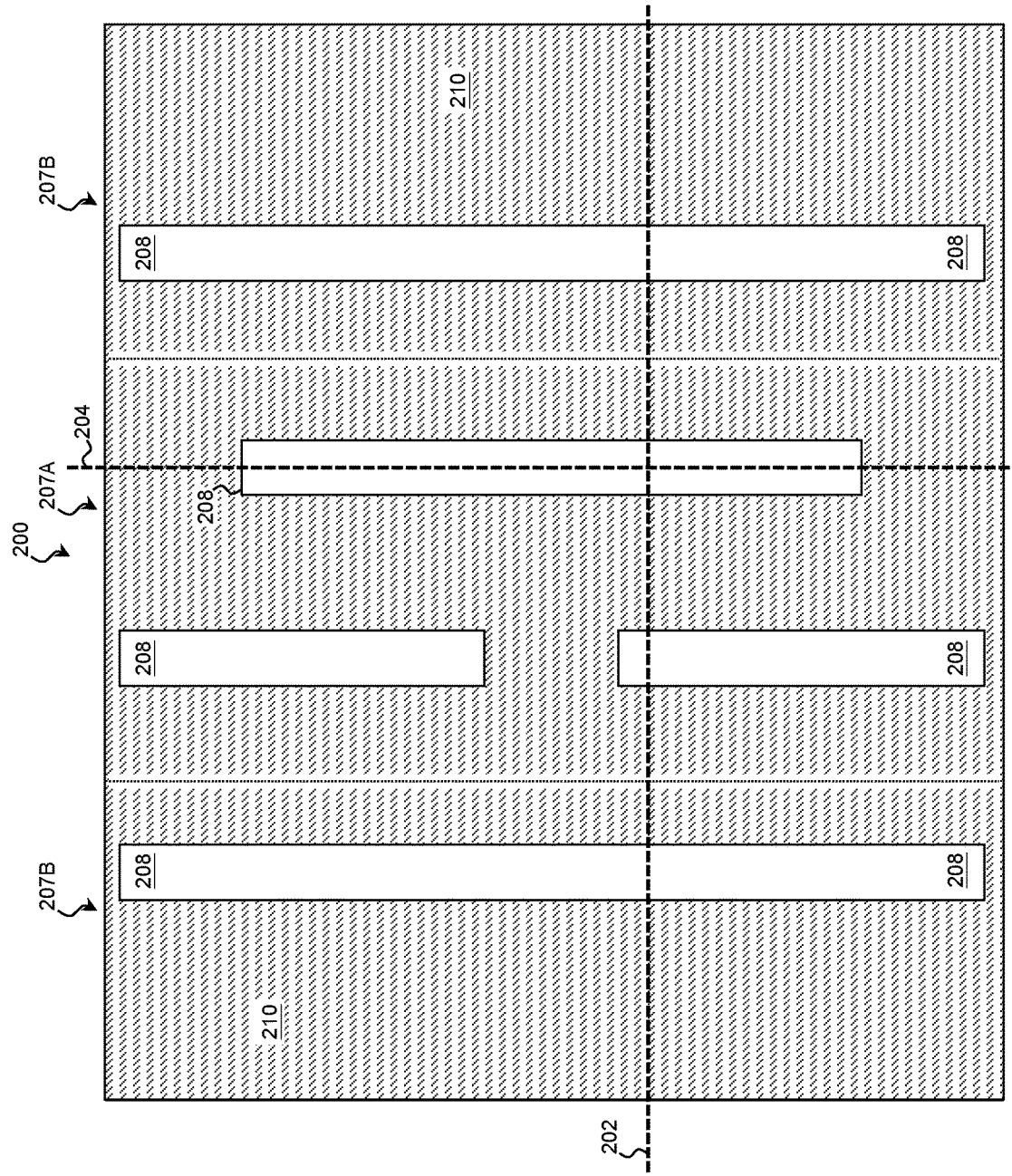
FIGS. 2A, 3A, 4A, 5A, 6A, 7A, 8A, 9A, 10A, 11A, 12A, 13A, 14A, 15A, 16A, 17A, 18A, 19A, and 20A are top view diagrams of the workpiece at various points in the method of fabrication according to various aspects of the present disclosure.
Figure 2B:
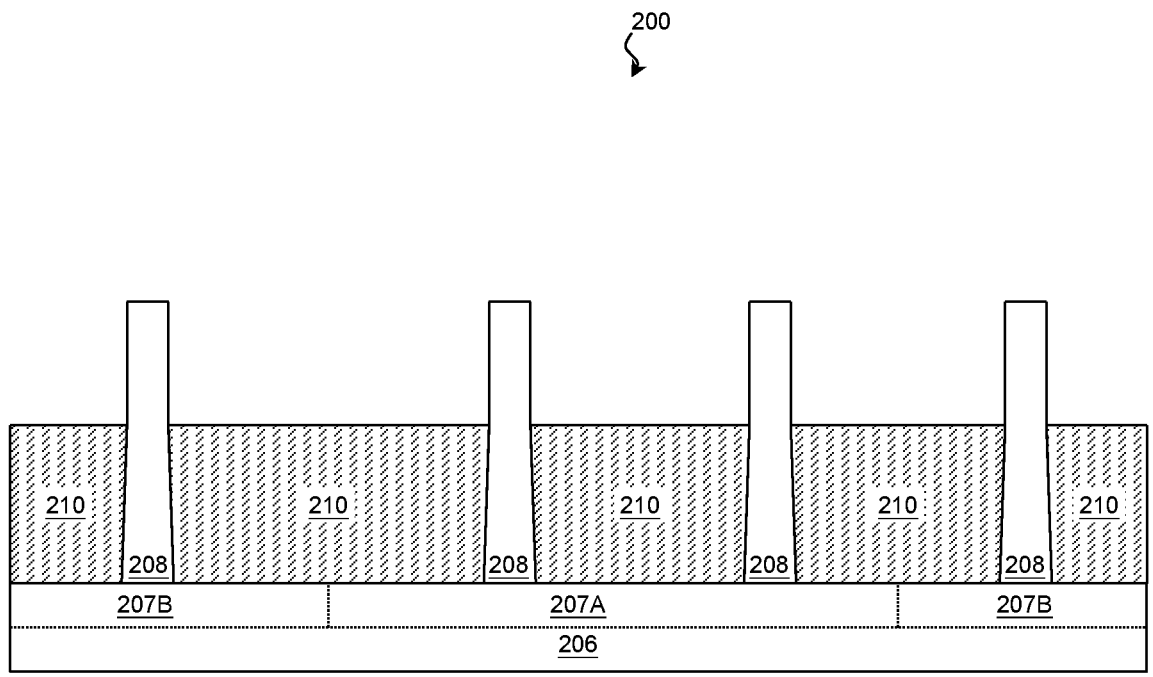
FIGS. 2B, 3B, 4B, 5B, 6B, 7B, 8B, 9B, 10B, 11B, 12B, 13B, 14B, 15B, 16B, 17B, 18B, 19B, and 20B are cross-sectional diagrams of the workpiece taken along a gate plane at various points in the method of fabrication according to various aspects of the present disclosure.
Figure 2C:
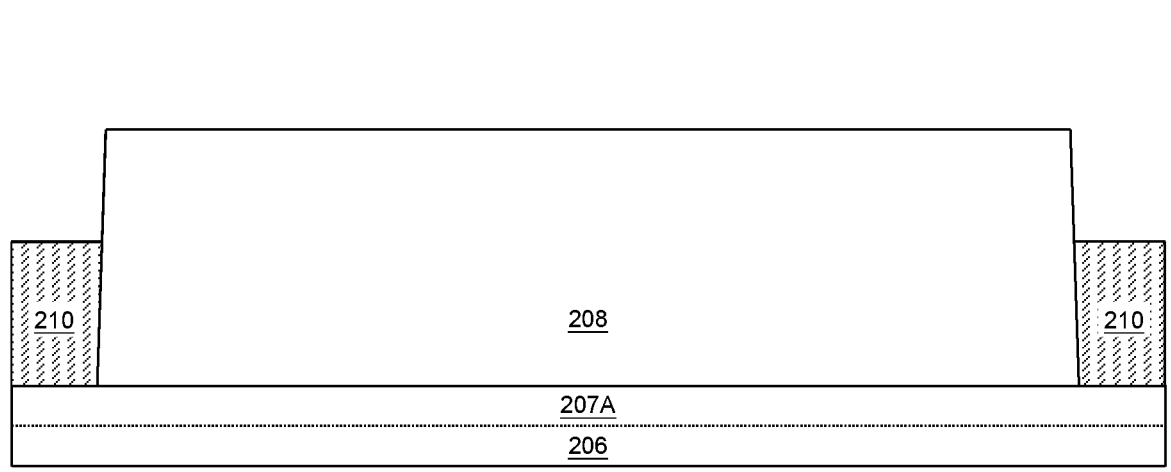
FIGS. 2C, 3C, 4C, 5C, 6C, 7C, 8C, 9C, 10C, 11C, 12C, 13C, 14C, 15C, 16C, 17C, 18C, 19C, and 20C are cross-sectional diagrams of the workpiece taken along a fin-length plane at various points in the method of fabrication according to various aspects of the present disclosure.

Referring to block 102 of FIG. 1A and to FIGS. 2A-2C, the workpiece 200 is received. The workpiece 200 includes a substrate 206 upon which devices are to be formed. In various examples, the substrate 206 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 206 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 206. In some such examples, a layer of the substrate 206 may include an insulator such as a semiconductor oxide, a semiconductor nitride, a semiconductor oxynitride, a semiconductor carbide, and/or other suitable insulator materials.

Doped regions, such as wells, may be formed on the substrate 206. In that regard, some portions of the substrate 206 may be doped with p-type dopants, such as boron, $BF_2$, or indium while other portions of the substrate 206 may be doped with n-type dopants, such as phosphorus or arsenic; and/or other suitable dopants including combinations thereof. Referring to FIGS. 2A-2C, a first set of example doped regions is indicated by marker 207A and a second set by marker 207B. For reference, the doped regions 207A and 207B are indicated in the top view of FIG. 2A, even though the substrate 206 itself is obscured. In some examples, doped regions 207A and 207B are doped to be of opposite types. In one such example, doped regions 207A are doped with an n-type dopant and doped regions 207B are doped with a p-type dopant.

In some examples, the devices to be formed on the substrate 206 extend out of the substrate 206. For example, FinFETs and/or other non-planar devices may be formed on device fins 208 disposed on the substrate 206. The device fins 208 are representative of any raised feature and include FinFET device fins 208 as well as fins 208 for forming other raised active and passive devices upon the substrate 206. The fins 208 may be formed by etching portions of the substrate 206, by depositing various layers on the substrate 206 and etching the layers, and/or by other suitable techniques. For example, the fins 208 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins 208 may be similar in composition to the substrate 206 or may be different therefrom. For example, in some embodiments, the substrate 206 may include primarily silicon, while the fins 208 include one or more layers that are primarily germanium or a SiGe semiconductor. In some embodiments, the substrate 206 includes a SiGe semiconductor, and the fins 208 include one or more layers that include a SiGe semiconductor with a different ratio of silicon to germanium.

The fins 208 may be physically and electrically separated from each other by isolation features 210, such as a shallow trench isolation features (STIs). In that regard, the fins 208 extend from the substrate 206 through the isolation features 210 and extend above the isolation features 210 so that a forthcoming gate structure may wrap around the fins 208. In various examples, the isolation features 210 include dielectric materials such as semiconductor oxides, semiconductor nitrides, semiconductor carbides, FluoroSilicate Glass (FSG), low-K dielectric materials, and/or other suitable dielectric materials.

Figure 3A:
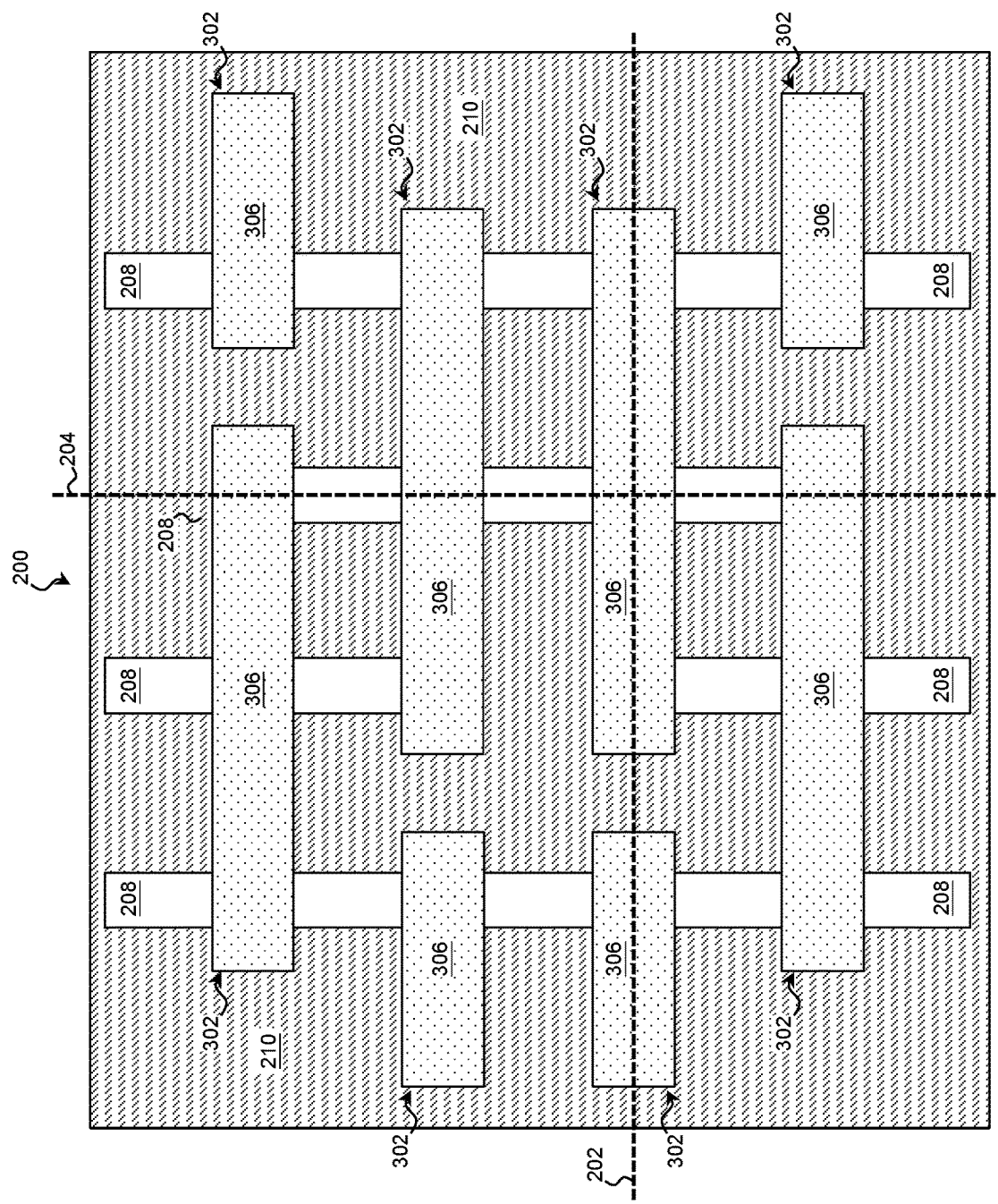
Figure 3B:
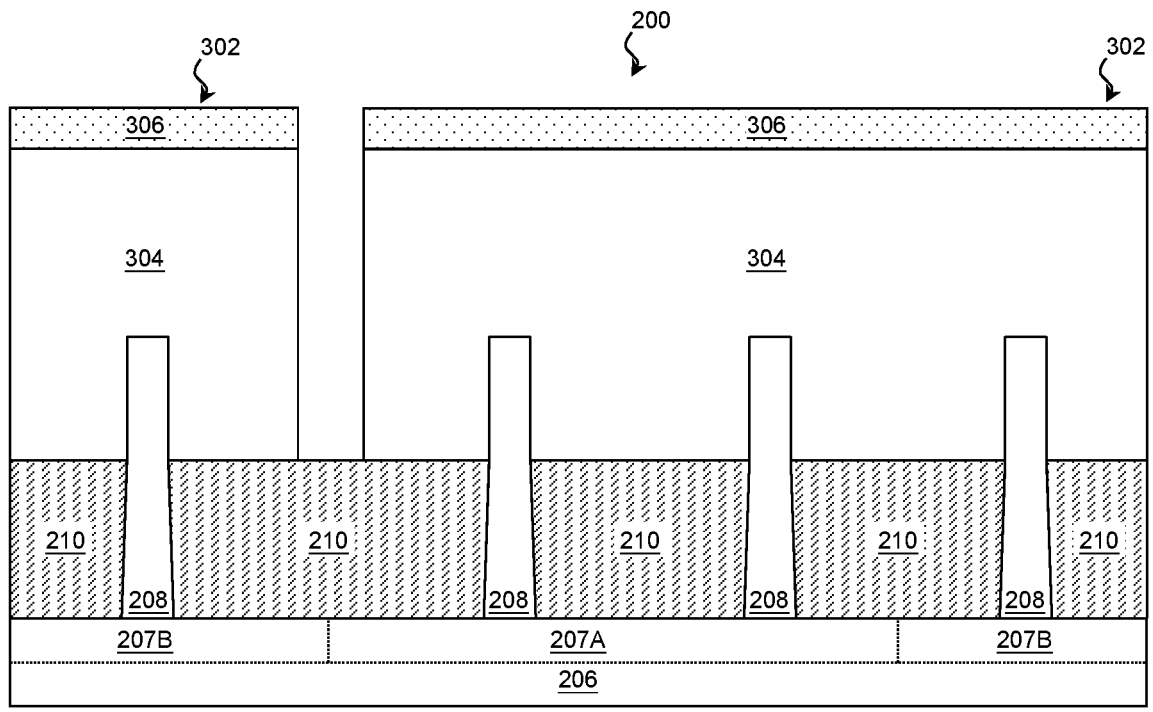
Figure 3C:
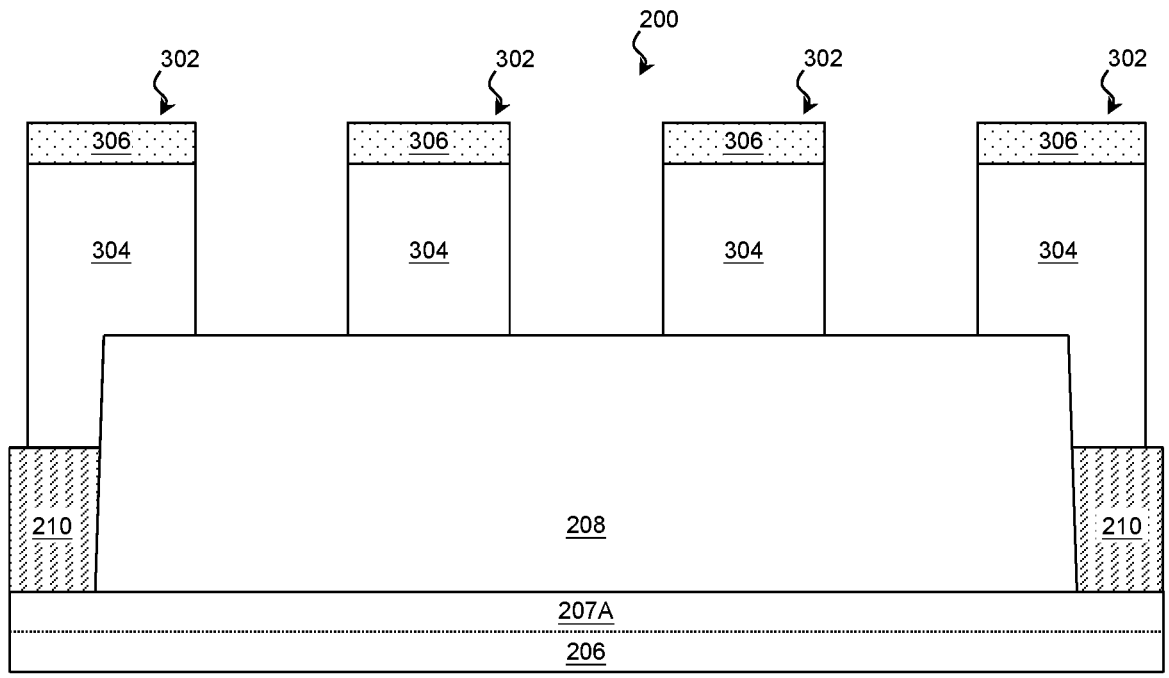

Referring to block 104 of FIG. 1A and to FIGS. 3A-3C, placeholder or dummy gates 302 are formed over channel regions of the fins 208. The flow of carriers (electrons for an n-channel FinFET and holes for a p-channel FinFET) between source/drain features through a channel region is controlled by a voltage applied to a gate structure that is adjacent to and overwrapping the channel region. When materials of the gate structure are sensitive to some fabrication processes, such as source/drain activation annealing, a placeholder gate 302 may be used during some of the fabrication processes and subsequently removed and replaced with elements of the gate structures (e.g., gate electrodes, a gate dielectric layers, interfacial layers, etc.) in a gate-last process.

In an example, forming the placeholder gates 302 includes depositing a layer of placeholder gate material 304 such as polysilicon, a dielectric material (e.g., a semiconductor oxide, a semiconductor nitride, a semiconductor oxynitride, a semiconductor carbide, a semiconductor oxycarbonitride, etc.), and/or other suitable material. In various examples, the placeholder gate material 304 is formed to any suitable thickness using any suitable process including Chemical Vapor Deposition (CVD), High-Density Plasma CVD (HDP-CVD), Physical Vapor Deposition (PVD), Atomic Layer Deposition (ALD), spin-on deposition, and/or other suitable deposition processes. The placeholder gate material 304 may be deposited as a uniform layer and patterned in a photolithographic process.

In some such examples, a photoresist layer 306 is formed on the placeholder gate material 304 and patterned to define the placeholder gates 302. An exemplary photoresist layer 306 includes a photosensitive material that causes the layer to undergo a property change when exposed to light. This property change can be used to selectively remove exposed or unexposed portions of the photoresist layer in a process referred to as lithographic patterning. In an example, a photolithographic system exposes the photoresist layer 306 to radiation in a particular pattern determined by a mask. Light passing through or reflecting off the mask strikes the photoresist layer 306, thereby transferring a pattern formed on the mask to the photoresist layer 306. In other such examples, the photoresist layer 306 is patterned using a direct write or maskless lithographic technique, such as laser patterning, e-beam patterning, and/or ion-beam patterning.

Once exposed, the photoresist layer 306 is developed, leaving the exposed portions of the resist, or in alternative examples, leaving the unexposed portions of the resist. An exemplary patterning process includes soft baking of the photoresist layer 306, mask aligning, exposure, post-exposure baking, developing the photoresist layer 306, rinsing, and drying (e.g., hard baking). The patterned photoresist layer 306 exposes portions of the placeholder gate material 304 to be etched.

Referring still to block 104 of FIG. 1A and to FIGS. 3A-3C, the exposed portions of the placeholder gate material 304 are etched to further define the placeholder gates 302. The etching processes may include any suitable etching technique, such as wet etching, dry etching, Reactive Ion Etching (RIE), ashing, and/or other etching methods. In some embodiments, the etching process includes dry etching using an oxygen-based etchant, a fluorine-based etchant, a chlorine-based etchant, a bromine-based etchant, an iodine-based etchant, other suitable etchant gases or plasmas, and/or combinations thereof. In particular, the etching steps and chemistries may be configured to etch the placeholder gate material 304 without significantly etching the fins 208 or the isolation features 210. Any remaining photoresist layer 306 may be removed from the placeholder gate material 304 after the etching.

Figure 4A:
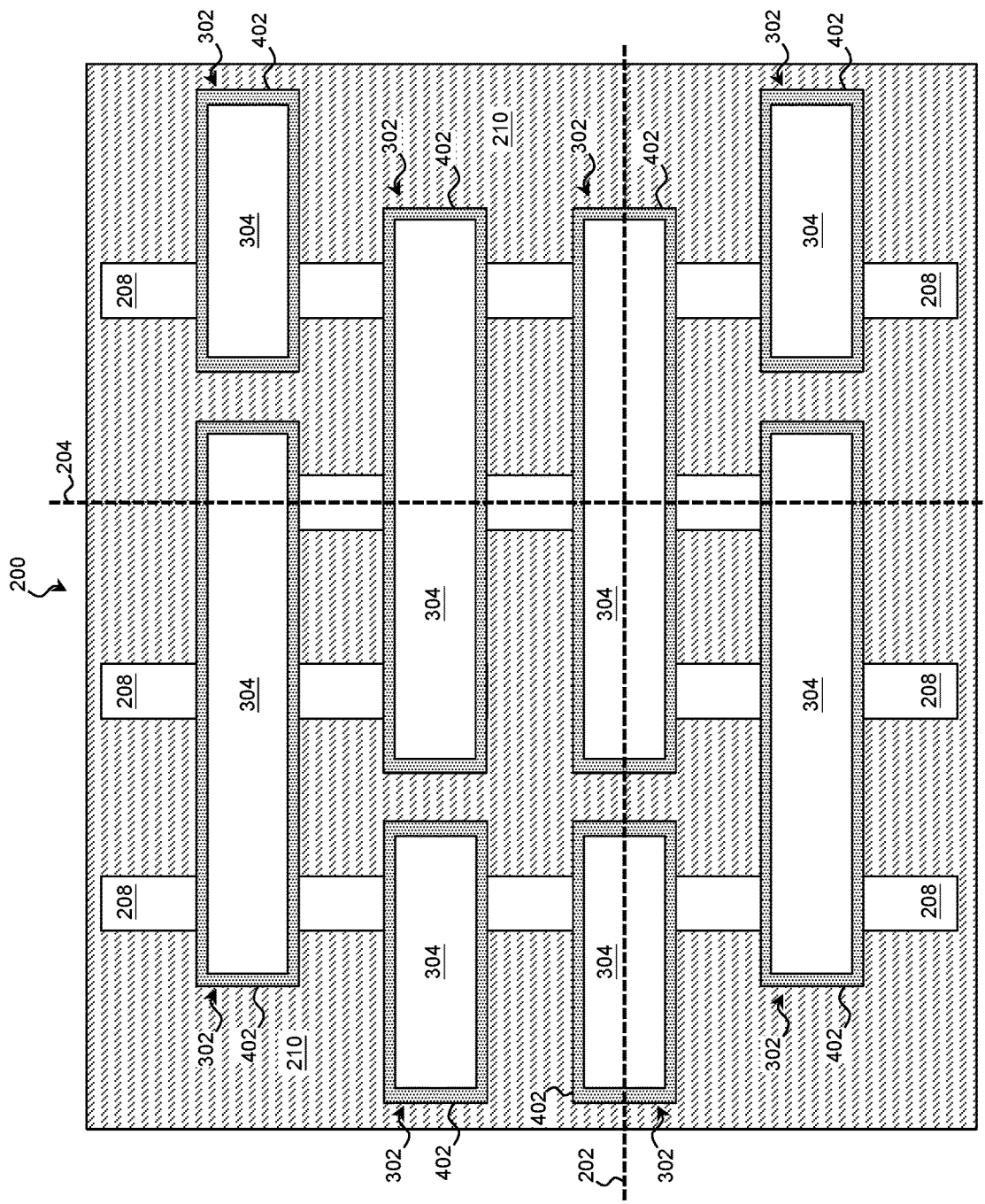
Figure 4B:
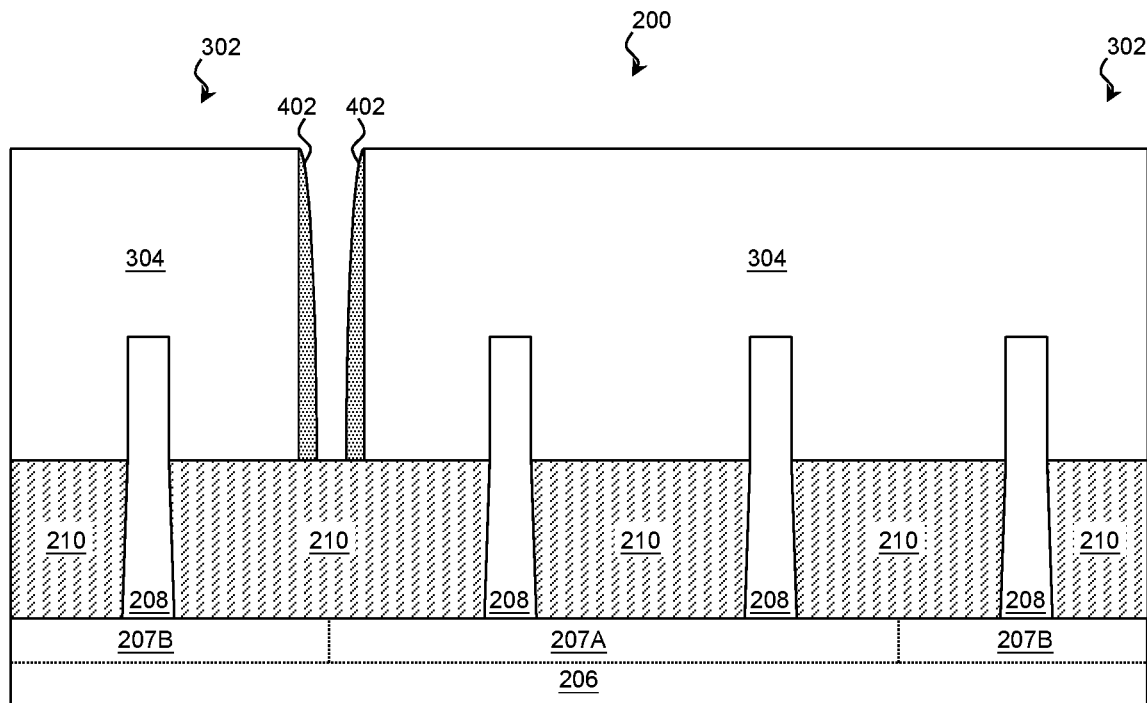
Figure 4C:
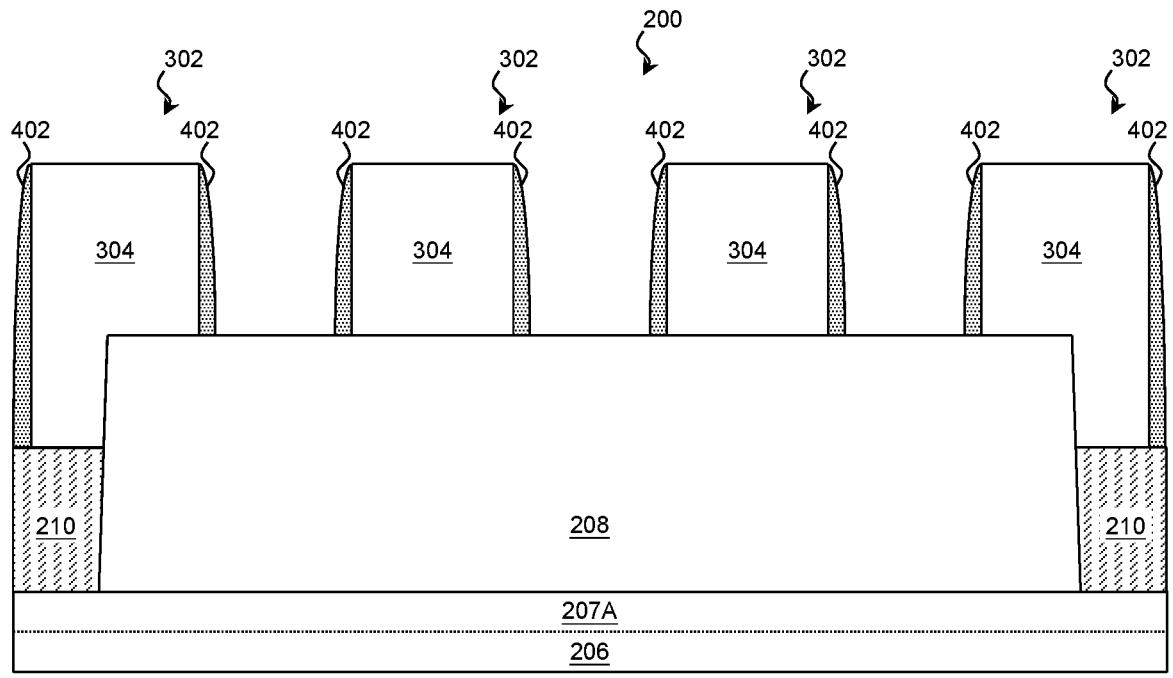

Referring to block 106 of FIG. 1A and to FIGS. 4A-4C, gate spacers 402 are formed on side surfaces of the placeholder gates 302. In various examples, the gate spacers 402 includes one or more layers of suitable materials, such as a dielectric material (e.g., a semiconductor oxide, a semiconductor nitride, a semiconductor oxynitride, a semiconductor carbide, a semiconductor oxycarbonitride, etc.), SOG, tetraethylorthosilicate (TEOS), PE-oxide, HARP-formed oxide, and/or other suitable material. In one such embodiment, the gate spacers 402 each include a first layer of silicon oxide, a second layer of silicon nitride disposed on the first layer, and a third layer of silicon oxide disposed on the second layer. In the embodiment, each layer of the gate spacers 402 has a thickness between about 1 nm and about 10 nm.

The gate spacer 402 layers may be formed using any suitable deposition technique (e.g., CVD, HDP-CVD, ALD, etc.). In an example, the gate spacer 402 layers are deposited on the placeholder gates 302 and the isolation features 210 using a conformal technique. The gate spacer 402 layers are then selectively etched to remove them from the horizontal surfaces of the placeholder gates 302, the fins 208, and the isolation features 210 while leaving them on the vertical surfaces of the placeholder gates 302. This defines the gate spacers 402 alongside the placeholder gates 302. The etching process may be performed using any suitable etching method, such as wet etching, dry etching, RIE, ashing, and/or other etching methods and may use any suitable etchant chemistries. The etching methods and the etchant chemistries may vary as the gate spacer 402 layers are etched to target the particular material being etched while minimizing unintended etching of the materials not being targeted. In some such examples, the etching process is configured to anisotropically etch the gate spacer layers, while leaving the portions of the gate spacers 402 on the vertical sidewalls of the placeholder gates 302.

Figure 5A:
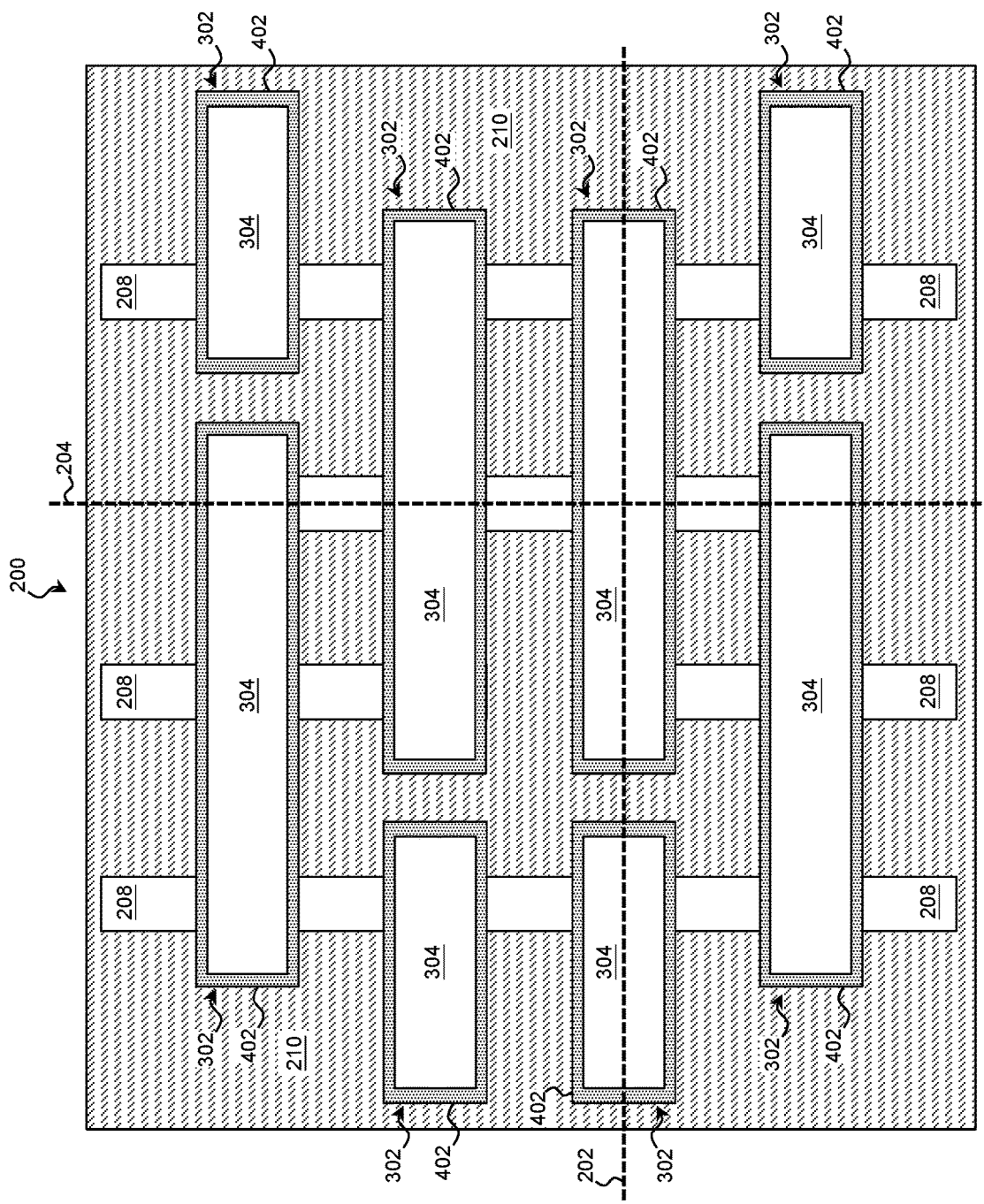
Figure 5B:
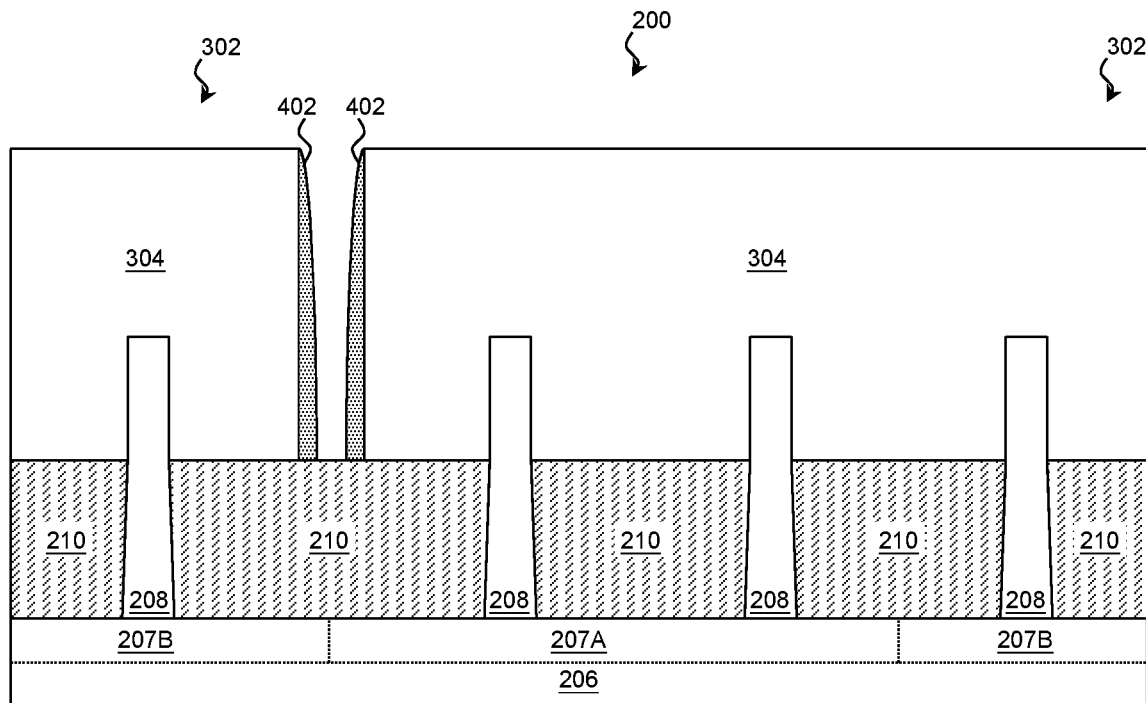
Figure 5C:
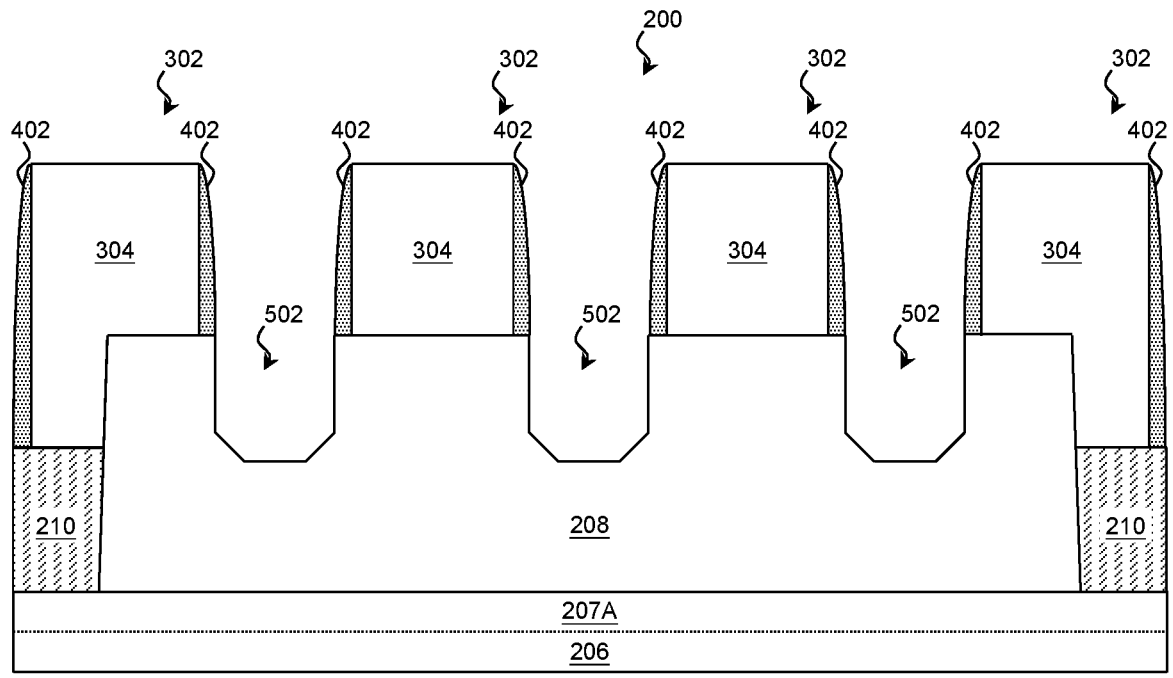

Referring to block 108 of FIG. 1A and to FIGS. 5A-5C, an etching process is performed on the fins 208 to create recesses 502 in which to form source/drain features. The etching process may be performed using any suitable etching method, such as wet etching, dry etching, RIE, ashing, and/or other etching methods and may use any suitable etchant chemistries, such as carbon tetrafluoride ($CF_4$), difluoromethane ($CH_2F_2$), trifluoromethane ($CHF_3$), other suitable etchants, and/or combinations thereof. The etching methods and the etchant chemistries may be selected to etch the fins 208 without significant etching of the placeholder gates 302, gate spacers 402, and/or the isolation features 210.

Figure 6A:
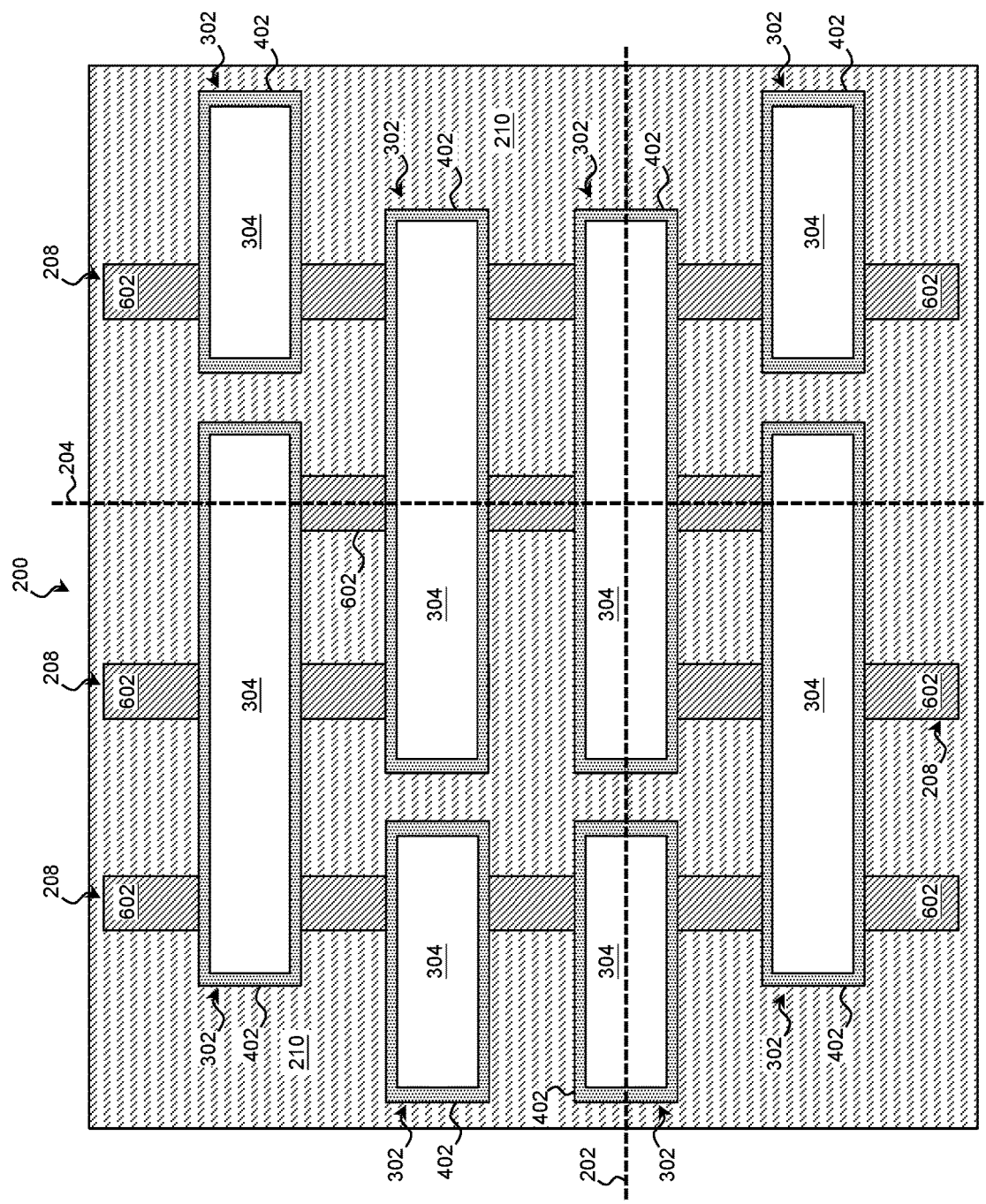
Figure 6B:
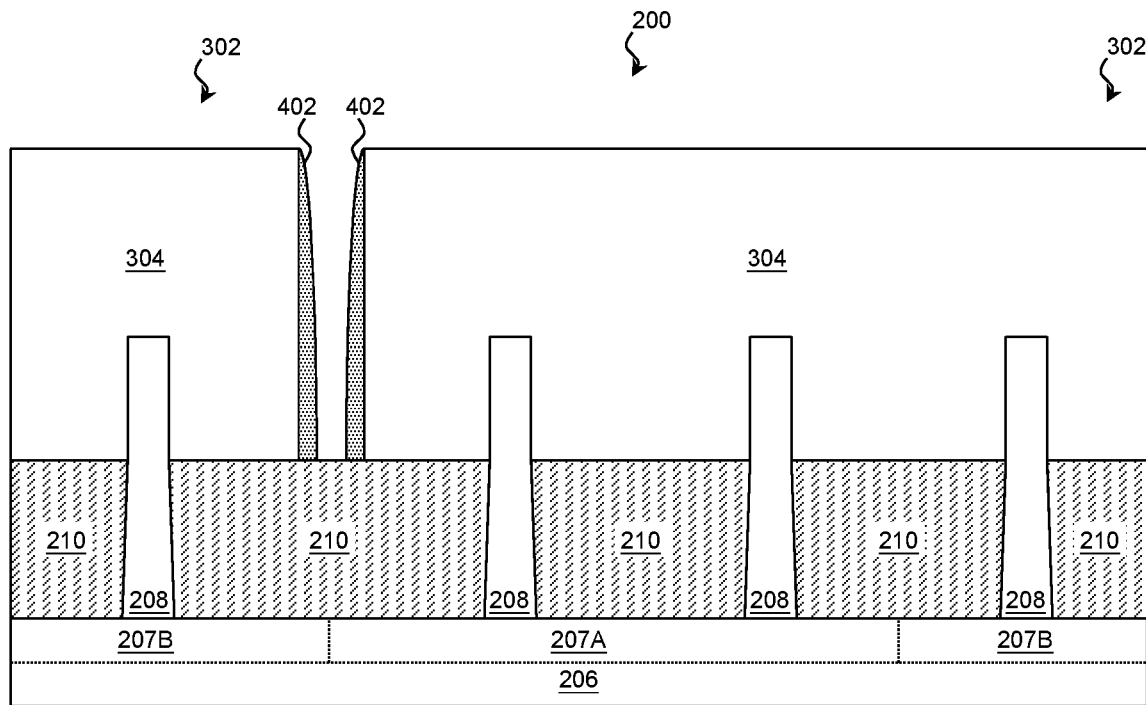
Figure 6C:
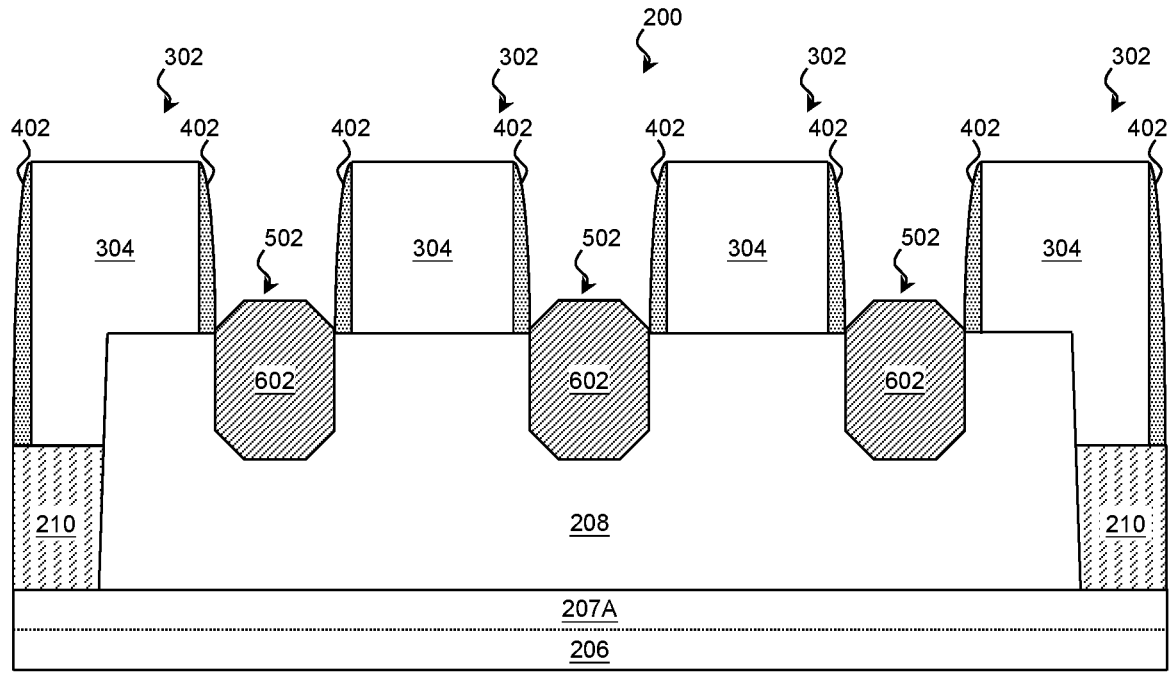

Referring to block 110 of FIG. 1A and to FIGS. 6A-6C, an epitaxy process is performed on the workpiece 200 to grow source/drain features 602 within the recesses 502. In various examples, the epitaxy process includes a CVD deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the substrate 206 (e.g., silicon or silicon-germanium) to form the source/drain features 602. The semiconductor component of the source/drain features 602 may be similar to or different from the remainder of the fin 208. For example, Si-containing source/drain features 602 may be formed on a SiGe-containing fin 208 or vice versa. When the source/drain features 602 and fins 208 contain more than one semiconductor, the ratios may be substantially similar or different. In various examples where the source/drain features 602 and fins 208 include SiGe, the source/drain features 602 have a Ge ratio between about 30% and about 75% and the fins 208 have a Ge ratio between about 10% and about 40%.

The source/drain features 602 may be in-situ doped to include p-type dopants, such as boron, $BF_2$, or indium; n-type dopants, such as phosphorus or arsenic; and/or other suitable dopants including combinations thereof. Additionally or in the alternative, the source/drain features 602 may be doped using an implantation process (i.e., a junction implant process) after the source/drain features 602 are formed. With respect to the particular dopant type, the source/drain features 602 are doped to be of opposite type than the remainder of the fins 208. For an n-channel device, the fin 208 is doped with an n-type dopant and the source/drain features 602 are doped with a p-type dopant, and vice versa for a p-channel device. Once the dopant(s) are introduced into the source/drain features 602, a dopant activation process, such as Rapid Thermal Annealing (RTA) and/or a laser annealing process, may be performed to activate the dopants.

Figure 7A:
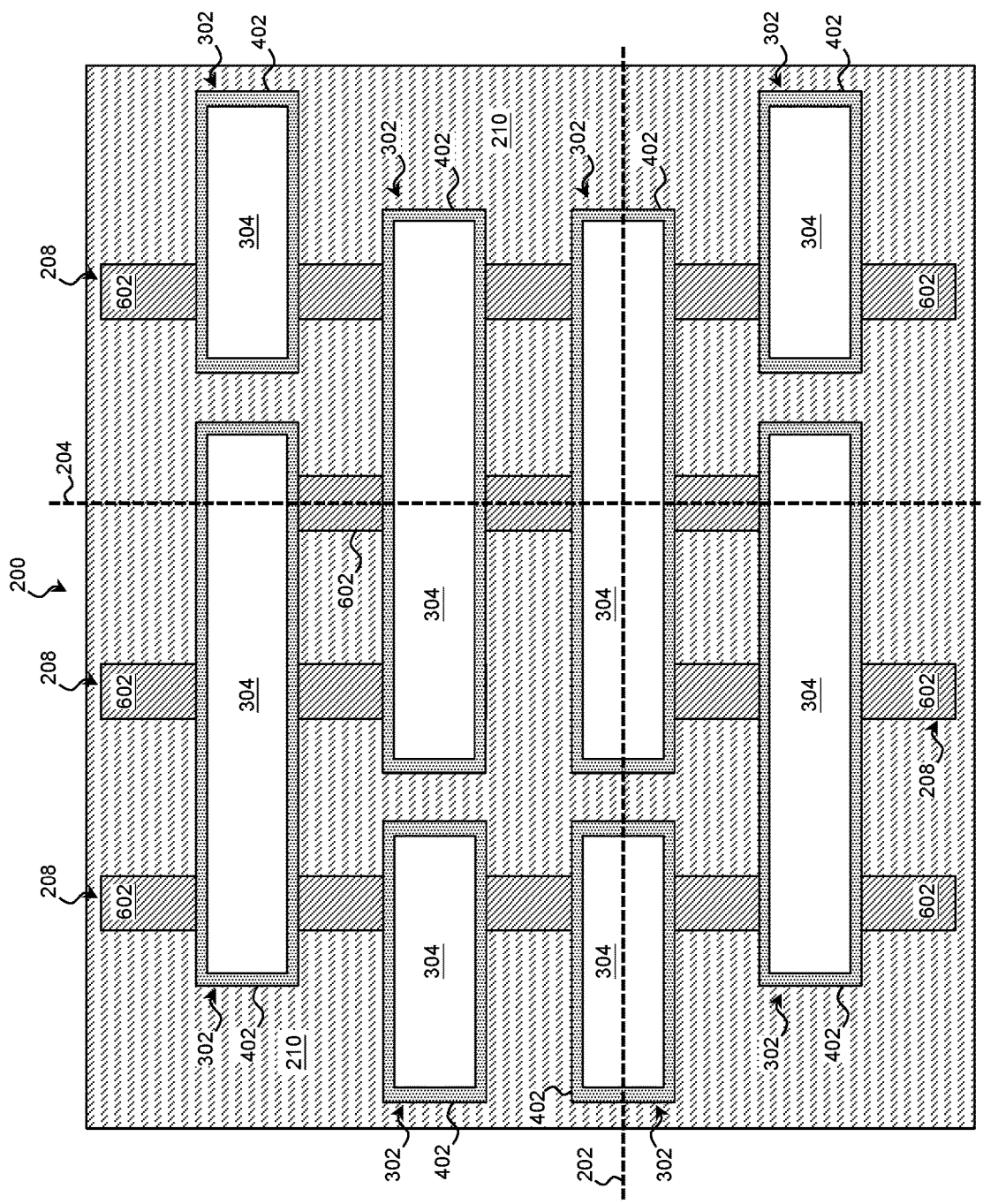
Figure 7B:
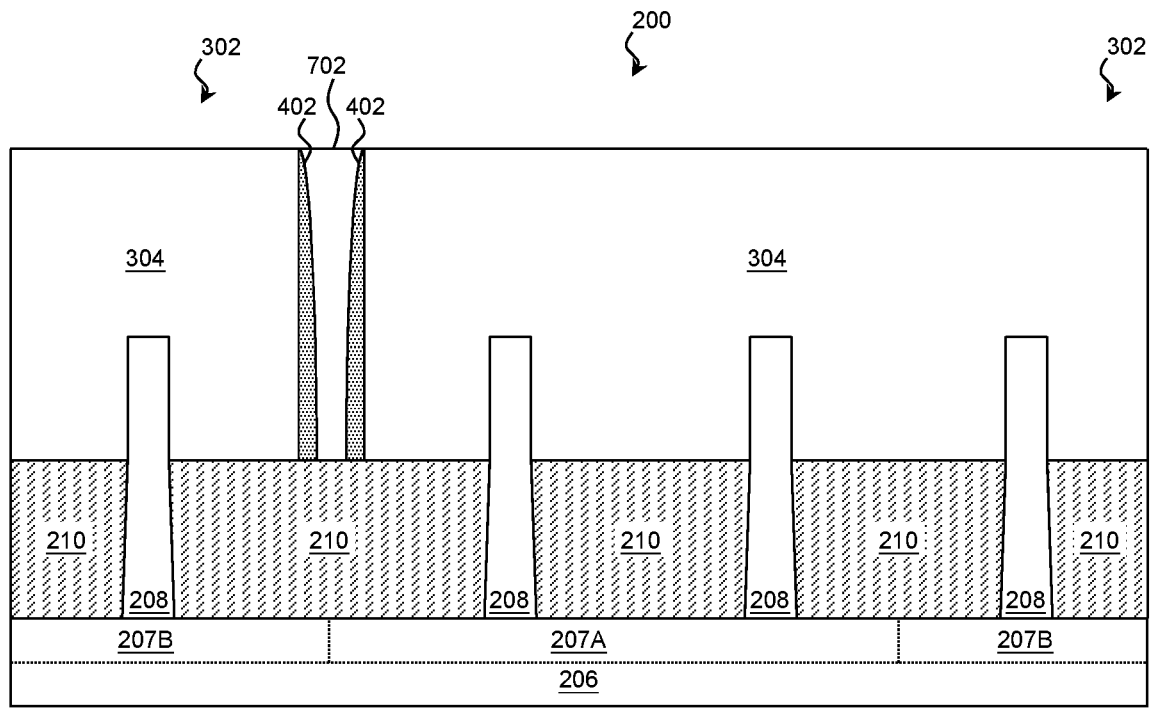
Figure 7C:
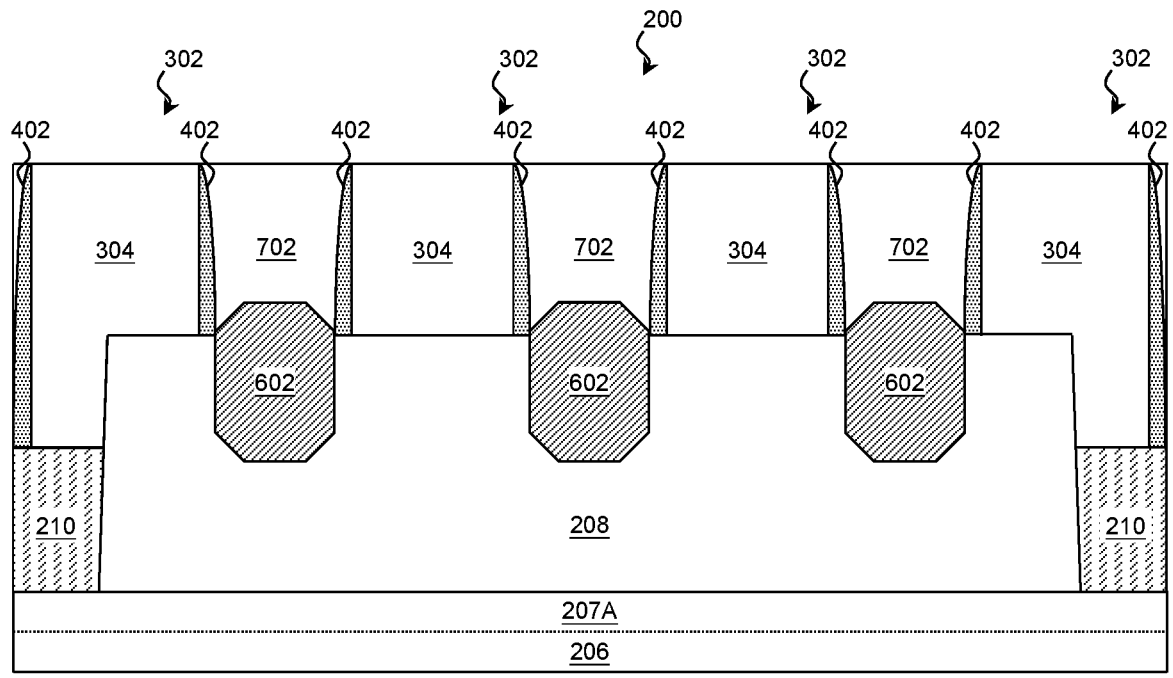

Referring to block 112 of FIG. 1A and referring to FIGS. 7A-7C, a first Inter-Level Dielectric (ILD) layer 702 is formed on the workpiece 200. The first ILD layer 702 is not shown in the top view of FIG. 7A to avoid obscuring other elements of the workpiece 200. The first ILD layer 702 acts as an insulator that supports and isolates conductive traces of an electrical multi-level interconnect structure. In turn, the multi-level interconnect structure electrically interconnects elements of the workpiece 200, such as the source/drain features 602 and the gate structures formed later. The first ILD layer 702 may include a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, parylene, BCB, SILK® (Dow Chemical of Midland, Mich.), and/or combinations thereof. The first ILD layer 702 may be formed by any suitable process including CVD, PVD, spin-on deposition, and/or other suitable processes.

Forming the first ILD layer 702 may include performing a chemical mechanical polish/planarization (CMP) process on the workpiece 200 to remove the first ILD layer 702 from the top of the placeholder gates 302. The CMP process may be followed by an etch back process to remove any remaining first ILD layer 702 material from the placeholder gates 302.

Figure 8A:
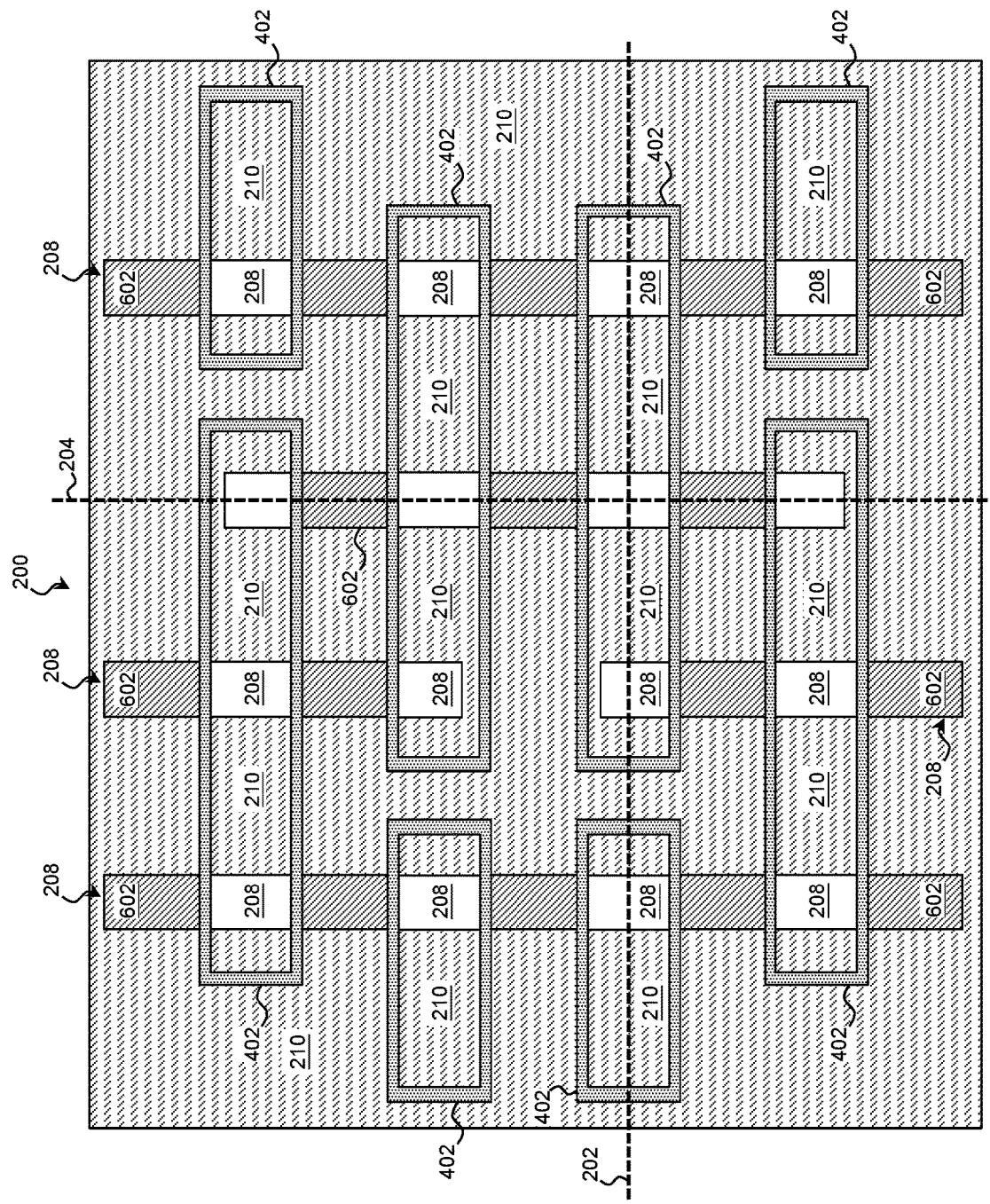
Figure 8B:
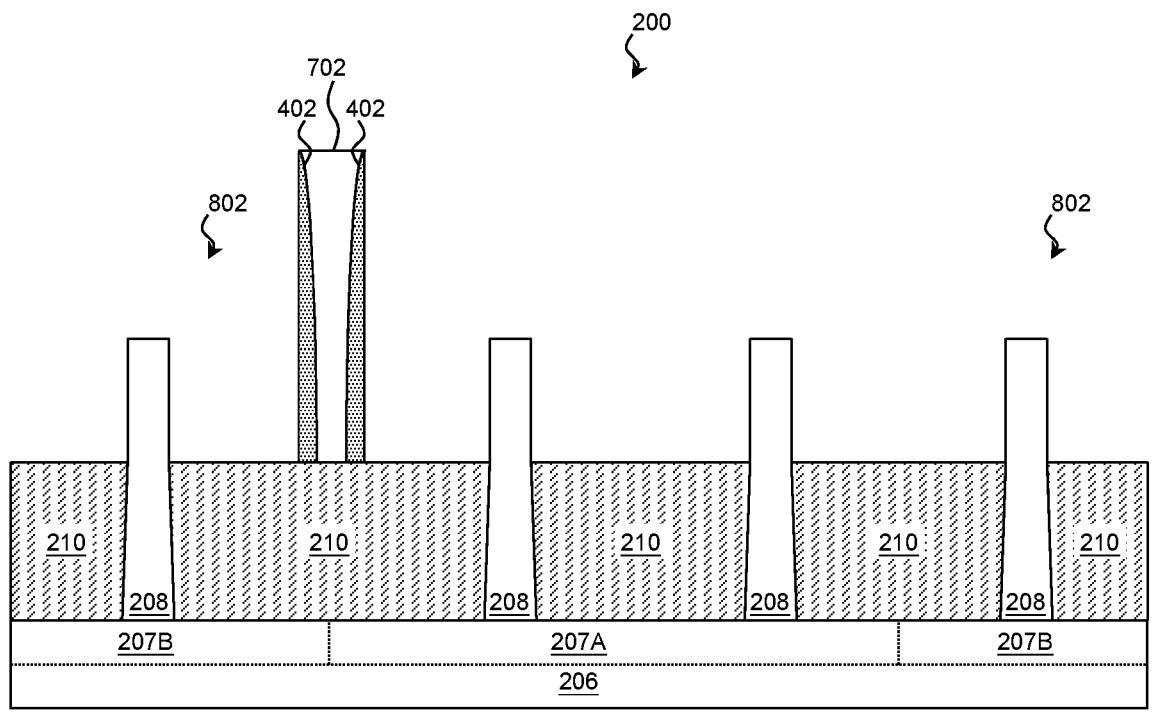
Figure 8C:
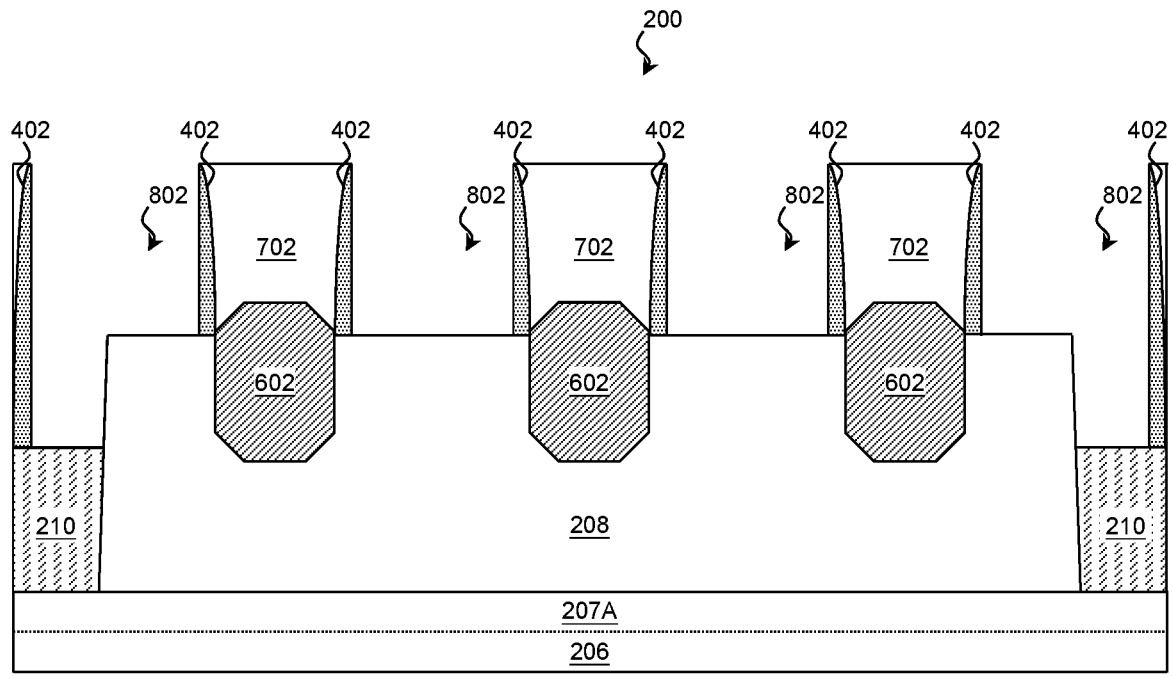
Figure 9A:
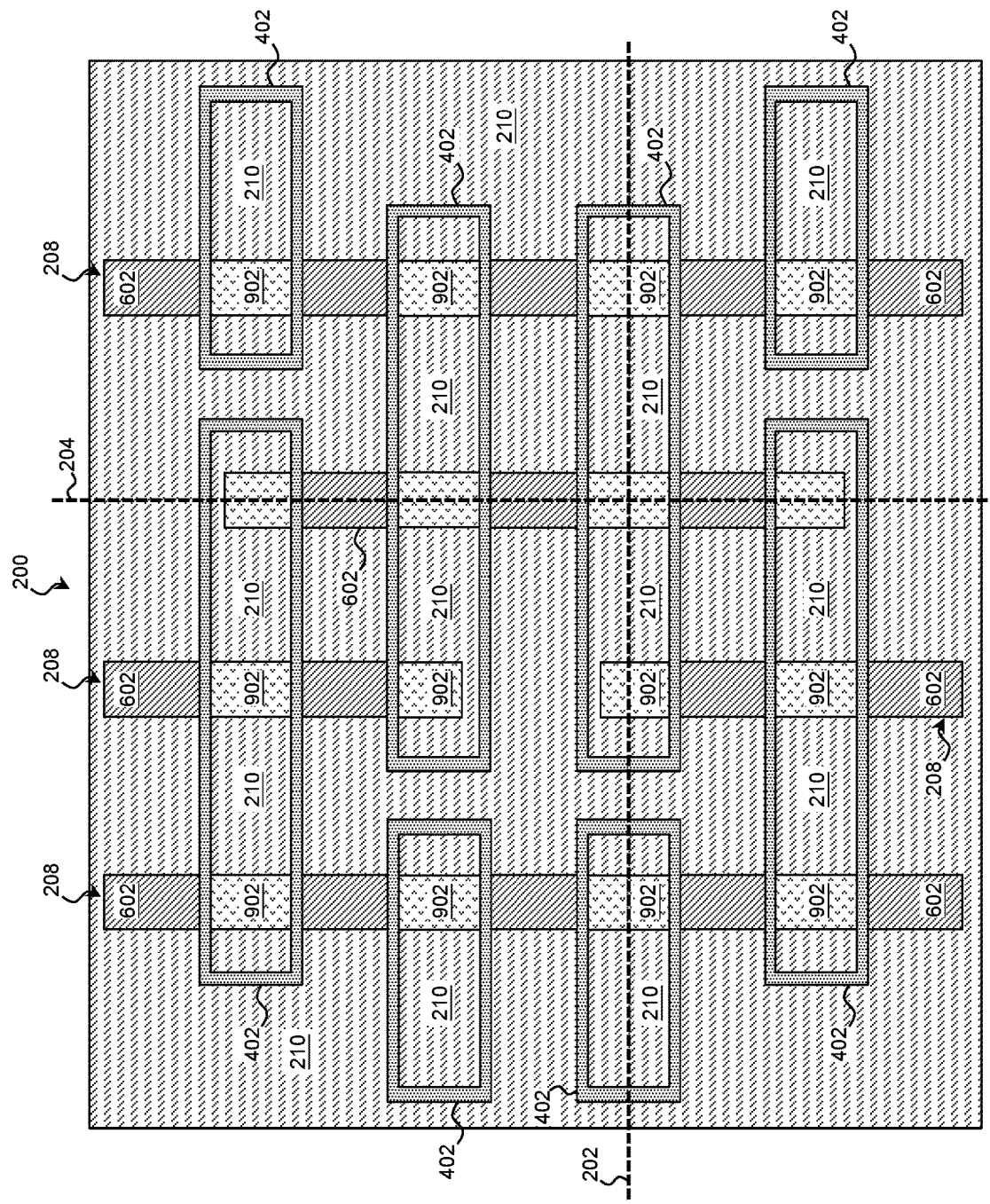
Figure 9B:
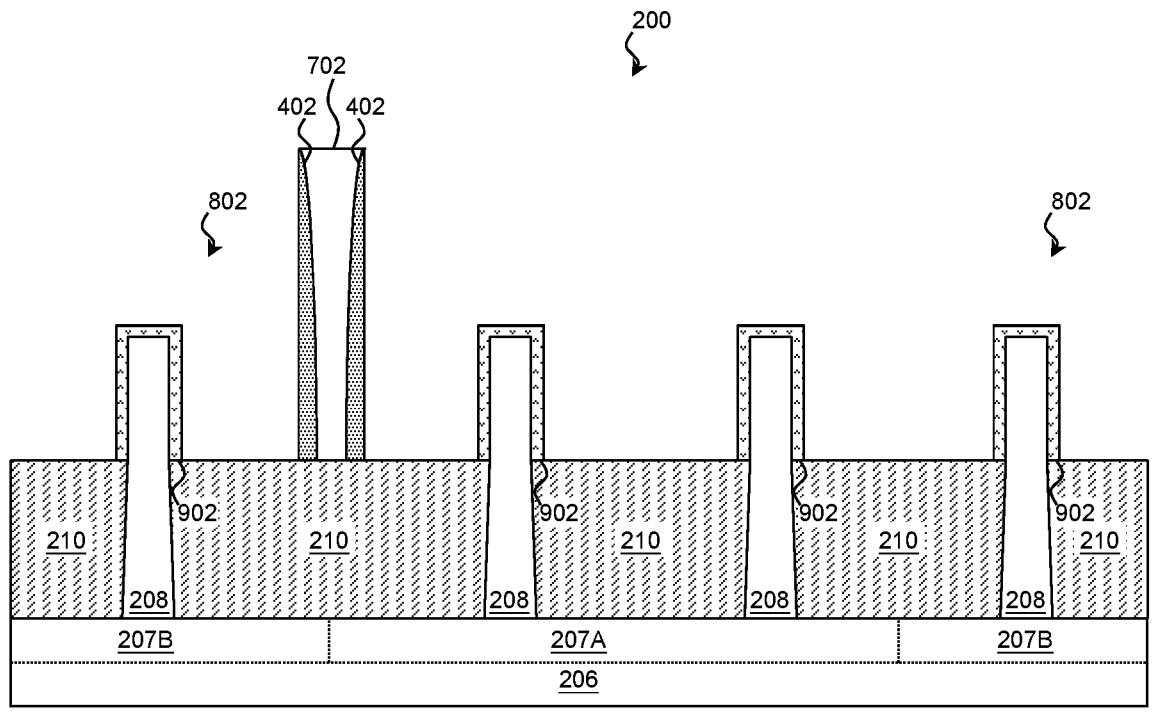
Figure 9C:
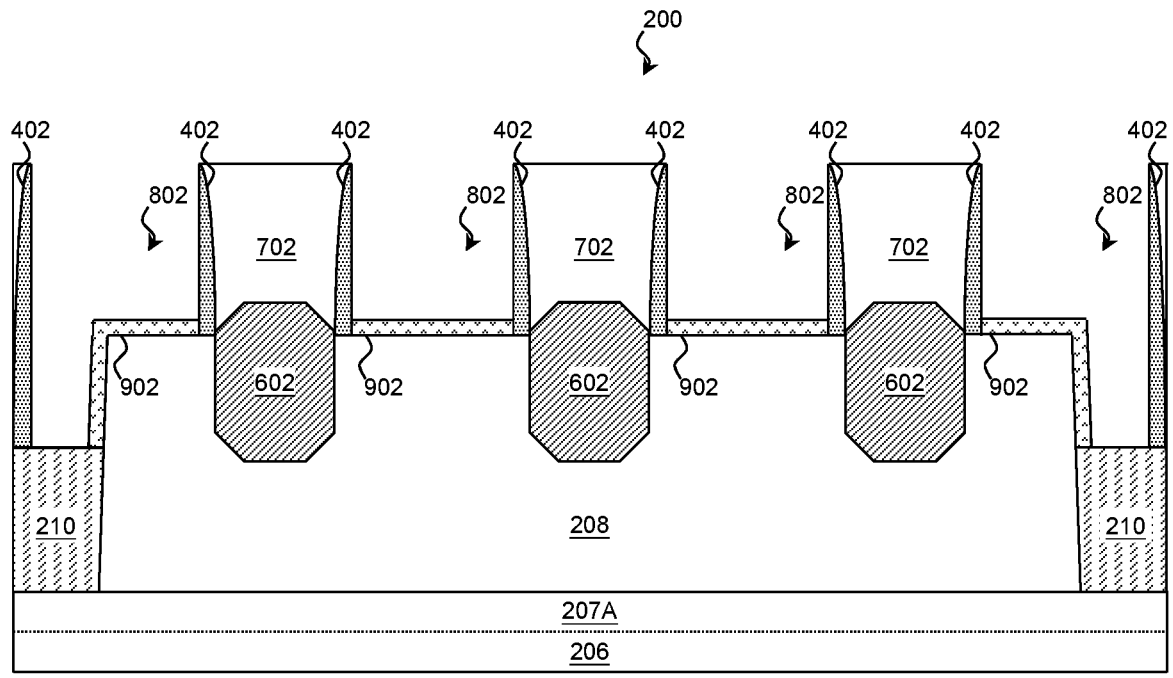

Referring to block 114 of FIG. 1A and to FIGS. 8A-8C, the placeholder gates 302 are removed as part of a gate replacement process to provide recesses 802 between the gate spacers 402. Removing the placeholder gate material 304 may include one or more etching processes (e.g., wet etching, dry etching, RIE) using an etchant chemistry configured to selectively etch the placeholder gate material 304 without significant etching of the surrounding materials, such as the fins 208, the source/drain features 602, the gate spacers 402, the first ILD layer 702, etc.

A functional gate structure is then formed in the recesses 802 defined by removing the placeholder gate material 304. Referring to block 116 of FIG. 1A and to FIGS. 9A-9C, an interfacial layer 902 is formed on the top and side surfaces of the fins 208 at the channel regions. The interfacial layer 902 may include an interfacial material, such as a semiconductor oxide, semiconductor nitride, semiconductor oxynitride, other semiconductor dielectrics, other suitable interfacial materials, and/or combinations thereof. The interfacial layer 902 may be formed to any suitable thickness using any suitable process including thermal growth, ALD, CVD, HDP-CVD, PVD, spin-on deposition, and/or other suitable deposition processes. In some examples, the interfacial layer 902 is formed by a thermal oxidation process and includes a thermal oxide of a semiconductor present in the fins 208 (e.g., silicon oxide for silicon-containing fins 208, silicon-germanium oxide for silicon-germanium-containing fins 208, etc.).

Figure 10A:
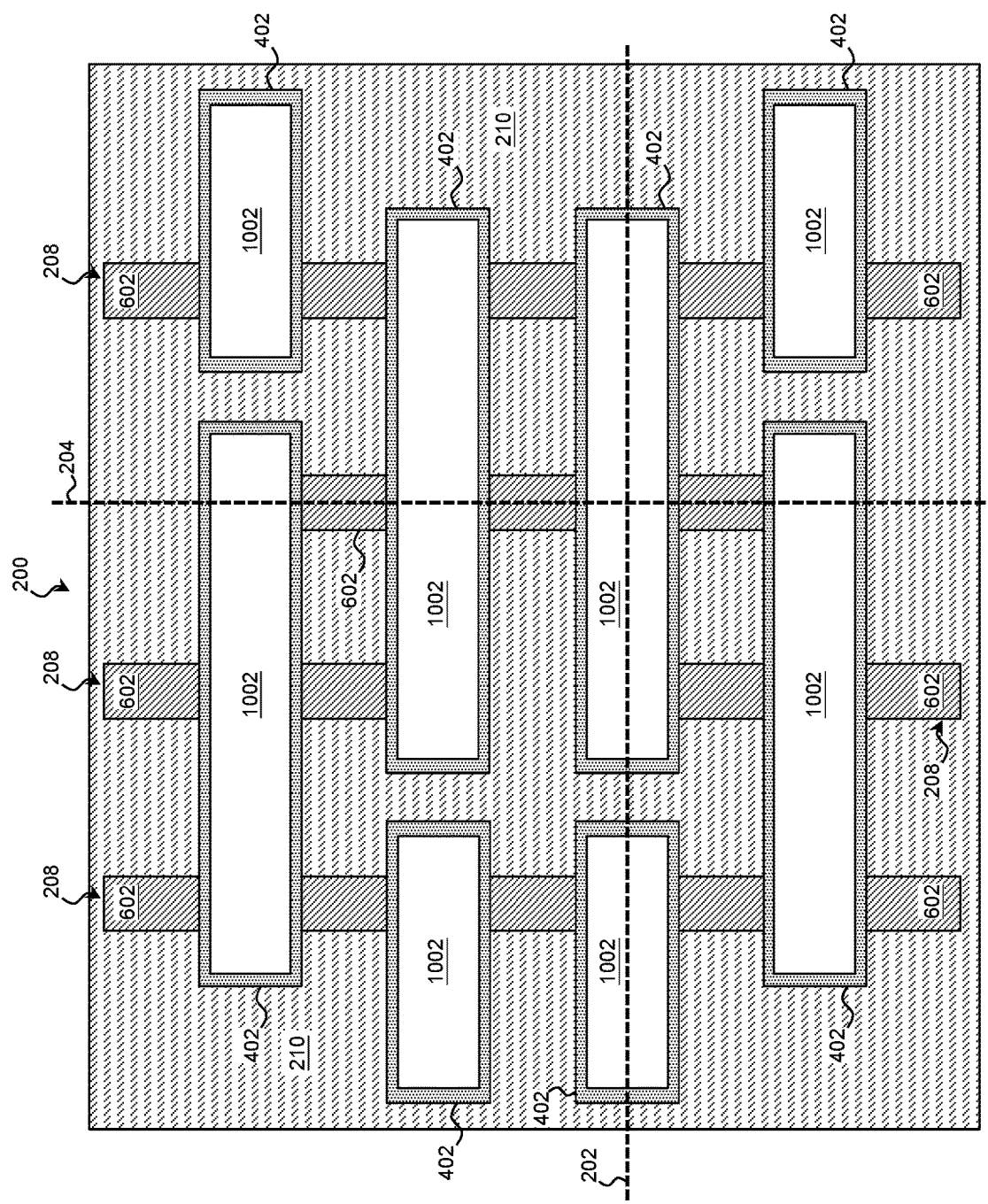
Figure 10B:
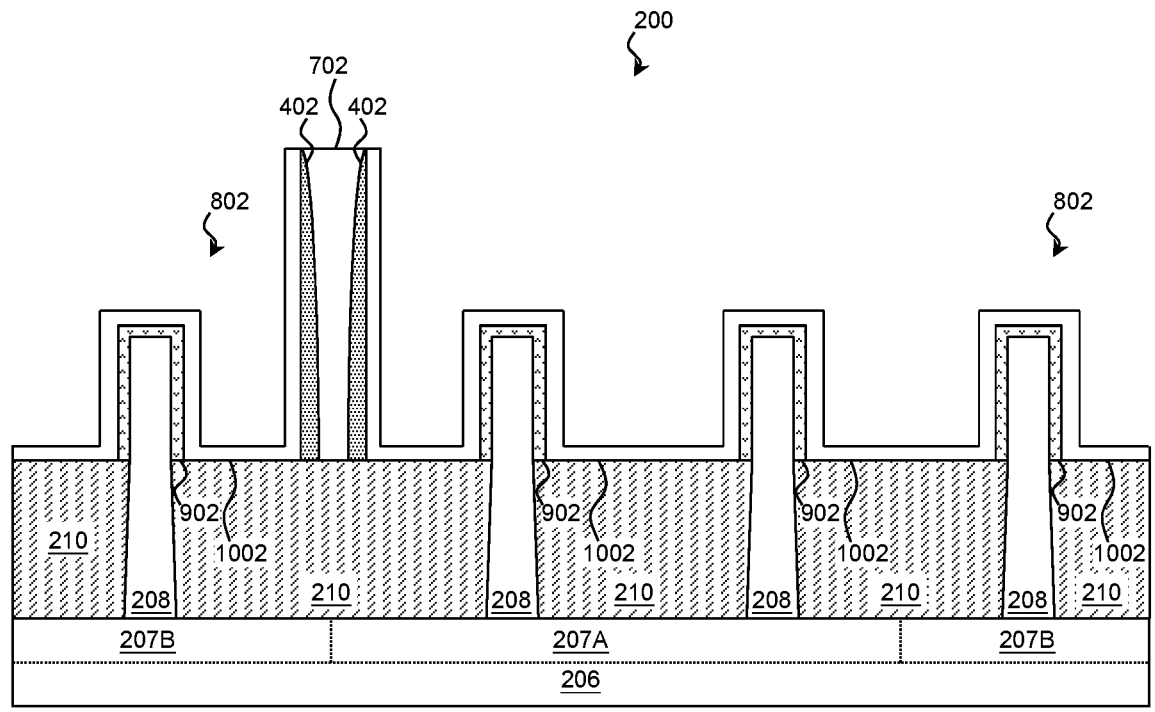
Figure 10C:
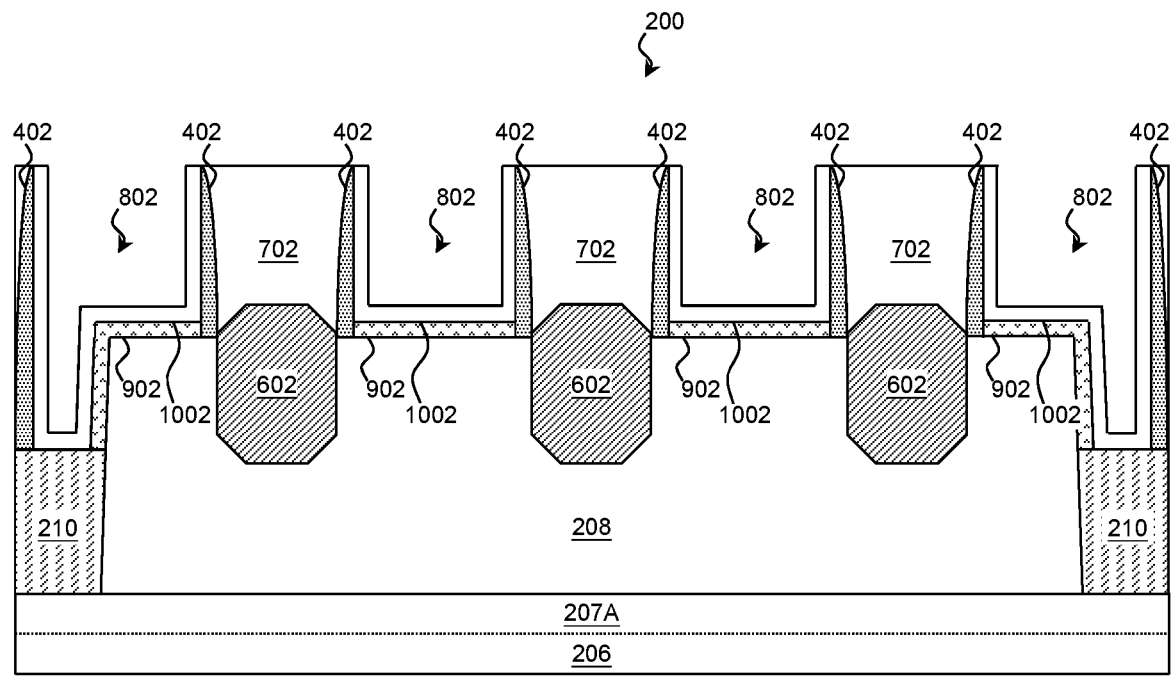
Figure 11A:
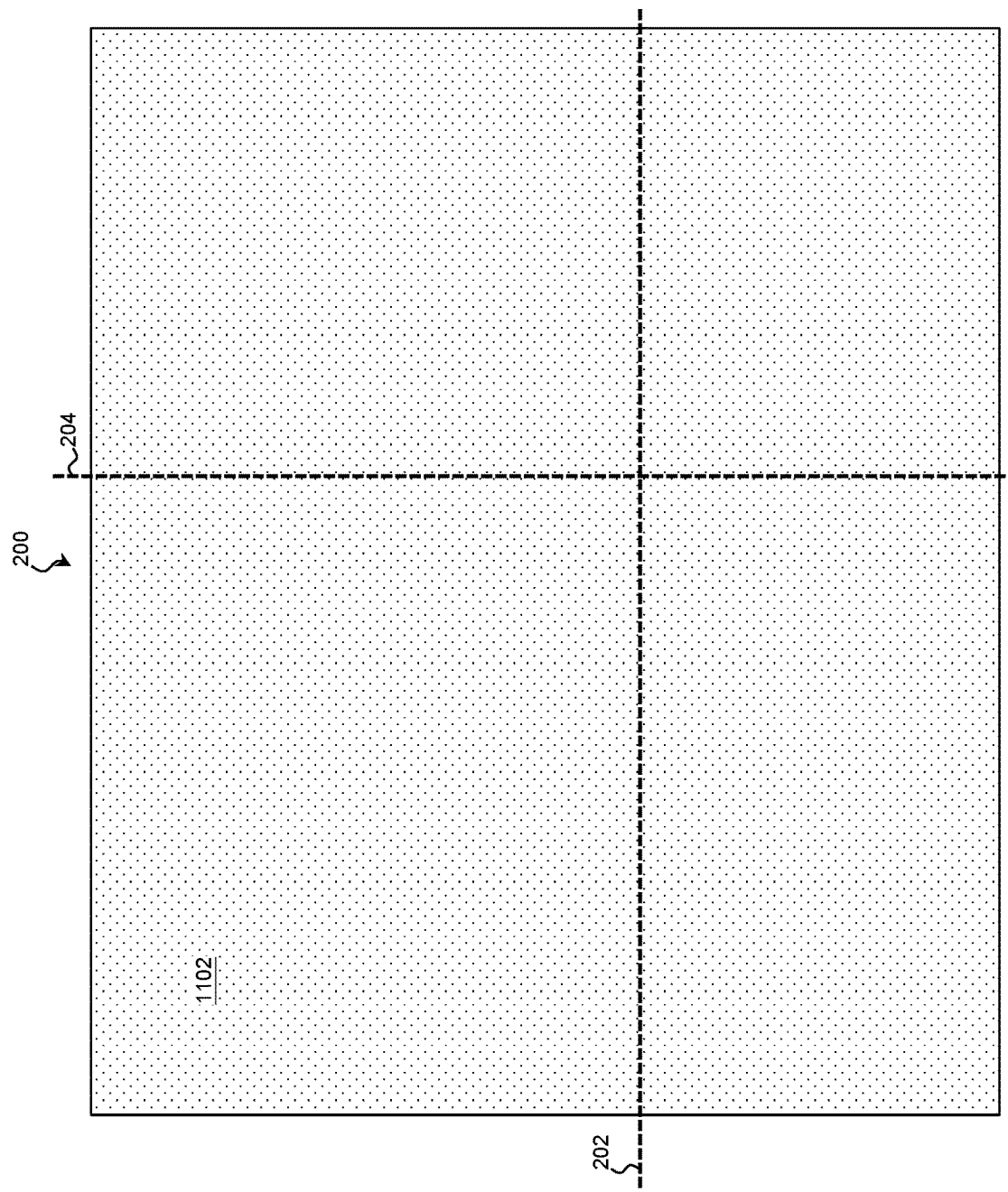
Figure 11B:
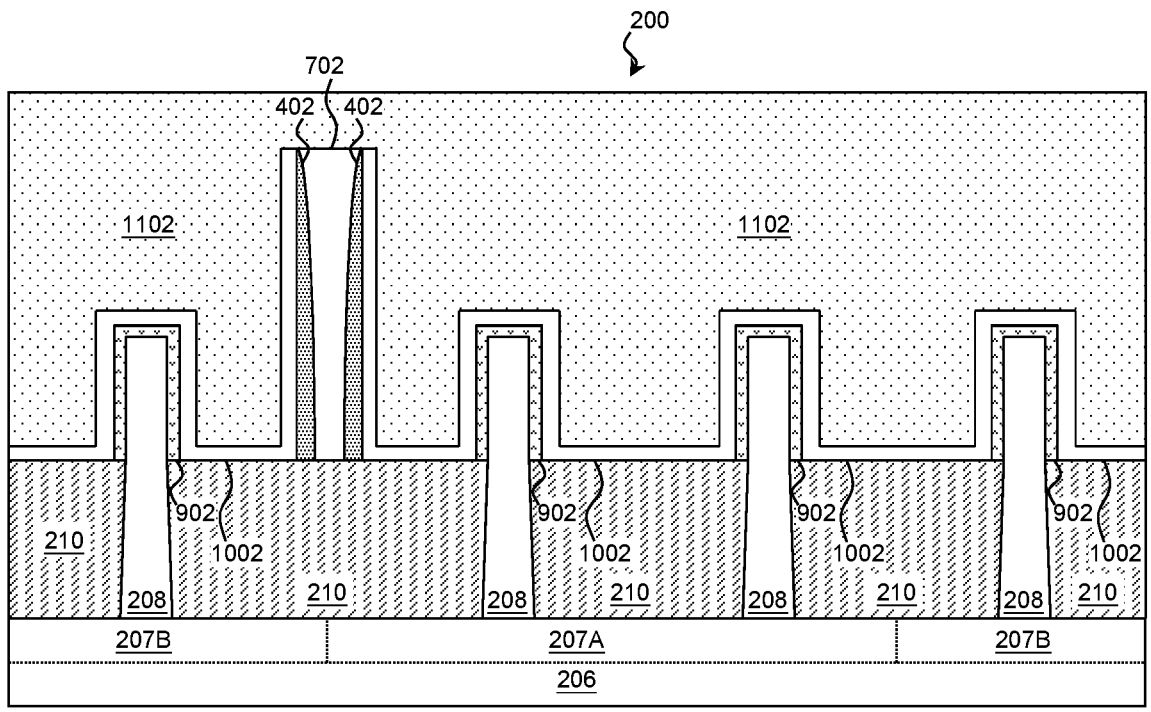
Figure 11C:
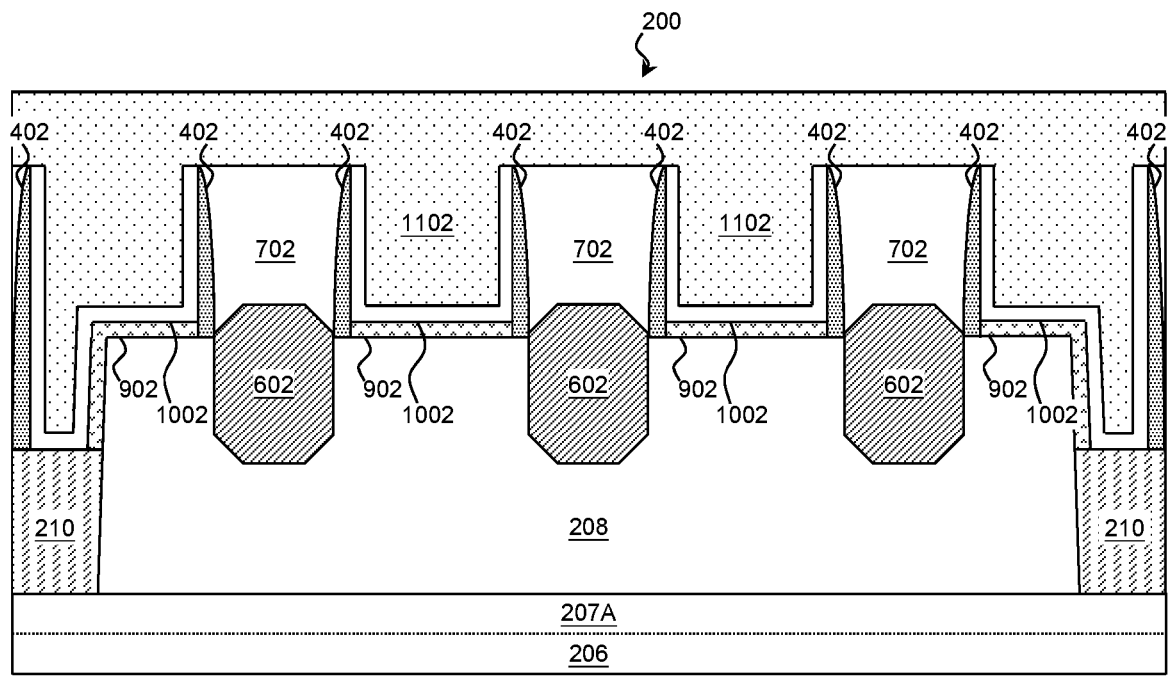

Referring to block 118 of FIG. 1A and to FIGS. 10A-10C, a gate dielectric 1002 is formed on the interfacial layer 902 and may also be formed along the vertical surfaces of the gate spacers 402. The gate dielectric 1002 may include one or more dielectric materials, which are commonly characterized by their dielectric constant relative to silicon dioxide. In some embodiments, the gate dielectric 1002 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 1002 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 1002 may be formed using any suitable process including ALD, Plasma Enhanced ALD (PEALD), CVD, Plasma Enhanced CVD (PE CVD), HDP-CVD, PVD, spin-on deposition, and/or other suitable deposition processes. The gate dielectric 1002 may be formed to any suitable thickness, and in some examples, the gate dielectric 1002 has a thickness of between about 0.1 nm and about 3 nm.

In those regions where the resulting gate is to electrically couple to, for example, a source/drain feature, the interfacial layer 902 and the gate dielectric 1002 may be removed. Referring to block 120 of FIG. 1A and to FIGS. 11A-11C, a hard mask layer 1102 is formed on the workpiece 200 including on the gate dielectric 1002 within the recesses 802. The hard mask layer 1102 may include any suitable material, and in various examples includes a dielectric material (e.g., a semiconductor oxide, a semiconductor nitride, a semiconductor oxynitride, a semiconductor carbide, a semiconductor oxycarbonitride, etc.), and/or other suitable material. The hard mask layer 1102 may be formed using any suitable process including CVD, HDP-CVD, PVD, ALD, spin-on deposition, and/or other suitable deposition processes.

Figure 12A:
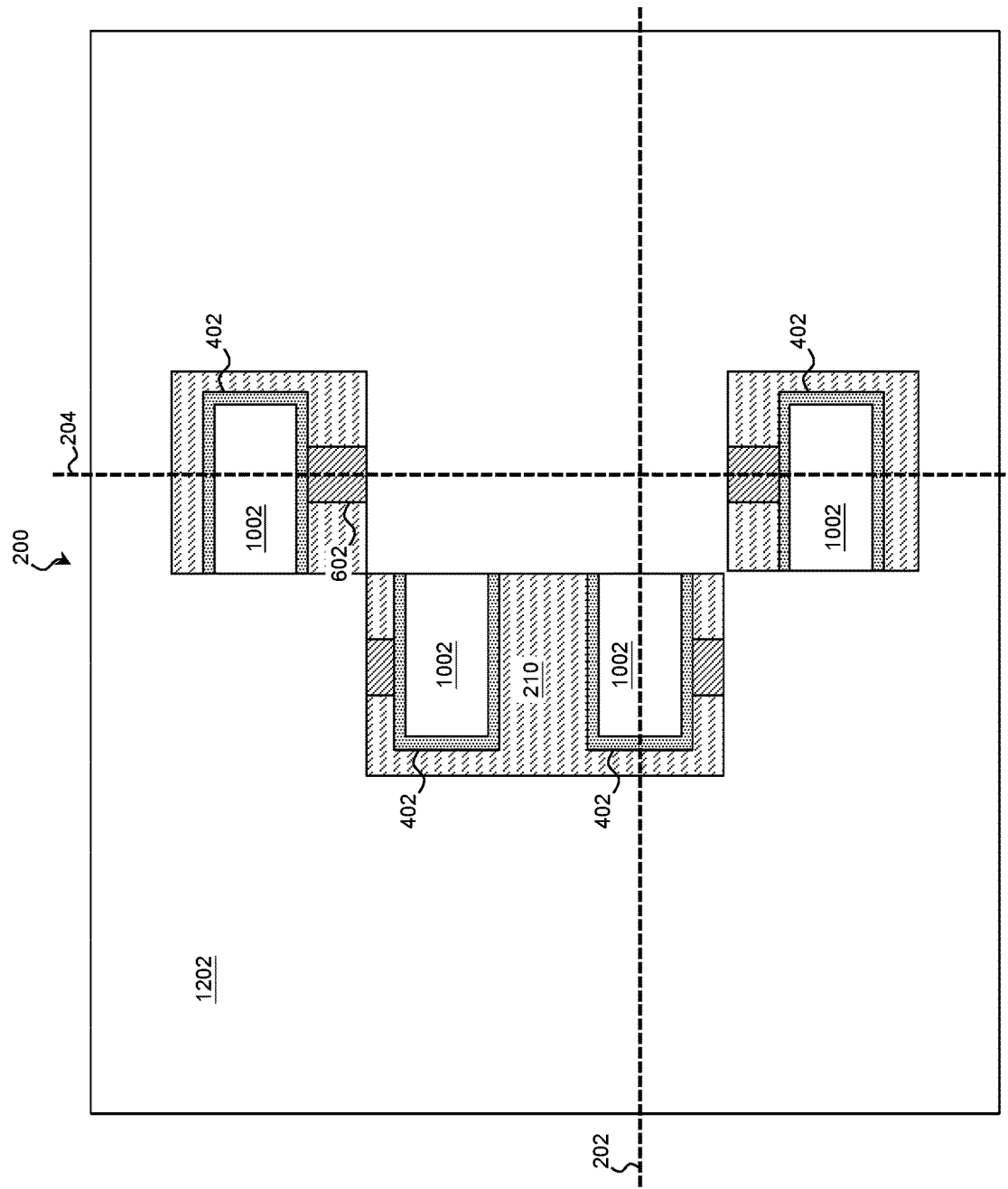
Figure 12B:
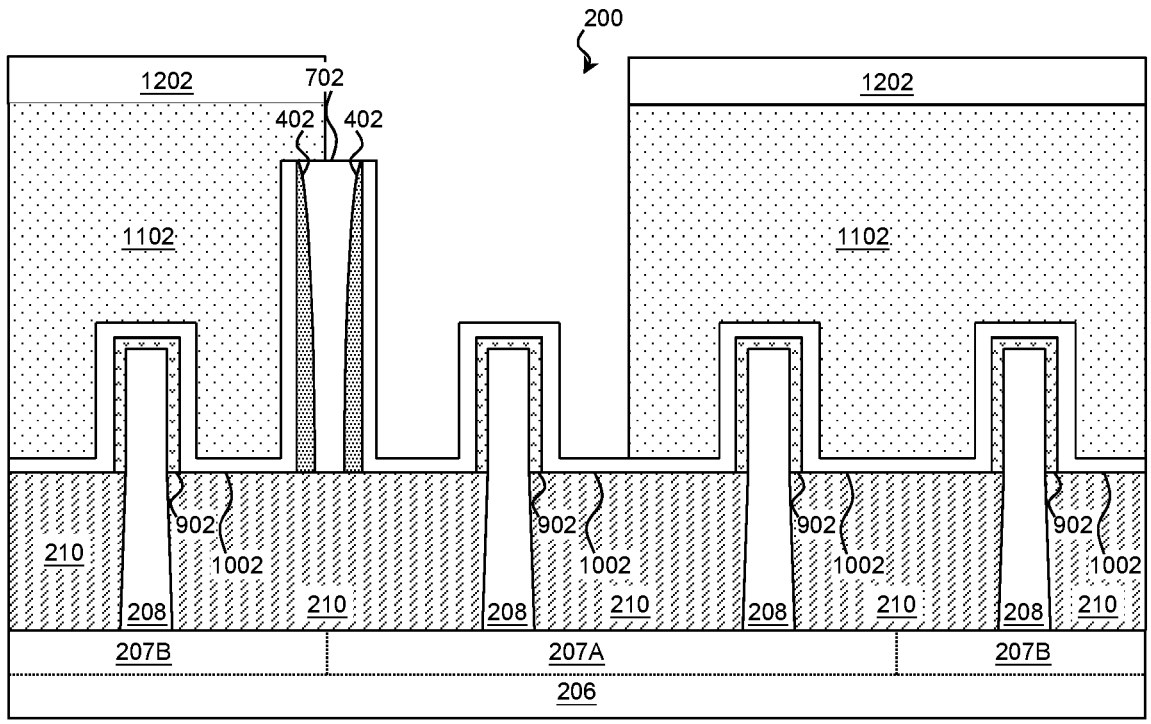
Figure 12C:
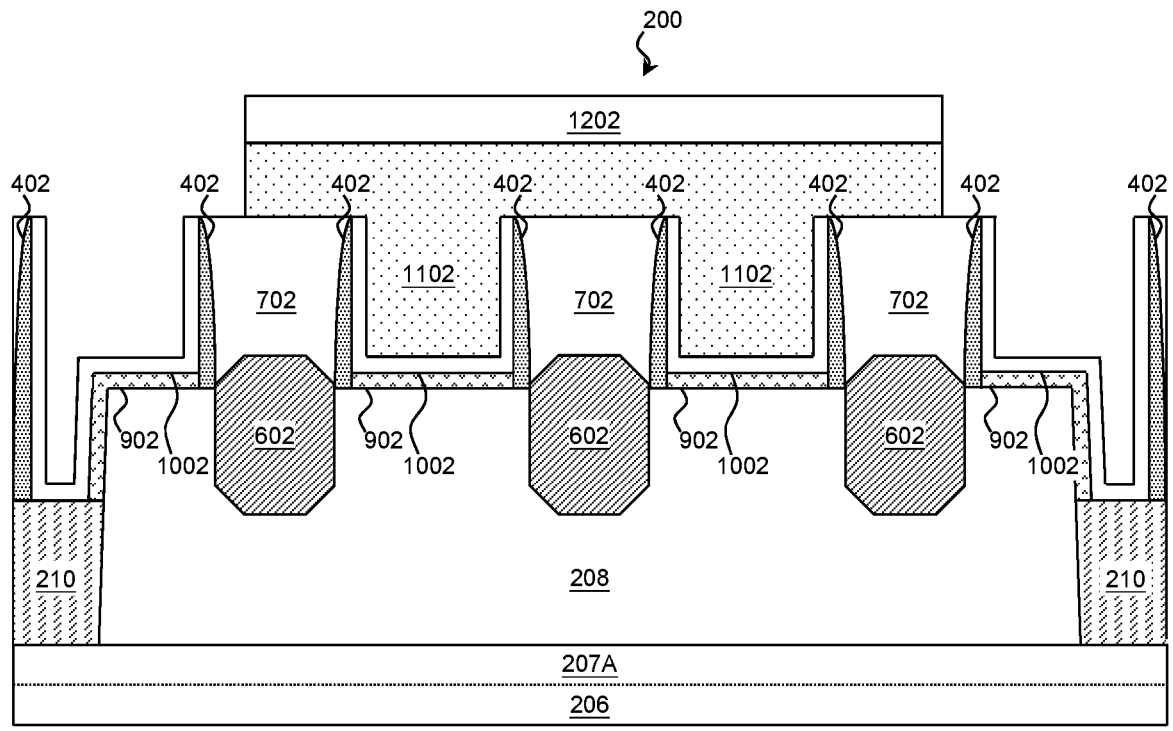

Referring to block 122 of FIG. 1A and to FIGS. 12A-12C, the hard mask layer 1102 is patterned to expose those regions where the gate dielectric 1002 and interfacial layer 902 are to be removed so that the forthcoming gate electrodes physically and electrically contact the fins 208. In an example, the hard mask layer 1102 is patterned in a photolithographic process that includes: forming a photoresist layer 1202 on the hard mask layer 1102, lithographically exposing the photoresist layer 1202, and developing the exposed photoresist layer 1202 to expose portions of the hard mask layer 1102 to be removed. The photolithographic process may be performed substantially as described in block 104 of FIG. 1A.

Following the photolithographic process, the patterning of block 122 may include an etching process to remove the exposed regions of the hard mask layer 1102. The etching processes may include any suitable etching technique, such as wet etching, dry etching, RIE, ashing, and/or other etching methods. The etching process may use any suitable etchant including an oxygen-based etchant, a fluorine-based etchant, a chlorine-based etchant, a bromine-based etchant, an iodine-based etchant, other suitable etchant liquids, gases, or plasmas, and/or combinations thereof. In an example, the etching process includes an isotropic etching technique using an etchant configured to remove the material of the hard mask layer 1102 without substantial etching of the photoresist layer 1202 or the surrounding materials such as the gate spacers 402 and the first ILD layer 702. The etching may expose portions of the gate dielectric 1002 and the interfacial layer 902 to be removed.

Figure 13A:
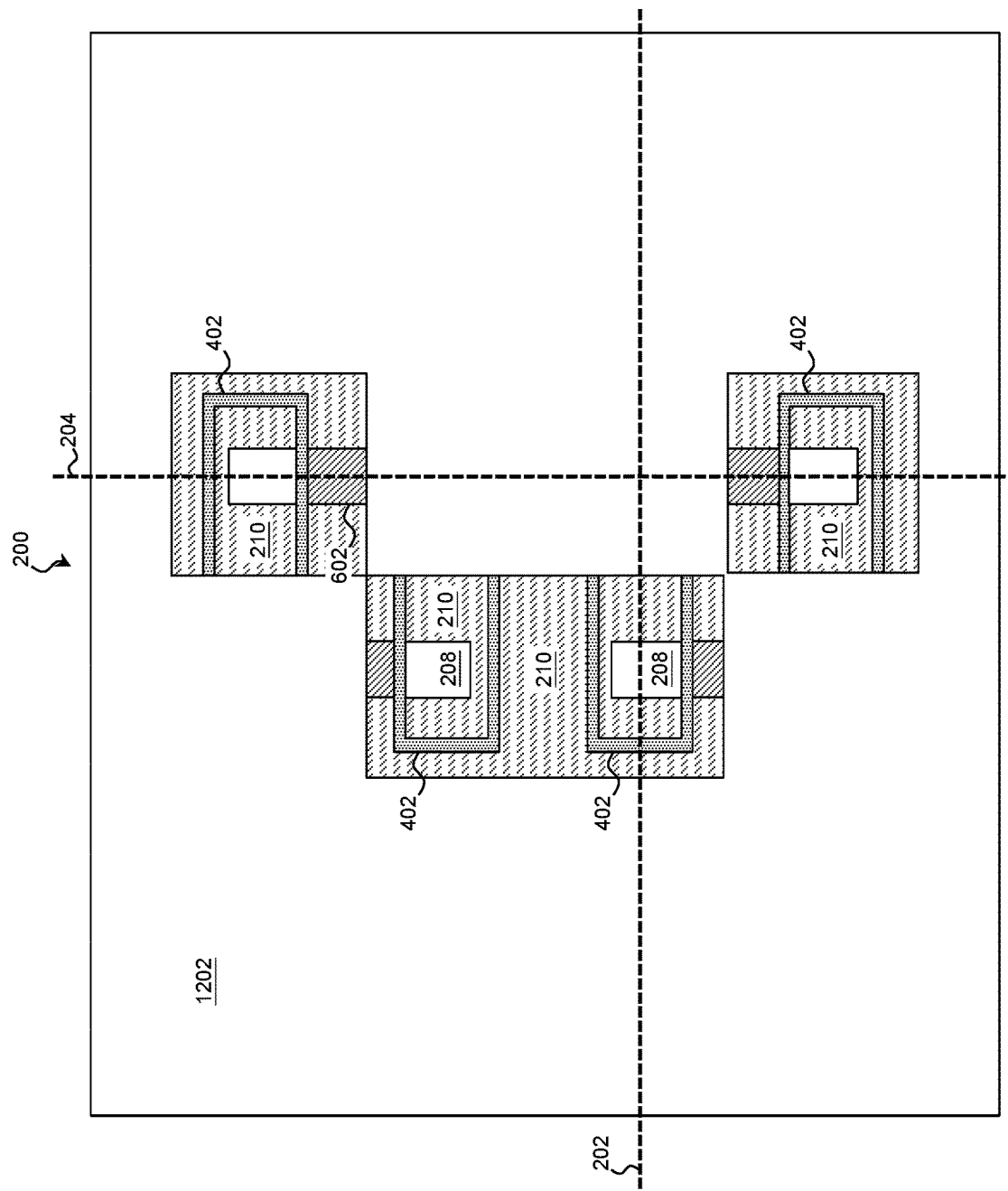
Figure 13B:
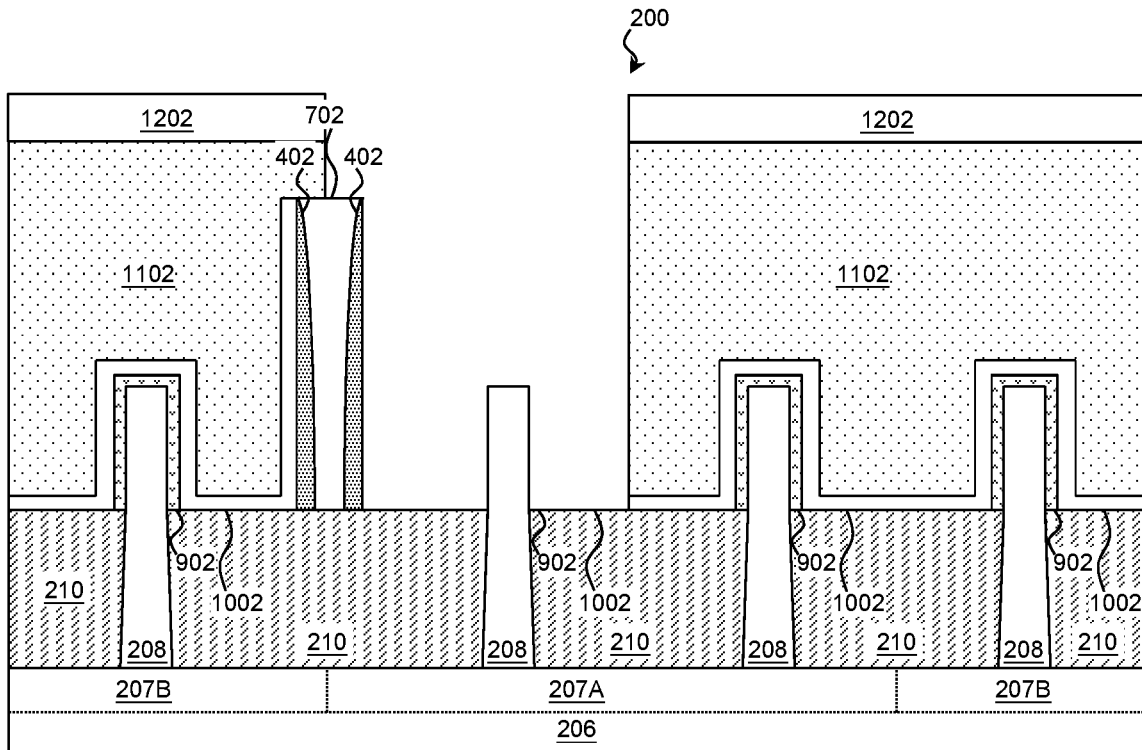
Figure 13C:
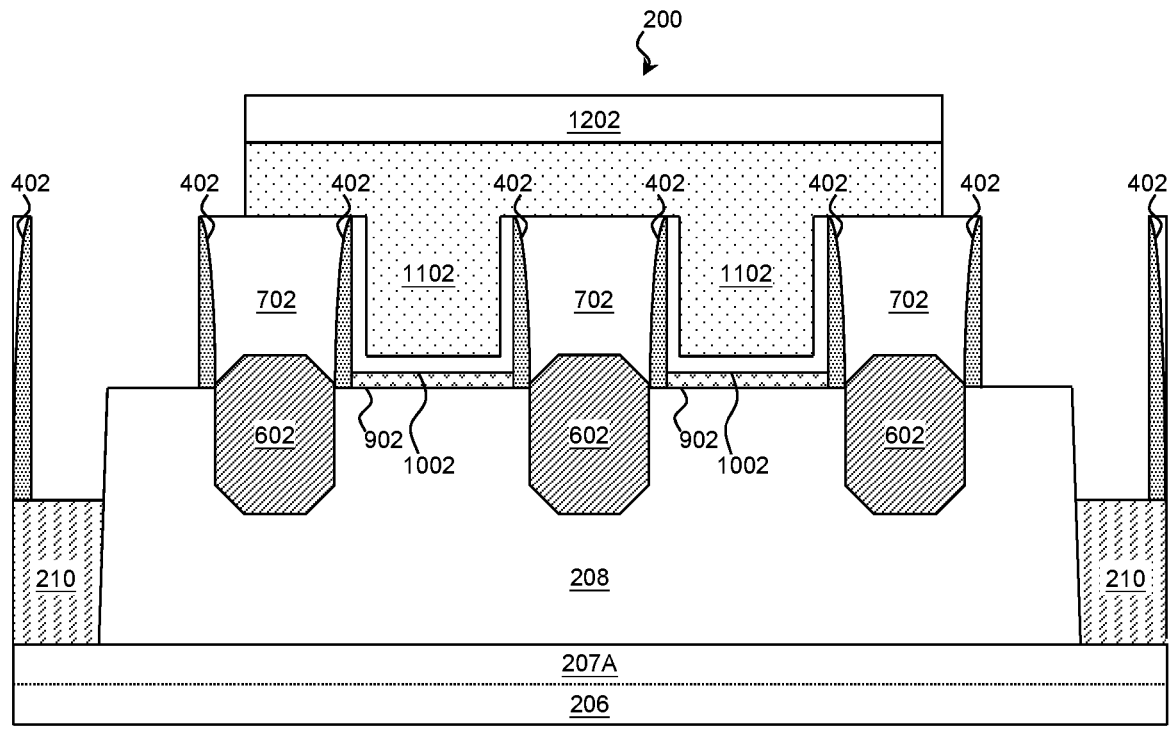

Accordingly, referring to block 124 of FIG. 1B and to FIGS. 13A-13C, the exposed portions of the gate dielectric 1002 and the interfacial layer 902 are removed from the fins 208 at locations where the forthcoming gate electrodes are to couple to the fins 208. This may include performing an etching process, such as wet etching, dry etching, RIE, ashing, and/or other etching methods. The etching process may use any suitable etchant including an oxygen-based etchant, a fluorine-based etchant, a chlorine-based etchant, a bromine-based etchant, an iodine-based etchant, other suitable etchant liquids, gases, or plasmas, and/or combinations thereof. In one such example, the etching process includes a wet etching technique using an etchant configured to remove the materials of the gate dielectric 1002 and the interfacial layer 902 without significant etching of the fins 208, the source/drain features 602, the hard mask layer 1102, the gate spacers 402, or the other surrounding materials.

Figure 14A:
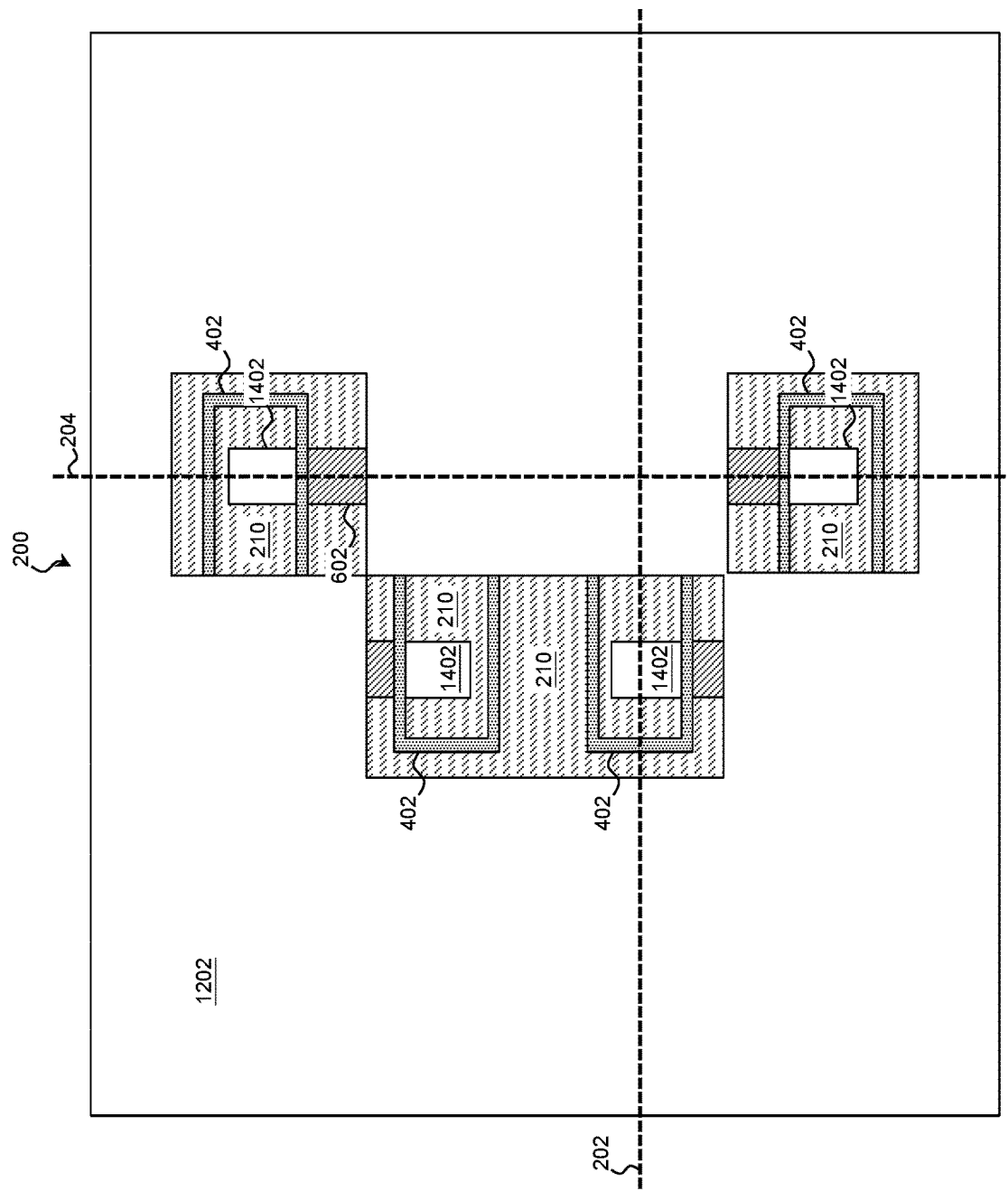
Figure 14B:
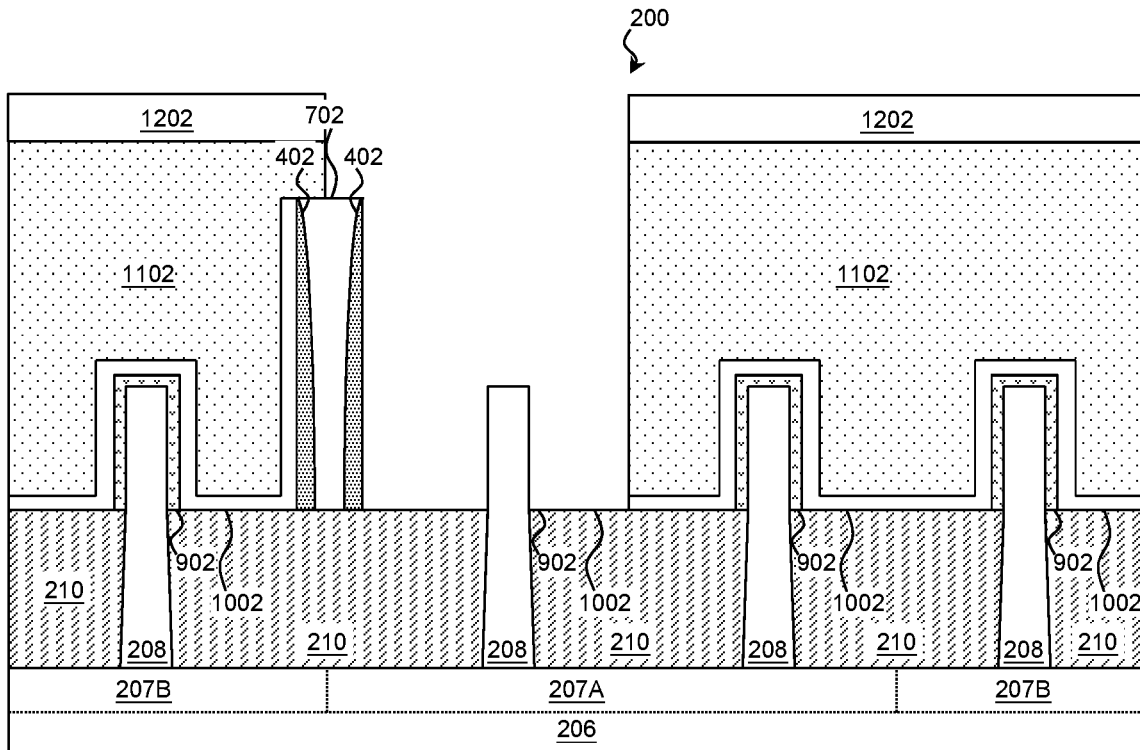
Figure 14C:
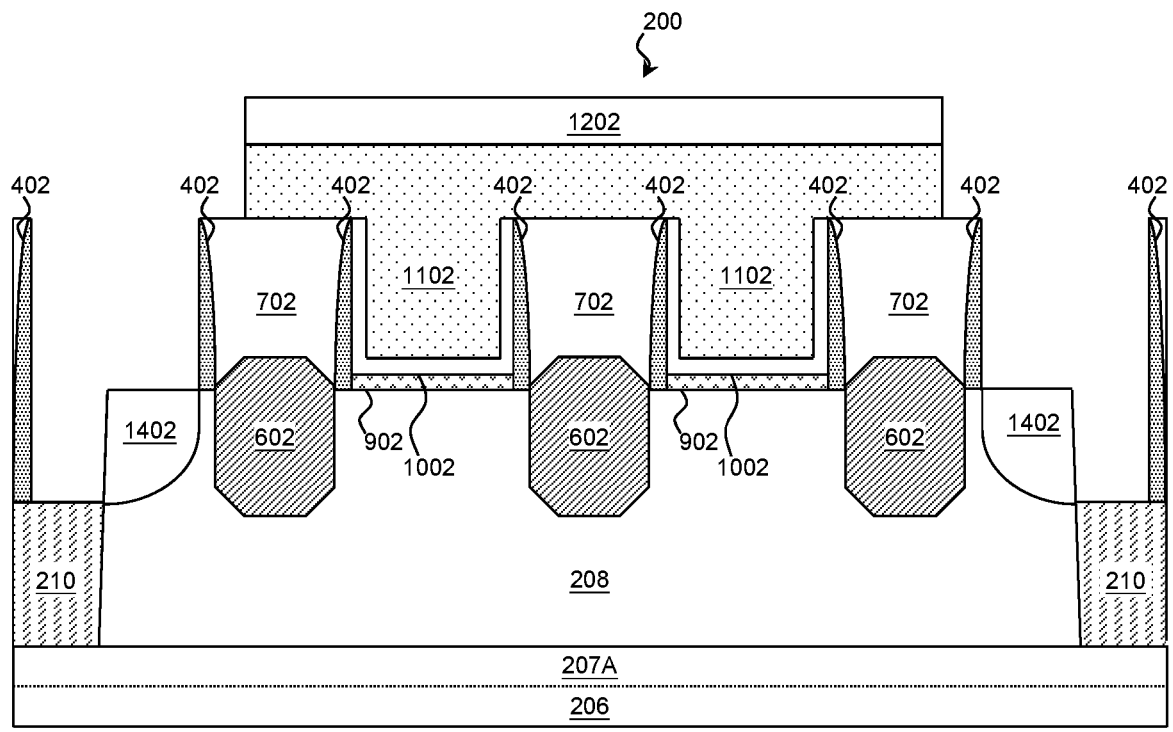

Referring to block 126 of FIG. 1B and to FIGS. 14A-14C, the portions of the fins 208 where the gate electrodes are to make contact are doped to reduce the resistance between the contacting gate electrodes and the adjacent source/drain features 602. The doped regions of the fins 208 are indicated by marker 1402. In some examples, the doped regions 1402 of the fins 208 are doped using an ion implantation process with a dopant species of the same type (e.g., n-type or p-type) as the dopant in the adjacent source/drain features 602, and thus the opposite type as the remainder of the fin 208. In such examples where the source/drain features 602 include a p-type dopant such as boron, the doped regions 1402 of the fins 208 are doped to include boron (boron-11, $BF_2$, etc.), indium, or other p-type dopants. In such examples where the source/drain features 602 include an n-type dopant such as phosphorus or arsenic, the regions 1402 of the fins 208 are doped to include phosphorus, arsenic, and/or other n-type dopants. The doped regions 1402 may be doped to any suitable dopant concentration, and in various examples, the dopant concentration is between about $1 \times 10^{14}$ atoms/$cm^2$ and about $5 \times 10^{15}$ atoms/$cm^2$. The hard mask layer 1102 and/or the photoresist layer 1202 may be used as implantation masks that protect the remainder of the fins 208 from the dopant species.

Figure 15A:
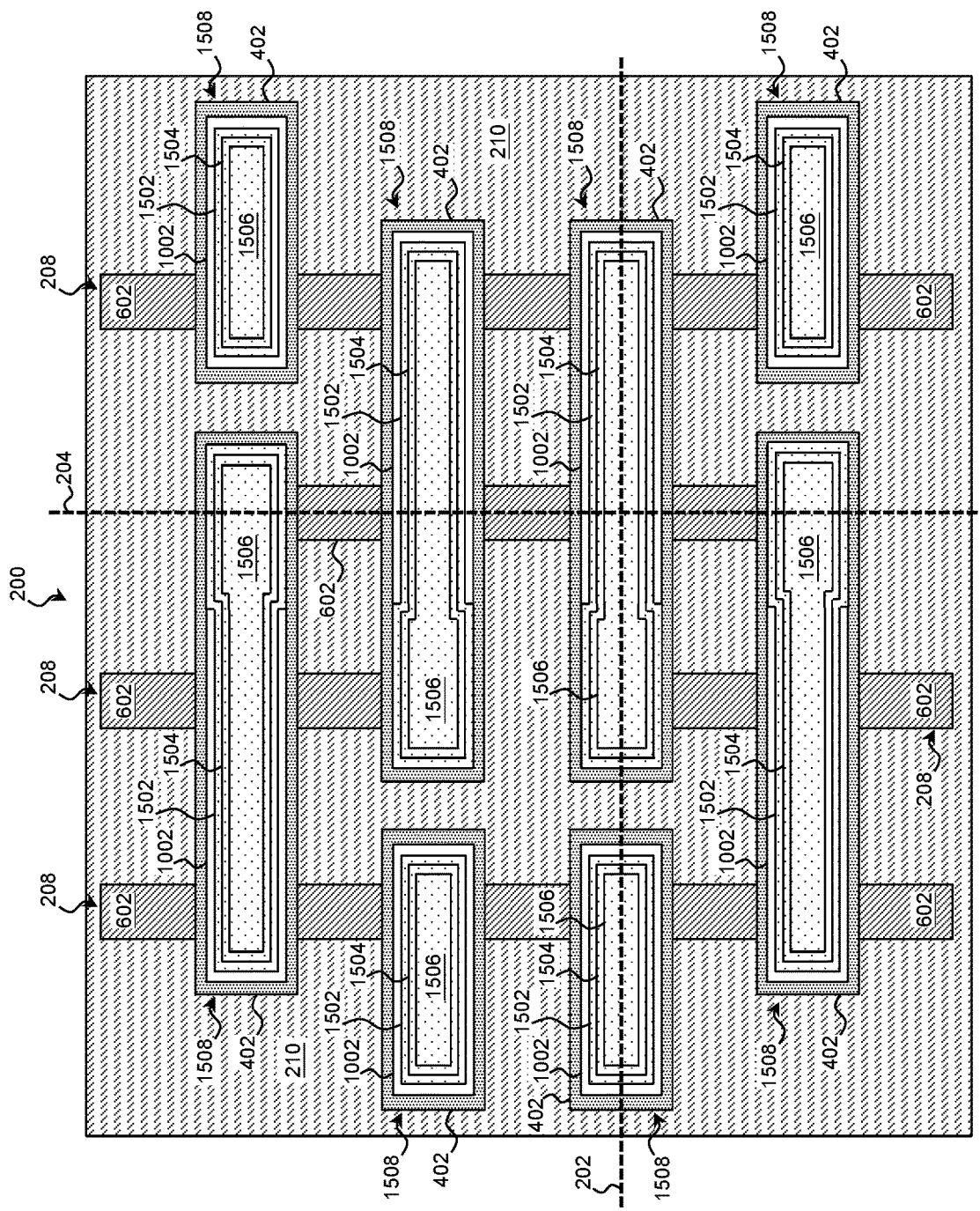
Figure 15B:
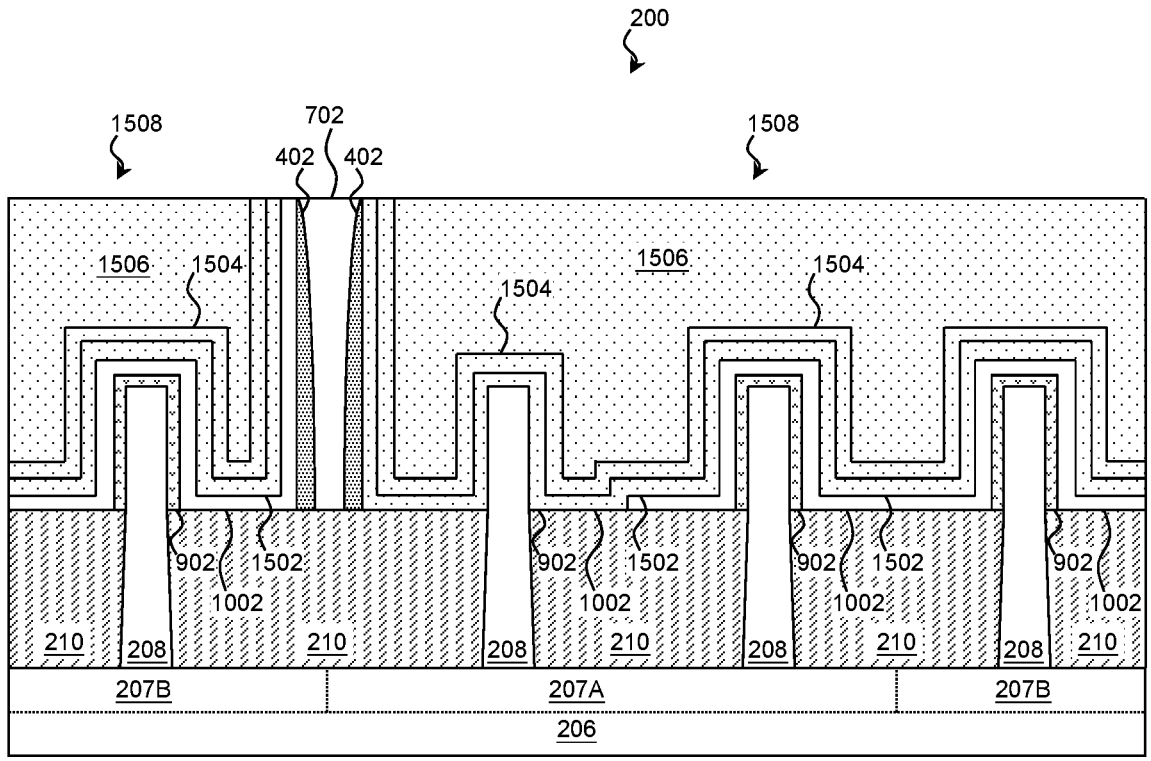
Figure 15C:
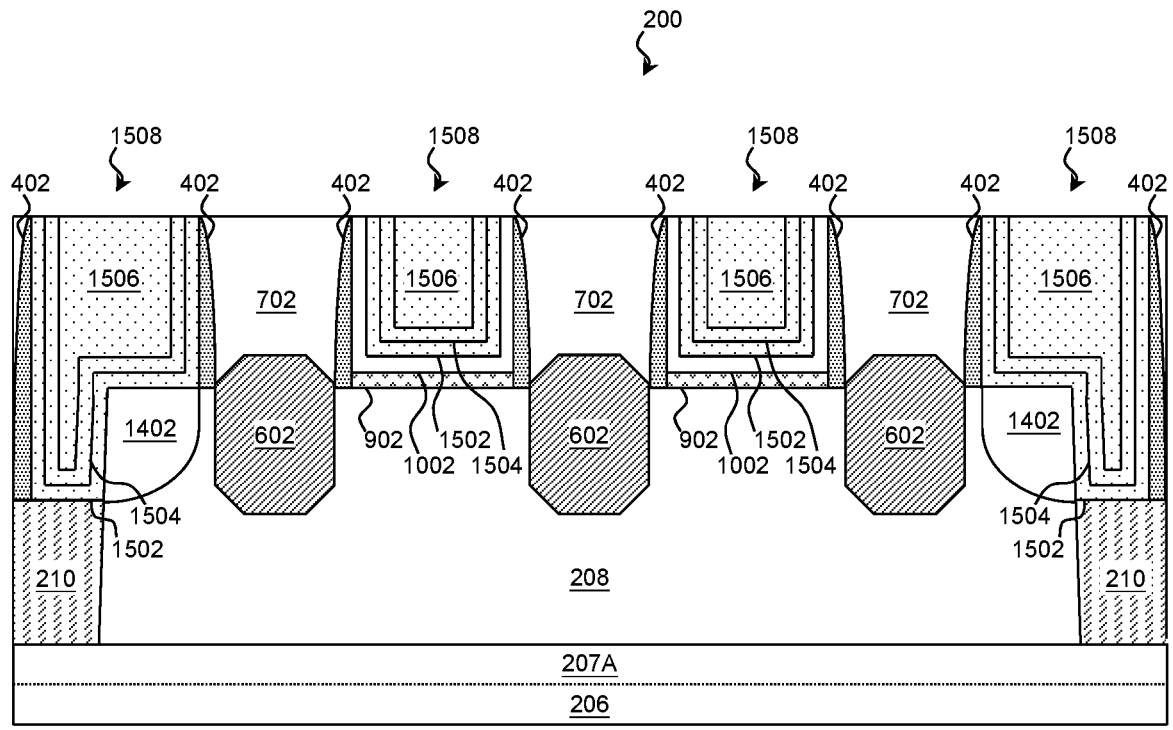

Referring to block 128 of FIG. 1B and to FIGS. 15A-15C, the hard mask layer 1102 and the photoresist layer 1202 may be removed after the etching and implantation, leaving recesses for forming the remainder of the gate structures 1508. The hard mask layer 1102 and the photoresist layer 1202 may be removed by an etching process, such as wet etching, dry etching, RIE, ashing, and/or other etching methods. In an example, the etching process is configured to remove the material of the hard mask layer 1102 and the photoresist layer 1202 without substantial etching of surrounding materials such as the gate spacers 402.

Referring to block 130 of FIG. 1B and to referring still to FIGS. 15A-15C, gate electrodes are formed on the workpiece 200. Specifically, the gate electrodes are formed on the interfacial layer 902 and on the gate dielectric 1002 in regions where the gate electrodes function as gates and formed directly on the fins 208 (e.g., directly on the doped regions 1402 thereof) in regions where the gate electrodes function as contacts.

The gate electrodes may include a number of different conductive layers, of which three exemplary layers (a capping layer 1502, work function layer(s) 1504, and electrode fill 1506) are shown. With respect to the first layer, in some examples, forming a gate electrode includes forming a capping layer 1502 on the workpiece 200. The capping layer 1502 may be formed directly on the gate dielectric 1002 in regions where the gate electrodes function as gates and may be formed directly on the horizontal top surface and the vertical side surfaces of the fins 208 in regions where the gate electrodes function as contacts. To decrease resistance, a fin 208 may not extend along the fin-length direction through the entire gate electrode. This provides an additional vertical surface at the fin end where the gate electrode (e.g., the capping layer 1502 thereof) may physically and electrically couple to the fin 208.

The capping layer 1502 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various embodiments, the capping layer 1502 includes TaSiN, TaN, and/or TiN.

In some examples, forming a gate electrode includes forming one or more work function layers 1504 on the capping layer 1502. Suitable work function layer 1504 materials include n-type and/or p-type work function materials based on the type of device to which the gate structure 1508 corresponds. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 1504 may be deposited by any suitable technique including ALD, CVD, PE CVD, PEALD, PVD, and/or combinations thereof. Because the p-type and n-type devices may have different work function layers 1504, in some examples, the n-type work function layers 1504 are deposited in a first deposition process that uses a dielectric hard mask to prevent depositing on the electrodes of the p-type devices, and the p-type work function layers 1504 are deposited in a second deposition process that uses a dielectric hard mask to prevent depositing on the electrodes of the n-type devices.

In some examples, forming a gate electrode includes forming an electrode fill 1506 on the work function layer(s) 1504. The electrode fill 1506 may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 1506 may be deposited by any suitable technique including ALD, CVD, PE CVD, PEALD, PVD, and/or combinations thereof.

A CMP process may be performed to remove electrode material (e.g., material of: the capping layer 1502, the work function layer(s) 1504, the electrode fill 1506, etc.) that is outside of the gate structures 1508.

Figure 16A:
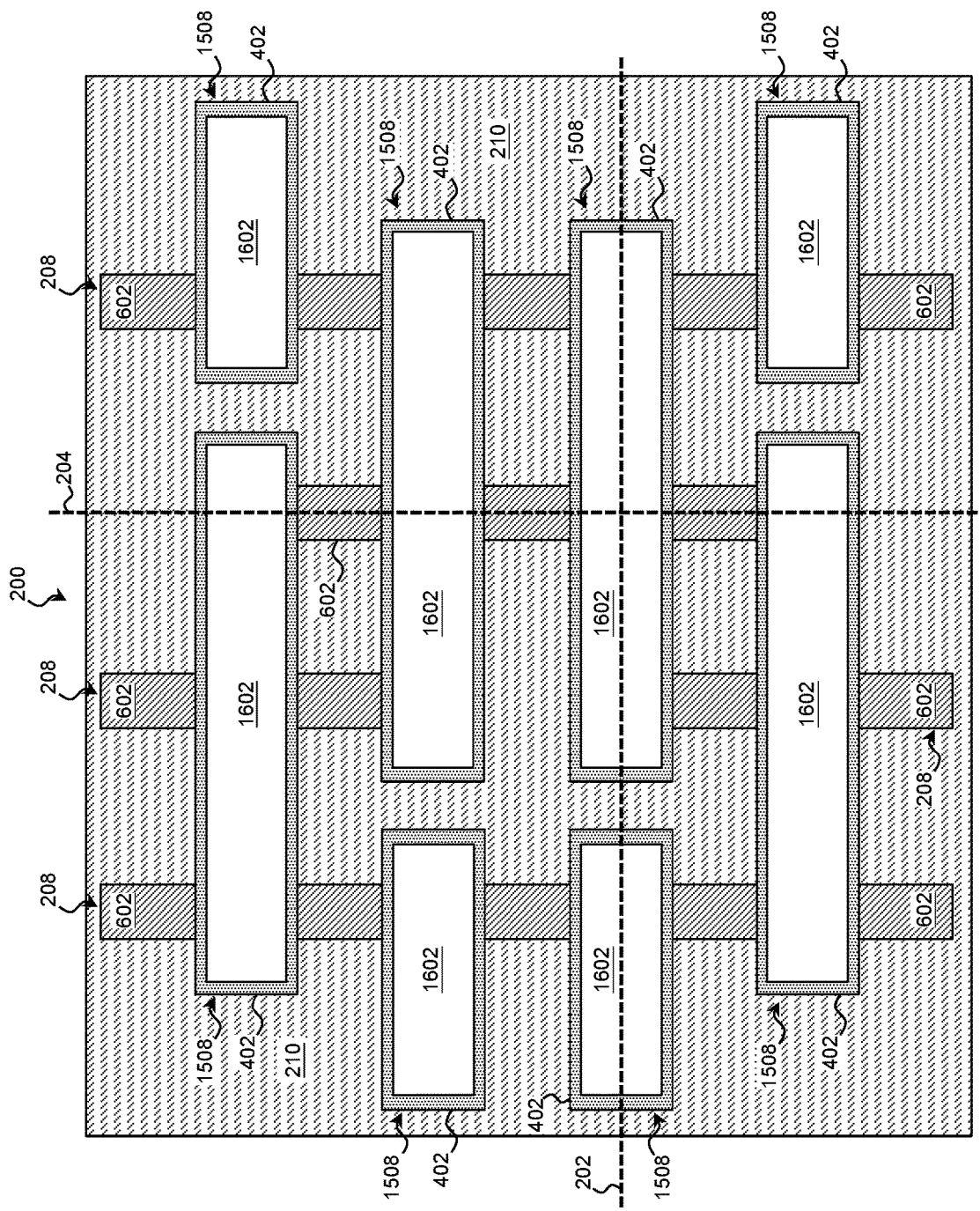
Figure 16B:
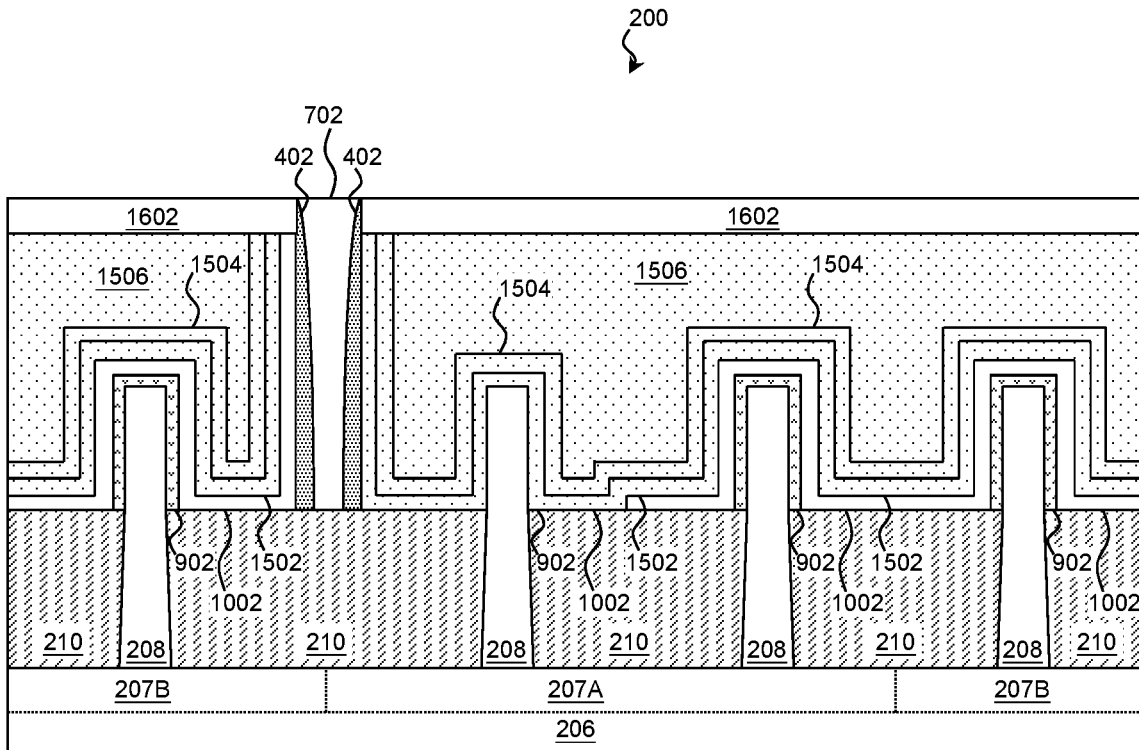
Figure 16C:
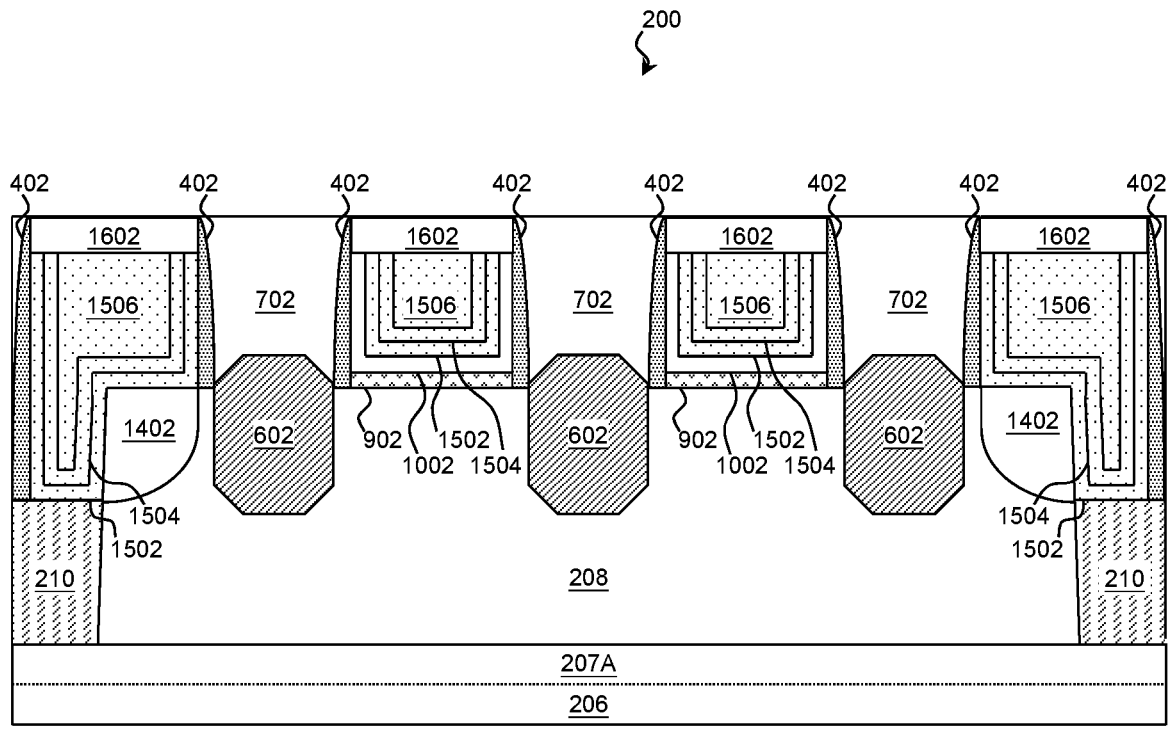

Referring to FIGS. 16A-16C, in some examples, forming the gate structures 1508 includes partially recessing the gate structures 1508 (e.g., the gate dielectric 1002, the capping layer 1502, the work function layer(s) 1504, the electrode fill 1506, etc.) and forming a gate cap 1602 on the recessed gate structures 1508. The gate cap 1602 may include any suitable material, such as: a dielectric material (e.g., a semiconductor oxide, a semiconductor nitride, a semiconductor oxynitride, a semiconductor carbide, a semiconductor oxycarbonitride, etc.), polysilicon, SOG, TEOS, PE-oxide, HARP-formed oxide, and/or other suitable material. In some examples, the gate cap 1602 includes silicon oxycarbonitride. The gate cap 1602 may be formed to any suitable thickness using any suitable deposition technique (e.g., CVD, HDP-CVD, ALD, etc.). In some examples, the gate cap 1602 has a thickness between about 1 nm and about 10 nm, and is deposited by a CVD and/or ALD process.

Based on the design, holes are opened in the first ILD layer 702 for forming contacts that couple to the source/drain features 602. While the contacting gate structure 1508 is an alternative to a butted contact that connects a gate structure 1508 to a source/drain feature 602, the contacting gate structures 1508 do not inhibit the use of butted contacts in the design. Referring to block 132 of FIG. 1B, the first ILD layer 702 is patterned to expose portions of the source/drain features 602. The patterning of block 132 may include one or more iterations of: applying a photoresist, exposing the photoresist, developing the photoresist, and etching the exposed portions of the first ILD layer 702. Each of these processes may be performed substantially as described above.

Figure 17A:
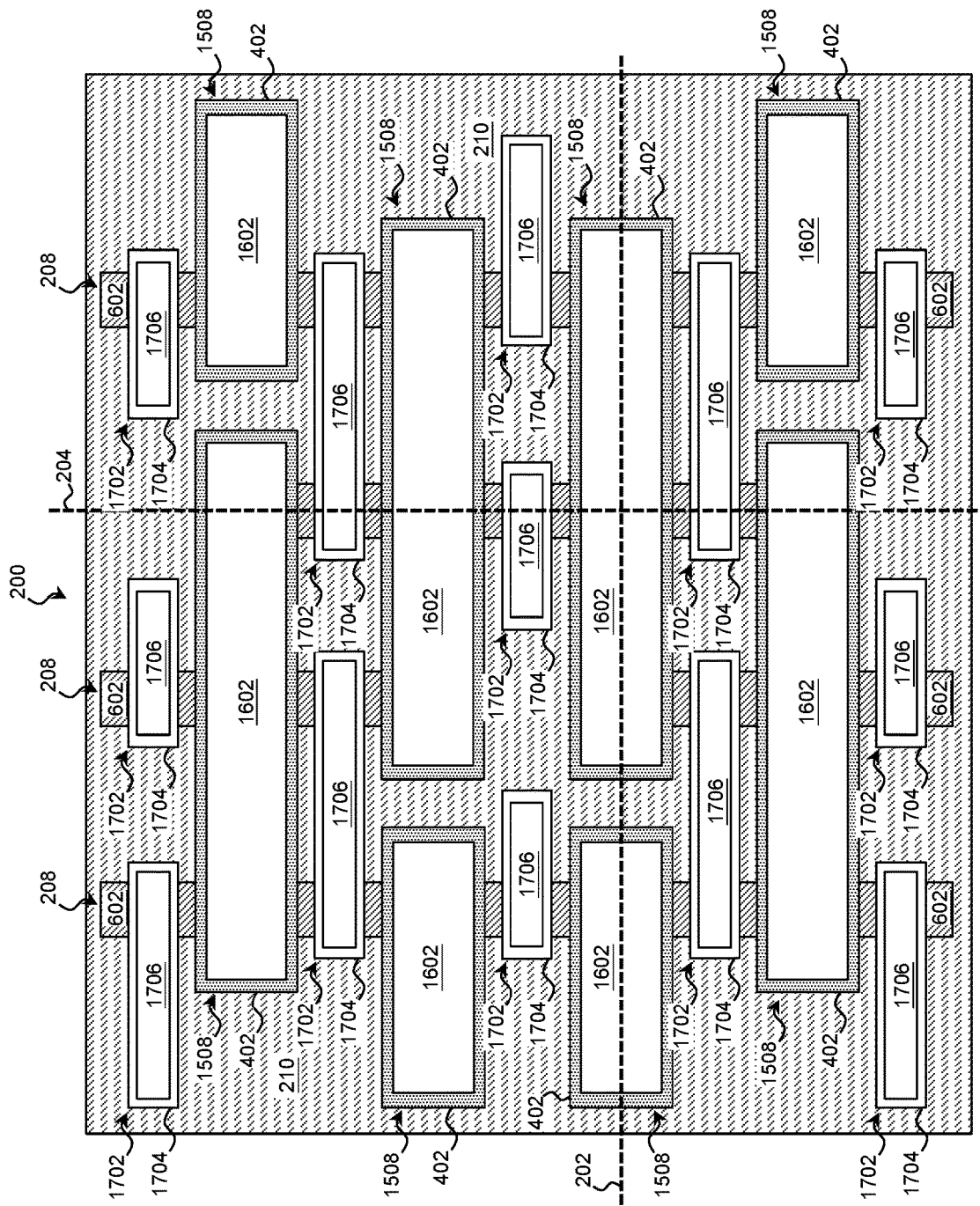
Figure 17B:
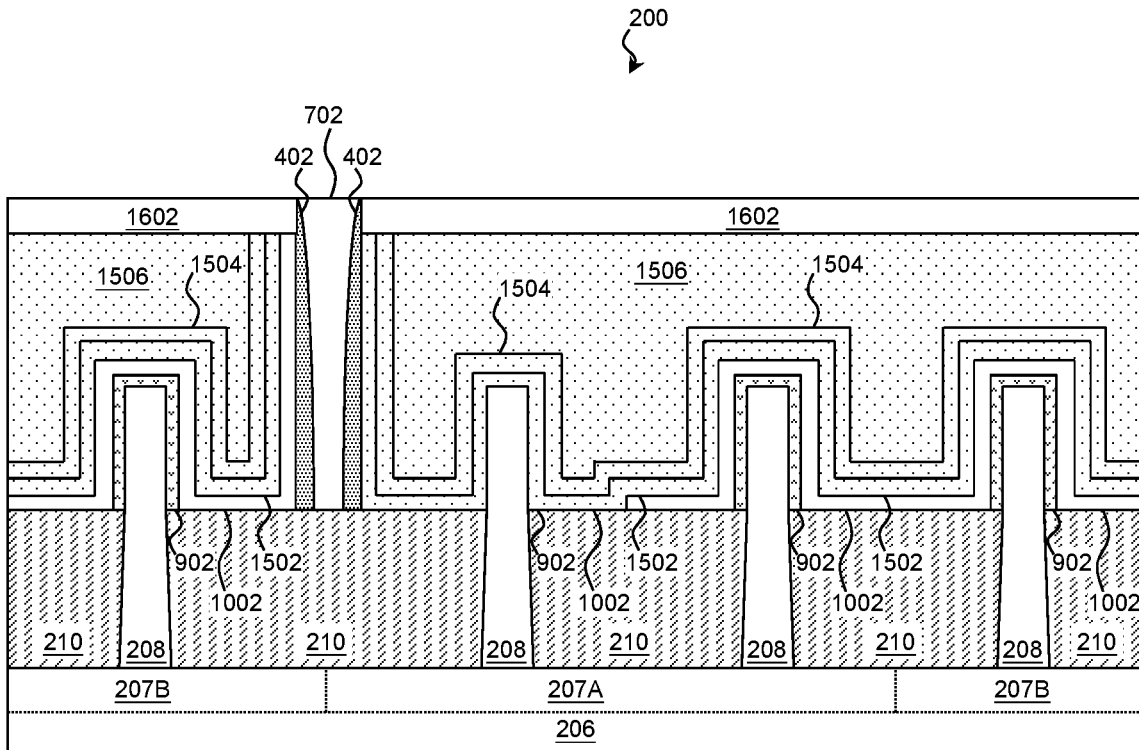
Figure 17C:
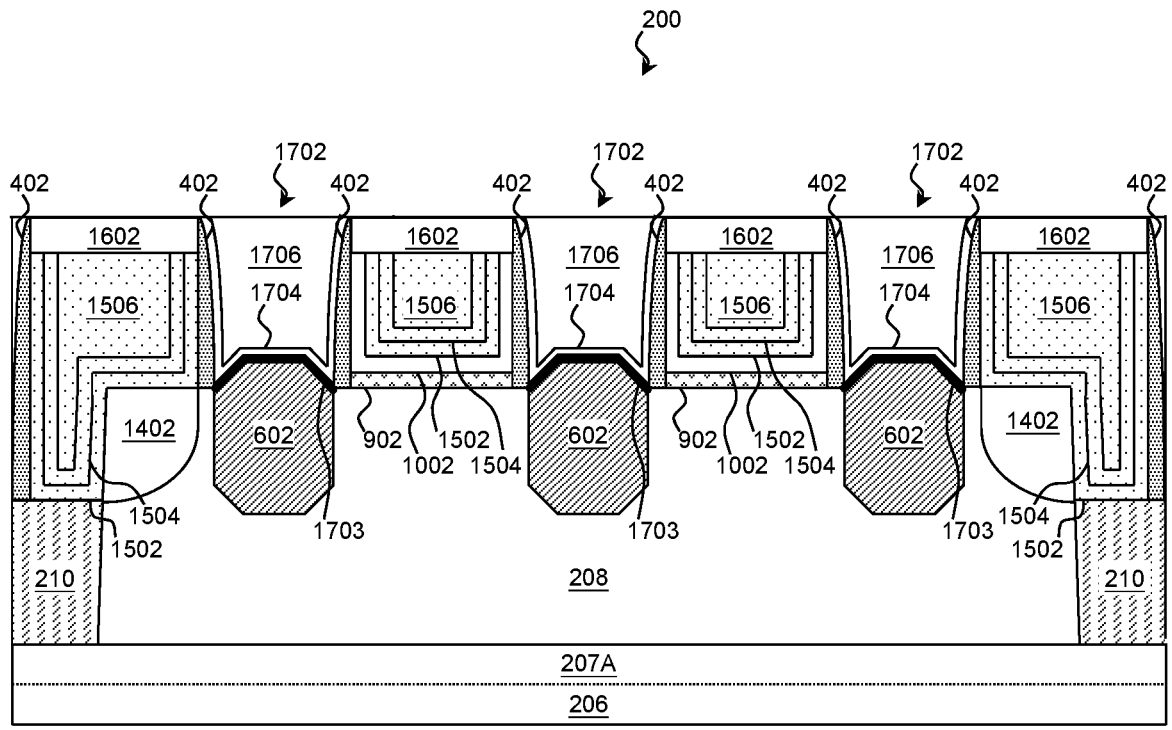

Referring to block 134 of FIG. 1B and to FIGS. 17A-17C, source/drain contacts 1702 are formed extending through recesses in the first ILD layer 702 that physically and electrically couple to the source/drain features 602. In this way, the source/drain contacts 1702 electrically connect their respective source/drain features 602 to upper level conductors and may also directly electrically connect source/drain features 602 to each other. The source/drain contacts 1702 may include a number of conductive layers. In one such example, forming the source/drain contacts includes forming a metal silicide layer 1703 (e.g., NiSi, NiSiGe, etc.) on the source/drain features 602. To do so, a metal component of the metal silicide layer 1703 may be deposited by any suitable technique including PVD (e.g., sputtering), CVD, PE CVD, ALD, PEALD, and/or combinations thereof and then annealed to diffuse the metal into a semiconductor material (e.g., silicon, silicon-germanium, etc.) of the source/drain feature 602.

Continuing the example, a glue layer 1704 (also referred to as an adhesion layer) of the source/drain contacts 1702 is formed on the metal silicide layer 1703. The glue layer 1704 may improve the formation of the contacts by enhancing wettability, increasing adhesion, and/or preventing diffusion. The glue layer 1704 may include a metal (e.g., W, Al, Ta, Ti, Ni, Cu, Co, etc.), a metal nitride, a metal oxide, other suitable conductive material, and/or other suitable glue material. The glue layer 1704 may be formed by any suitable process including ALD, CVD, LPCVD, PECVD, PVD, and/or other suitable techniques. In some examples, the glue layer 1704 includes Ti or TiN formed by ALD using tetrakis-dimethylamino titanium (TDMAT) as a titanium-containing precursor. The glue layer 1704 may be formed to any suitable thickness and, in some examples, has a substantially uniform thickness selected to be between about 10 Angstroms and about 100 Angstroms.

In the above example, forming the source/drain contacts 1702 in block 134 includes forming a fill material 1706 on the glue layer 1704. The fill material 1706 may include a metal, a metal nitride, a metal oxide, and/or other suitable conductive material. In various examples, the fill material 1706 includes copper, cobalt, tungsten, and/or combinations thereof. The fill material 1706 may be formed by any suitable process including CVD, LPCVD, PECVD, PVD, ALD, and/or other suitable techniques. In an example, the fill material 1706 is deposited by alternating PVD and CVD cycles.

Referring still to block 134, forming the source/drain contacts 1702 may include performing a thermal reflow process on the workpiece 200. The thermal reflow process may include a thermal annealing to eliminate voids or striations within the source/drain contacts 1702. The thermal reflow process may include heating the workpiece 200 to any suitable temperature and, in various examples, includes heating the workpiece 200 to a temperature between about 300° C. and about 500° C. A planarization process may be performed to remove portions of the source/drain contacts 1702 extending above the top of the first ILD layer 702.

Figure 18A:
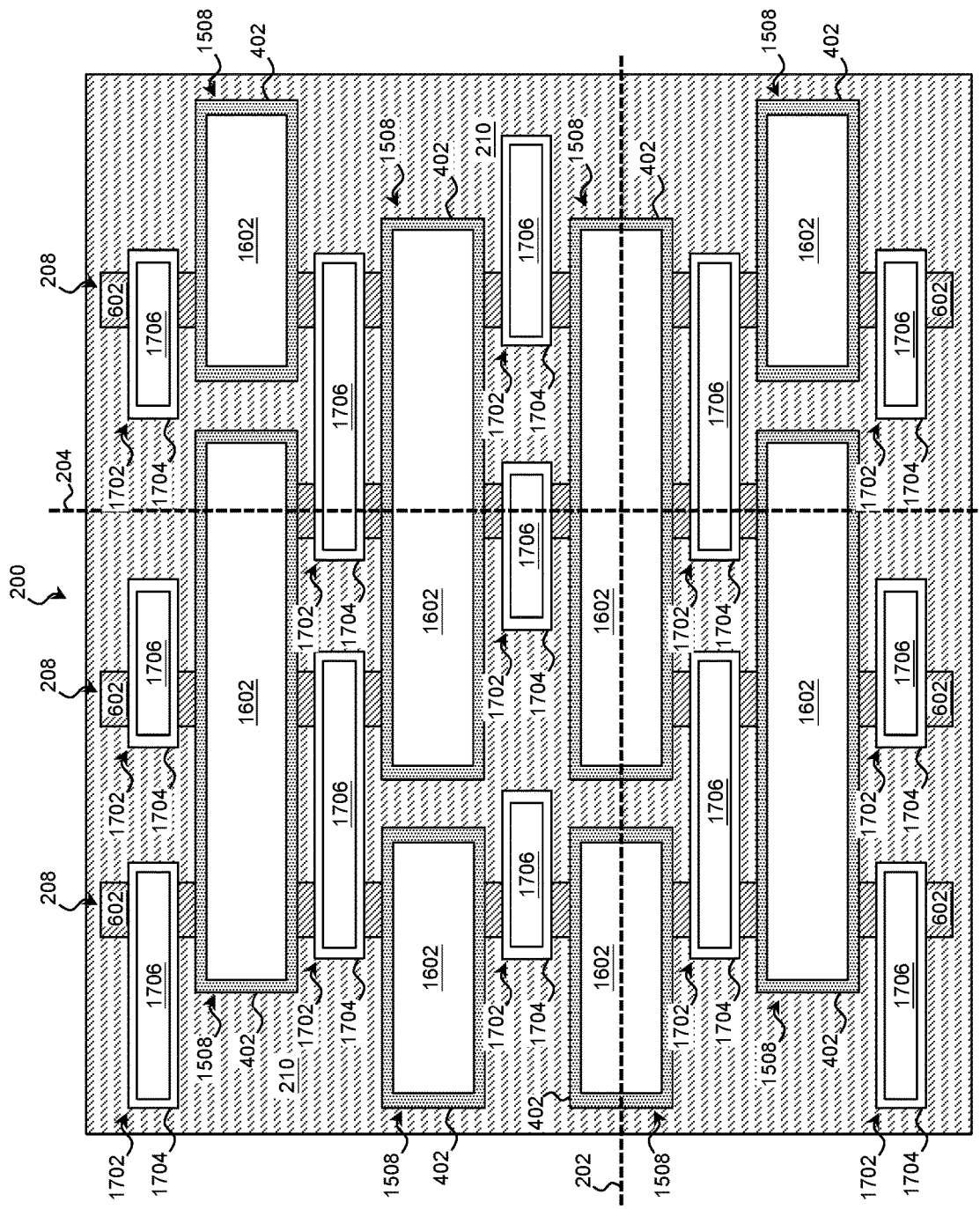
Figure 18B:
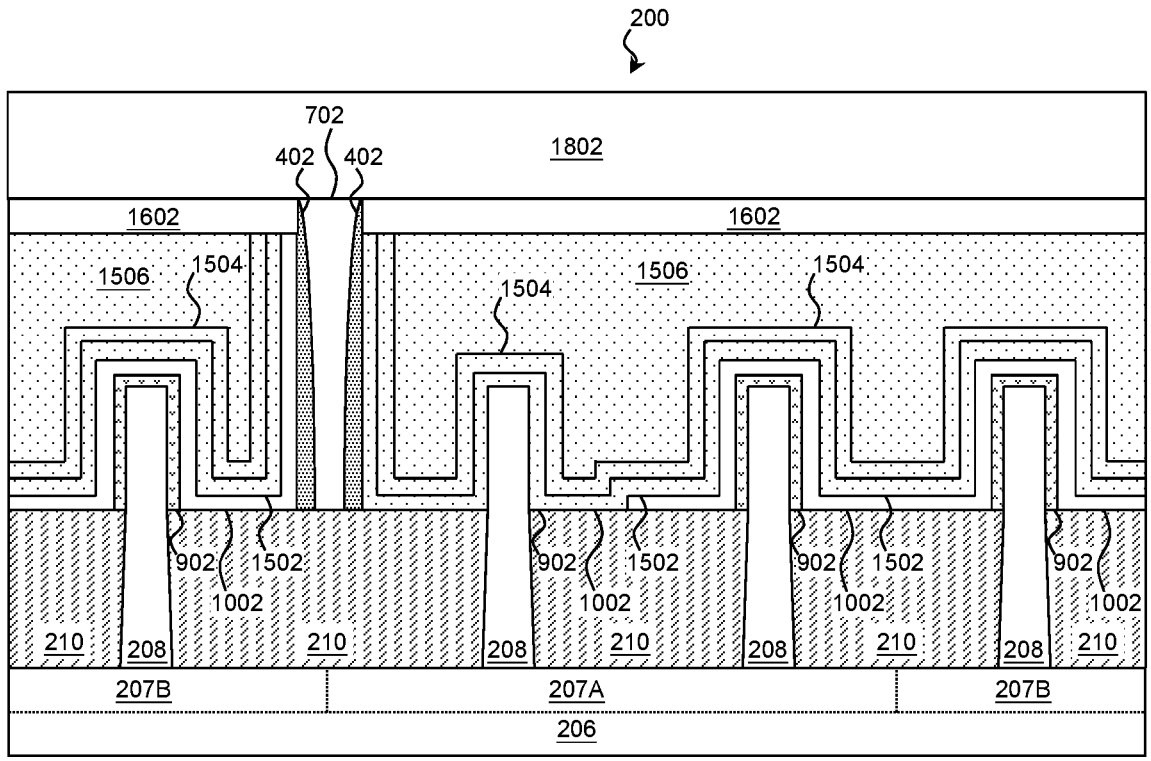
Figure 18C:
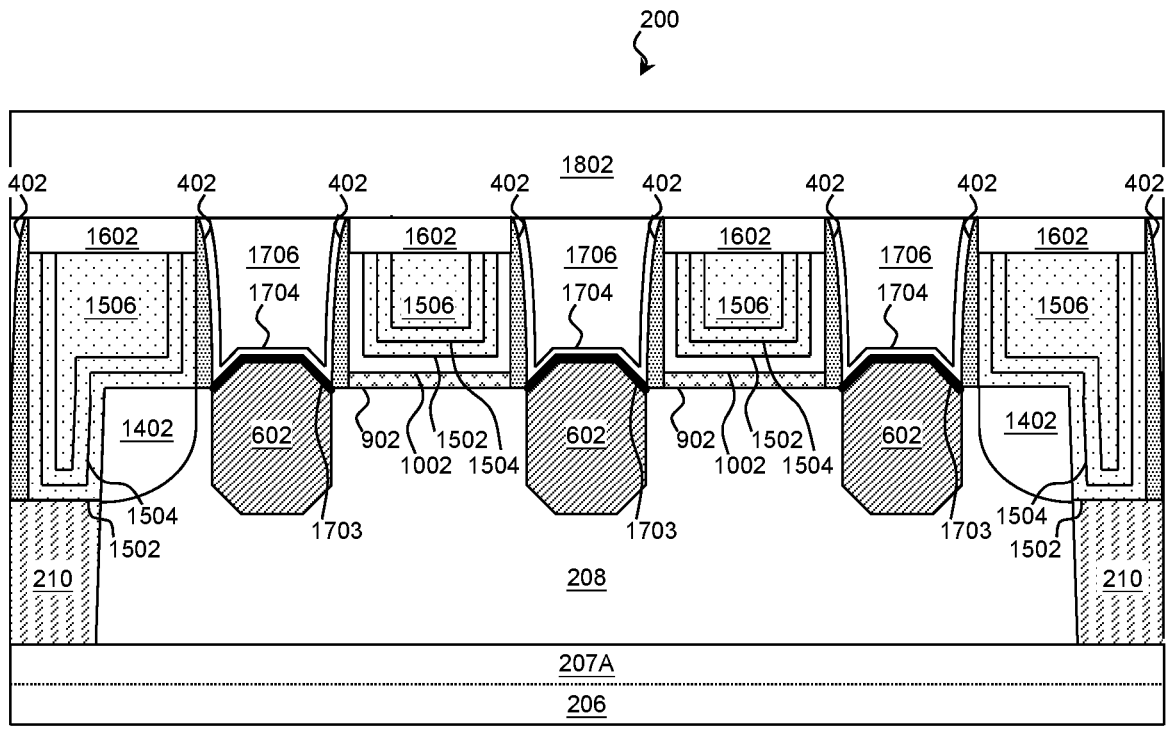
Figure 19A:
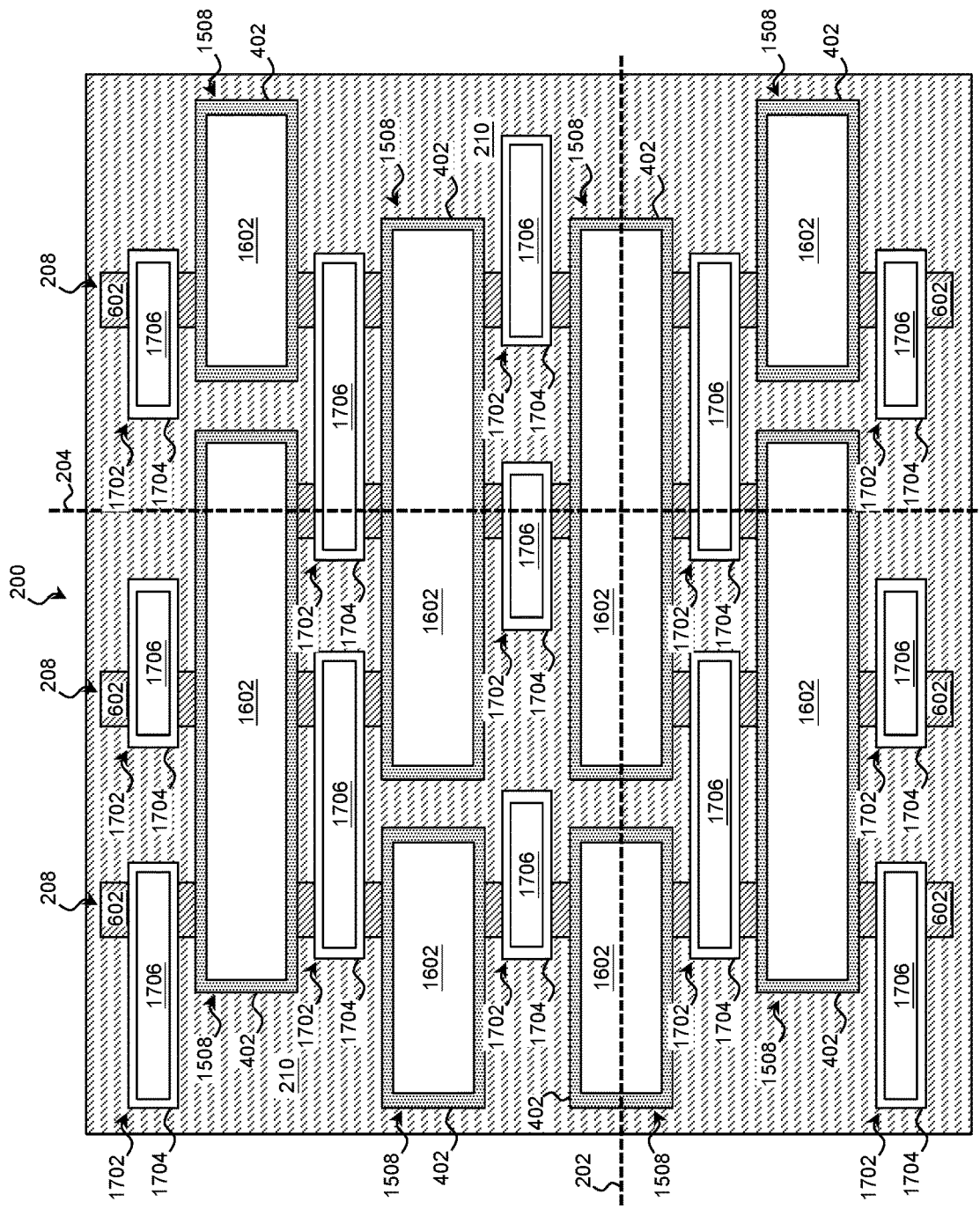
Figure 19B:
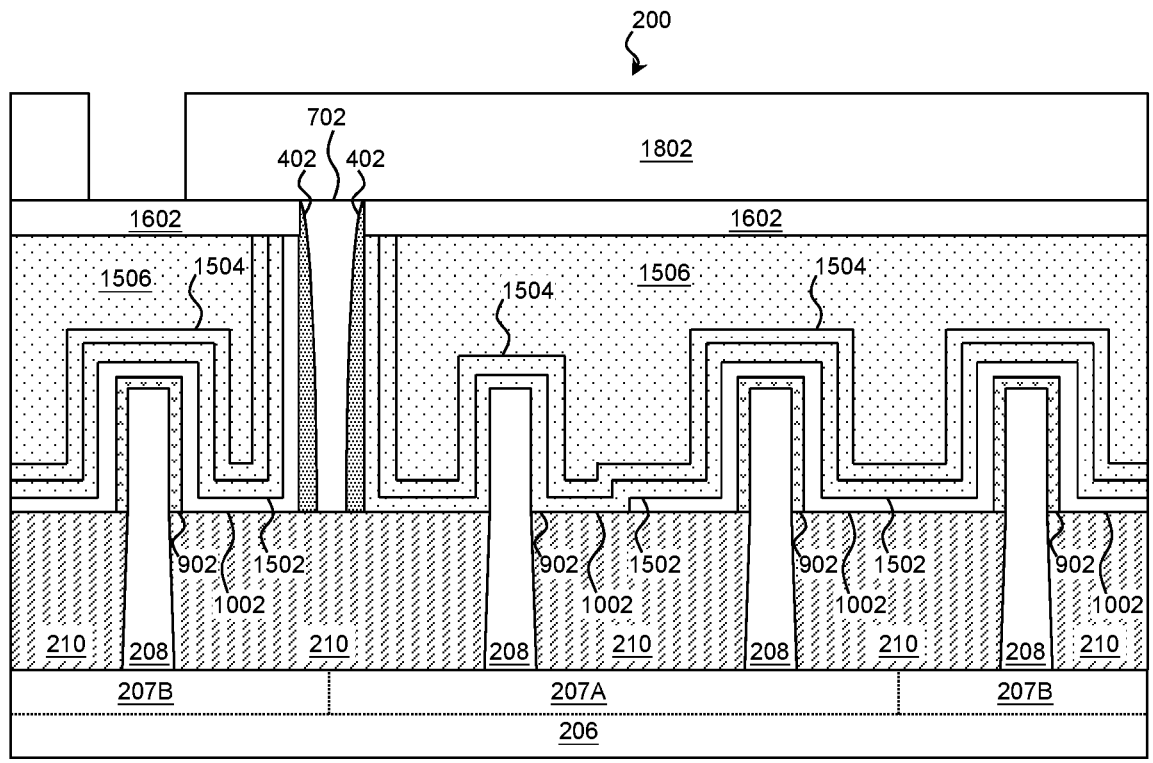
Figure 19C:
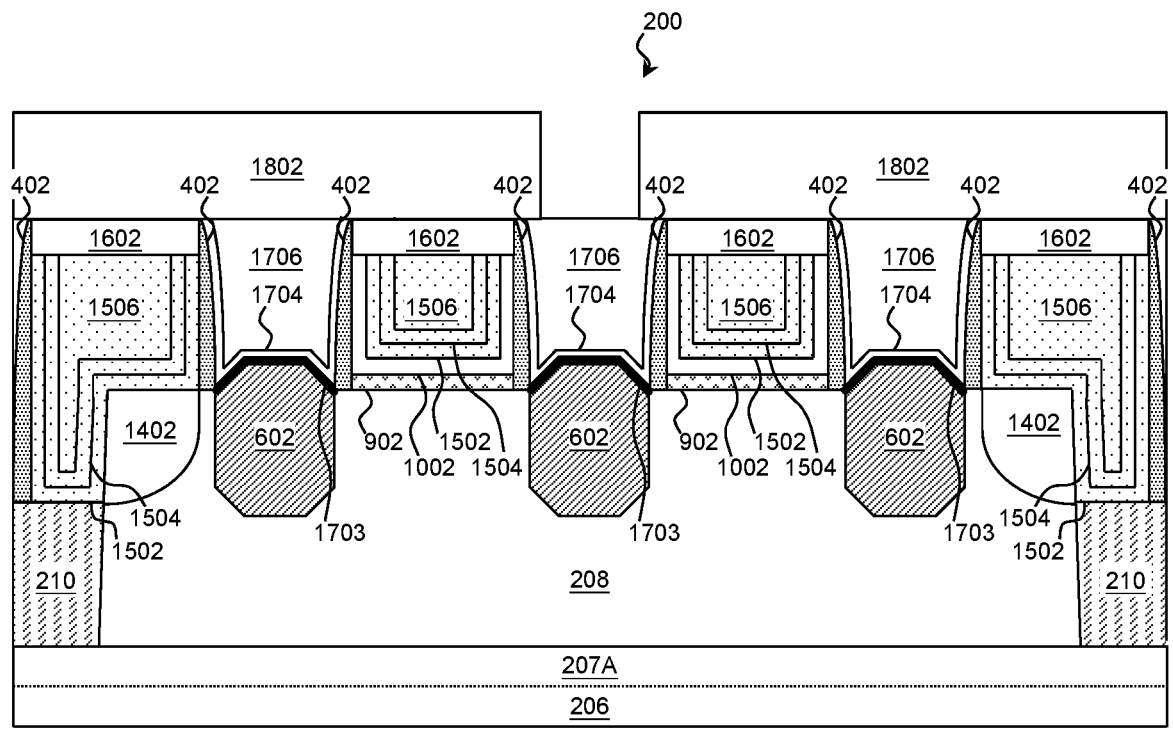

Referring to block 136 of FIG. 1B and to FIGS. 18A-18C, a second ILD layer 1802 is formed on the workpiece 200. The second ILD layer 1802 is not shown in the top view of FIG. 18A to avoid obscuring other elements of the workpiece 200. The second ILD layer 1802 may be substantially similar in composition to the first ILD layer 702 and may include a dielectric material (e.g., a semiconductor oxide, a semiconductor nitride, a semiconductor oxynitride, a semiconductor carbide, etc.), SOG, FSG, PSG, BPSG, Black Diamond®, Xerogel, Aerogel, amorphous fluorinated carbon, parylene, BCB, SiLK®, and/or combinations thereof. The second ILD layer 1802 may be formed by any suitable process including CVD, PVD, spin-on deposition, and/or other suitable processes.

Based on the design, holes are opened in the second ILD layer 1802 and the gate cap 1602 for forming contacts 2002 that couple to the source/drain contacts 1702 and to the gate structures 1508. Referring to block 138 of FIG. 1B and to FIGS. 19A-19C, the second ILD layer 1802 and the gate cap 1602 are patterned to expose portions of the source/drain contacts 1702 and portions of the gate structures 1508. The patterning of block 138 may include one or more iterations of: applying a photoresist, exposing the photoresist, developing the photoresist, and etching the exposed portions of the second ILD layer 1802 and the gate cap 1602. Each of these processes may be performed substantially as described above.

Figure 20A:
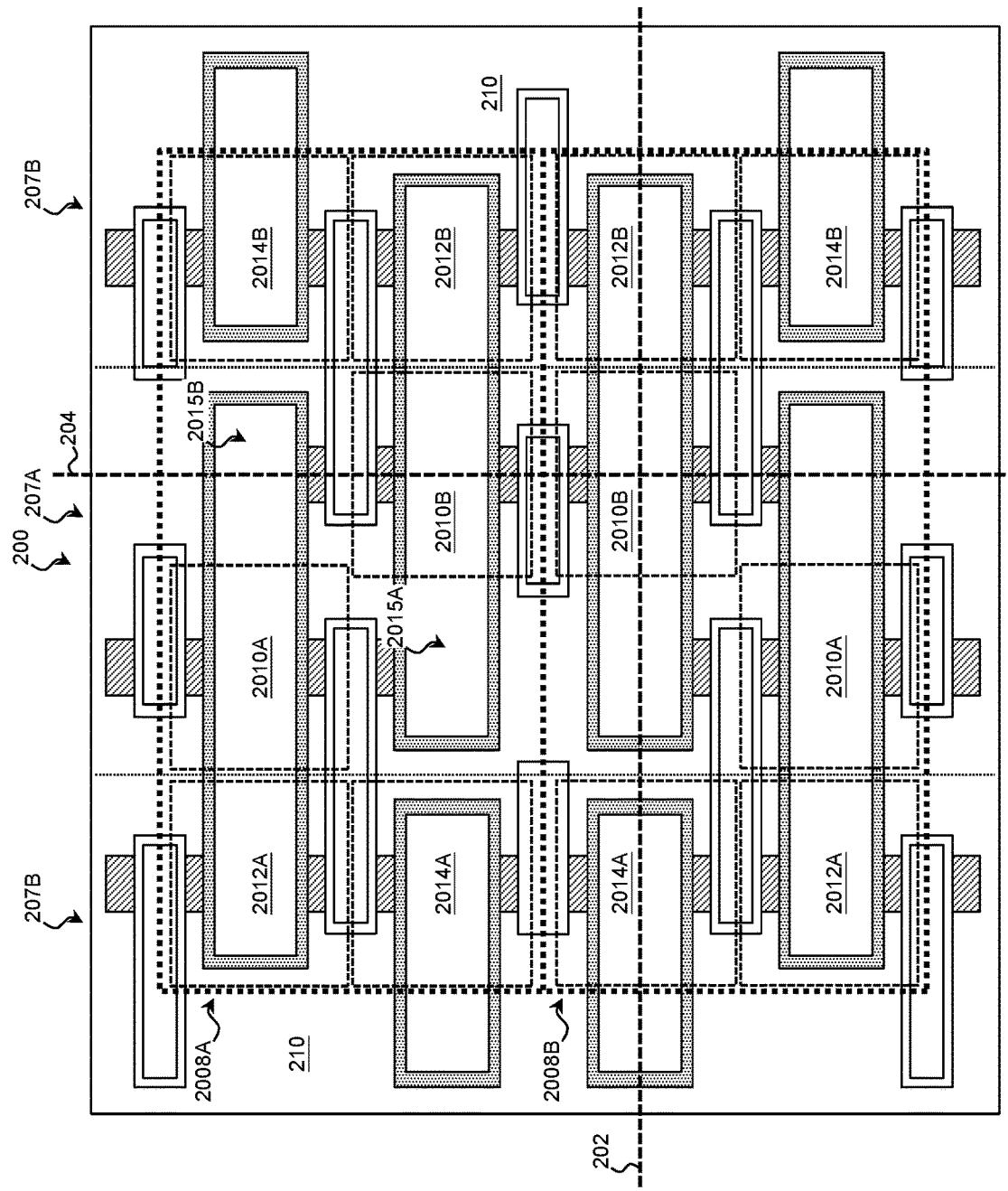
Figure 20B:
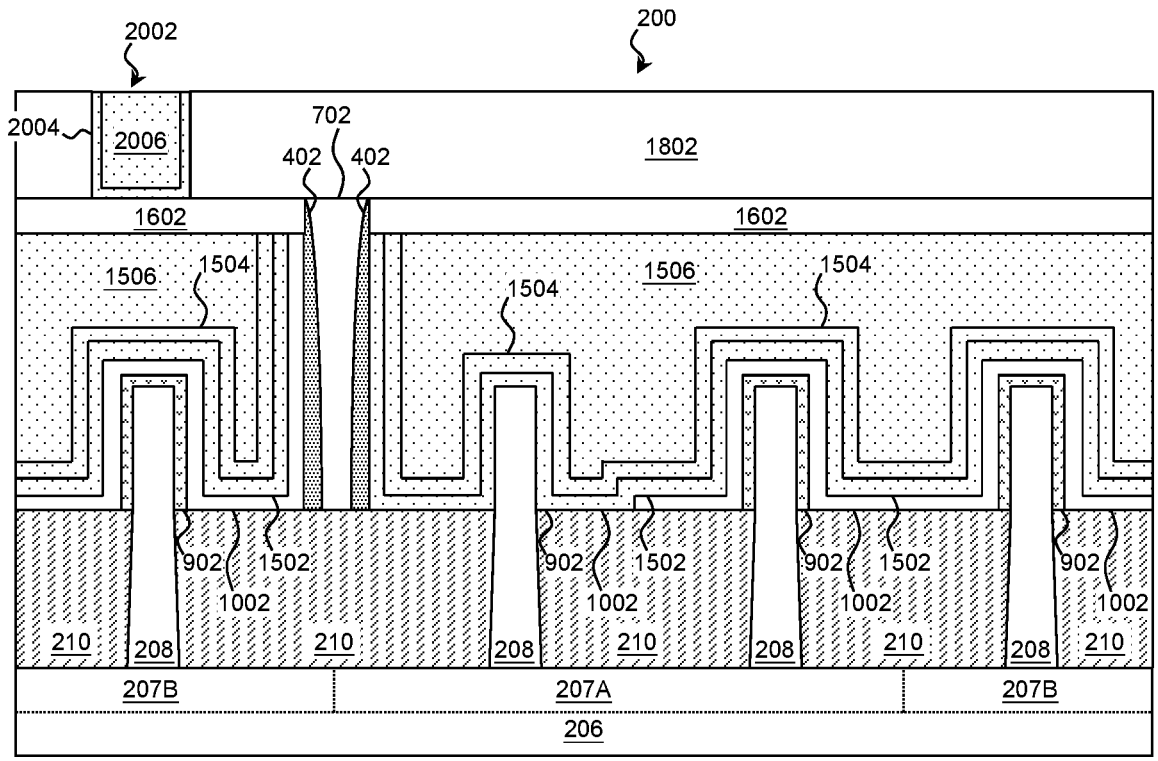
Figure 20C:
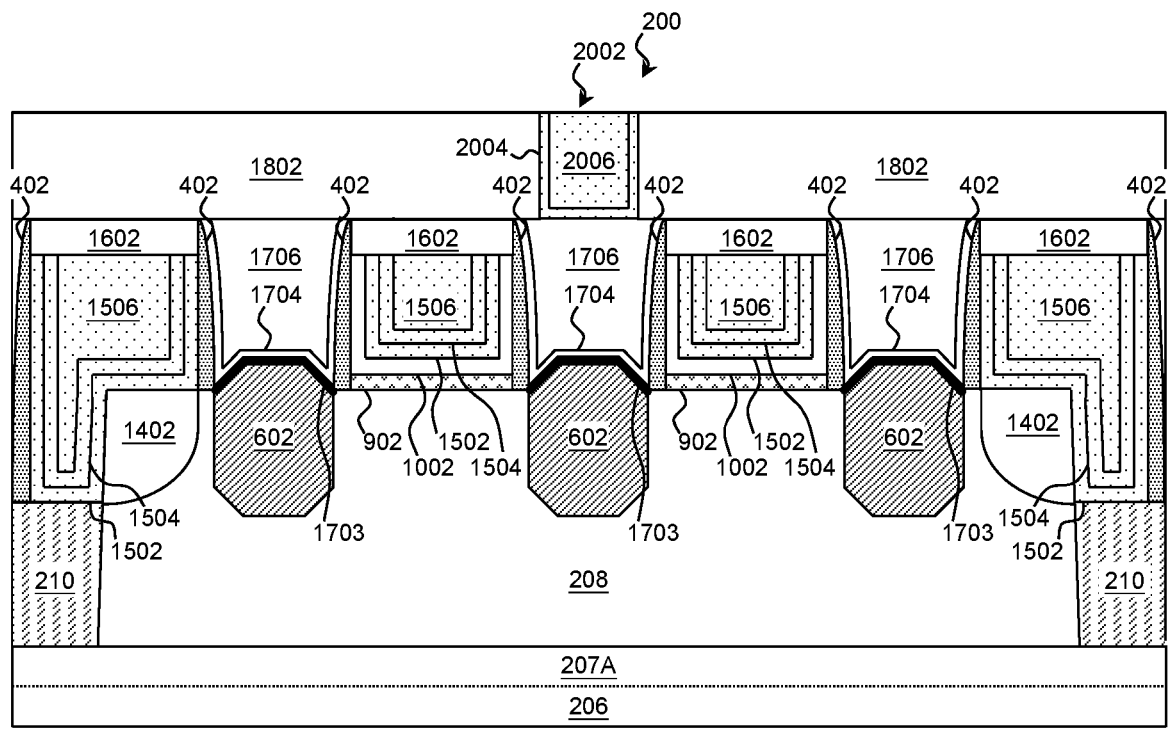

Referring to block 140 of FIG. 1B and to FIGS. 20A-20C, contacts 2002 are formed physically and electrically coupled to the source/drain contacts 1702 and to the gate structures 1508. The contacts 2002 not shown in the top view of FIG. 20A to avoid obscuring other elements of the workpiece 200. Forming the contacts 2002 may be performed substantially as described above in block 134, and in in one such example, forming the contacts 2002 includes forming a glue layer 2004 and a fill material 2006 on the glue layer 2004 each substantially as described above.

Referring to block 142 of FIG. 1B, the workpiece 200 is provided for further fabrication. In various examples, further fabrication includes forming a remainder of an electrical interconnect structure, dicing, packaging, and other fabrication processes.

It will be recognized that the contacting gate structures described above may be used throughout an integrated circuit including in logic areas, memory areas, input/output areas, etc. For example, the exemplary integrated circuit of FIGS. 2A-20C is representative of an SRAM structure as shown in more detail in FIG. 20A and includes two SRAM memory cells 2008A and 2008B, each of which includes six transistors: two pull-up transistors 2010A and 2010B, two pull-down transistors 2012A and 2012B and two pass-gate transistors 2014A and 2014B. In the illustrated examples, a first contacting gate 2015A couples a source/drain feature of a first pull-up transistor 2010A (e.g., a PMOS pull-up transistor 2010A disposed over an n-well 207A) to the gate of the second pull-up transistor 2010B (e.g., a PMOS pull-up transistor 2010B disposed over the n-well 207A) and the second pull-down transistor 2012B (e.g., an NMOS pull-down transistor 2012B over a p-well 207B), and a second contacting gate 2015B couples a source/drain feature of the second pull-up transistor 2010B to the gate of the first pull-up transistor 2010A and the first pull-down transistor 2010A (e.g., an NMOS pull-down transistor 2012A over a p-well 207B). However, it is noted that the contacting gate structures are in no way limited to memory circuits.

Figure 21:
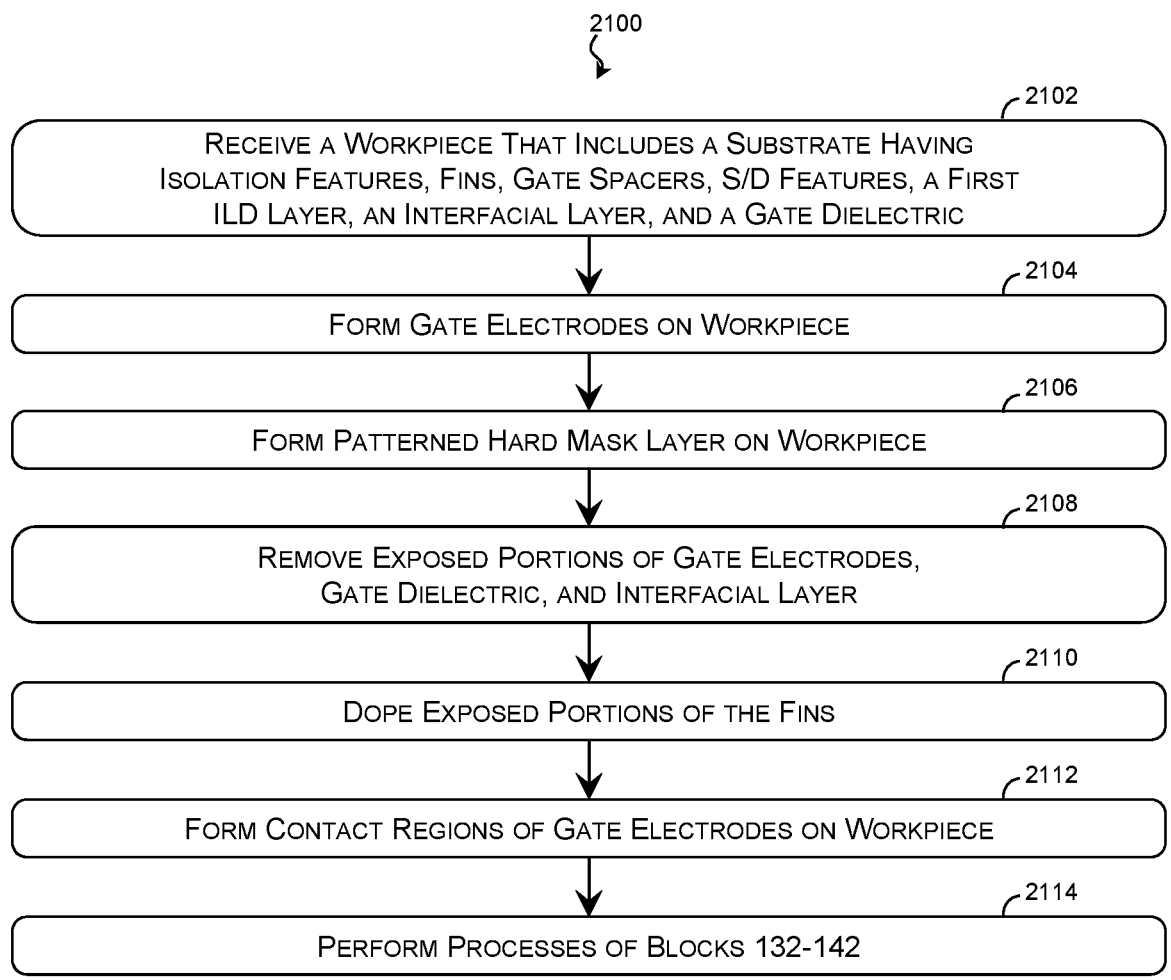
FIG. 21 is a flow diagram of a method of fabricating a workpiece with a contacting gate having a varying composition according to various aspects of the present disclosure.

In the above examples, the portions of the gate electrodes that function as device gates may include many of the same materials as the portions of the gate electrodes that function as contacts. In further examples, an integrated circuit and a method for forming the integrated circuit are provided where a gate structure includes an electrode with a first portion having a first composition that functions as a device gate and a second portion having a different composition that functions as a contact. FIG. 21 is a flow diagram of a method 2100 of fabricating a workpiece 2200 with a contacting gate having a varying composition according to various aspects of the present disclosure. Additional steps can be provided before, during, and after the method 2100, and some of the steps described can be replaced or eliminated for other embodiments of the method 2100.

FIGS. 22A, 23A, 24A, 25A, 26A, and 27A are top view diagrams of the workpiece 2200 at various points in the method 2100 of fabrication according to various aspects of the present disclosure. FIGS. 22B, 23B, 24B, 25B, 26B, and 27B are cross-sectional diagrams of the workpiece 2200 taken along a gate plane 202 at various points in the method 2100 of fabrication according to various aspects of the present disclosure. FIGS. 22C, 23C, 24C, 25C, 26C, and 27C are cross-sectional diagrams of the workpiece 2200 taken along a fin-length plane 204 at various points in the method 2100 of fabrication according to various aspects of the present disclosure. FIGS. 22A-27C have been simplified for the sake of clarity and to better illustrate the concepts of the present disclosure. Additional features may be incorporated into the workpiece 2200, and some of the features described below may be replaced or eliminated for other embodiments of the workpiece 2200.

Figure 22A:
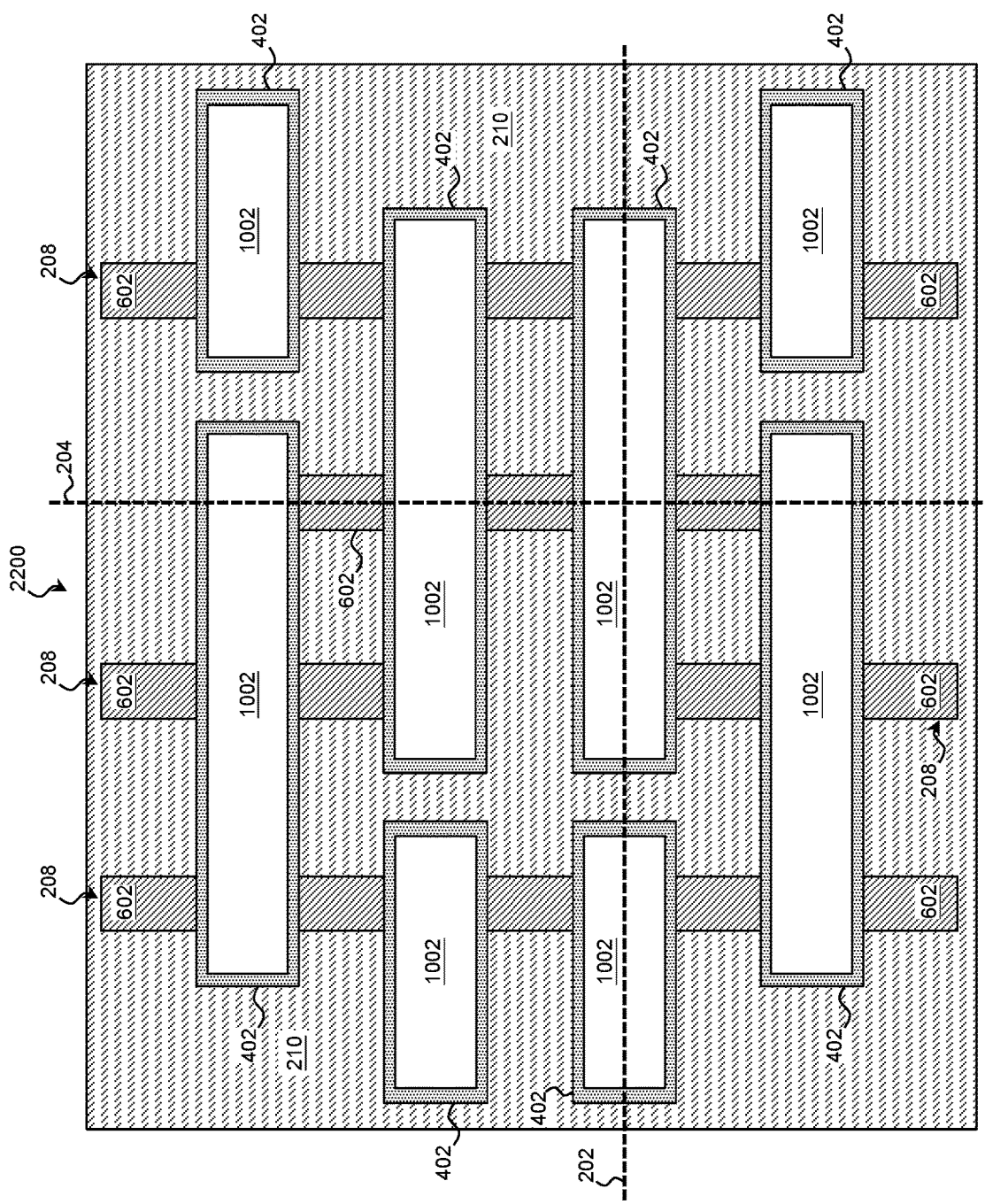
FIGS. 22A, 23A, 24A, 25A, 26A, and 27A are top view diagrams of the workpiece at various points in the method of fabrication according to various aspects of the present disclosure.
Figure 22B:
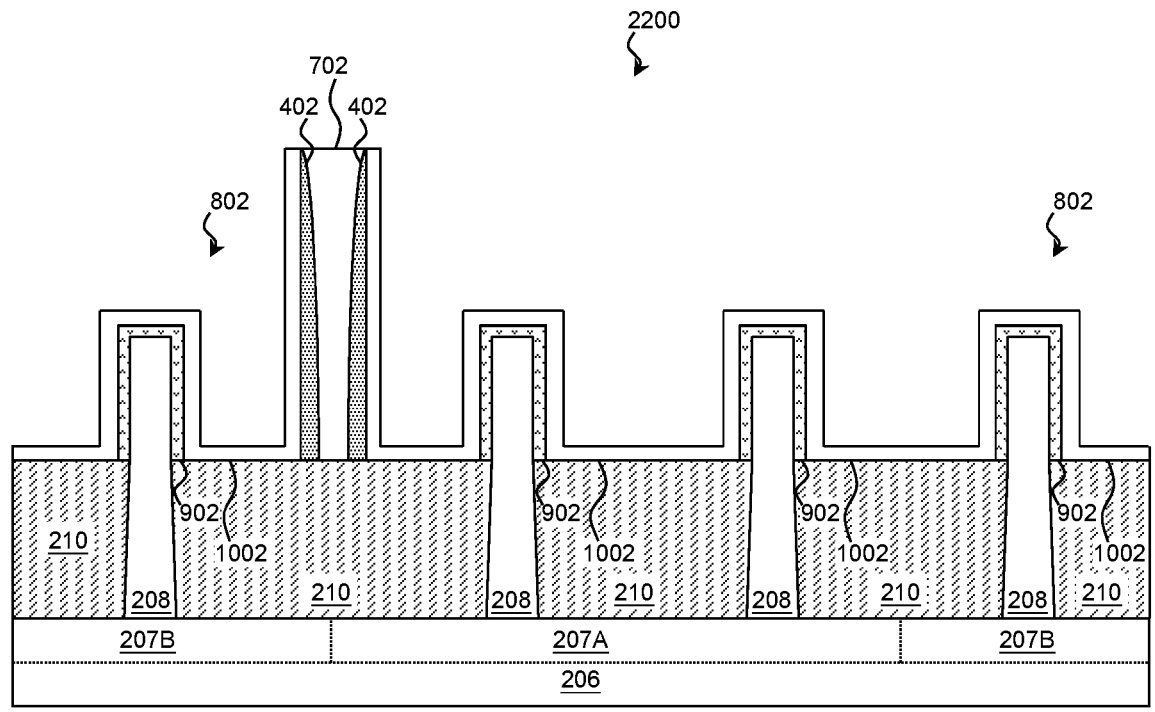
FIGS. 22B, 23B, 24B, 25B, 26B, and 27B are cross-sectional diagrams of the workpiece taken along a gate plane at various points in the method of fabrication according to various aspects of the present disclosure.
Figure 22C:
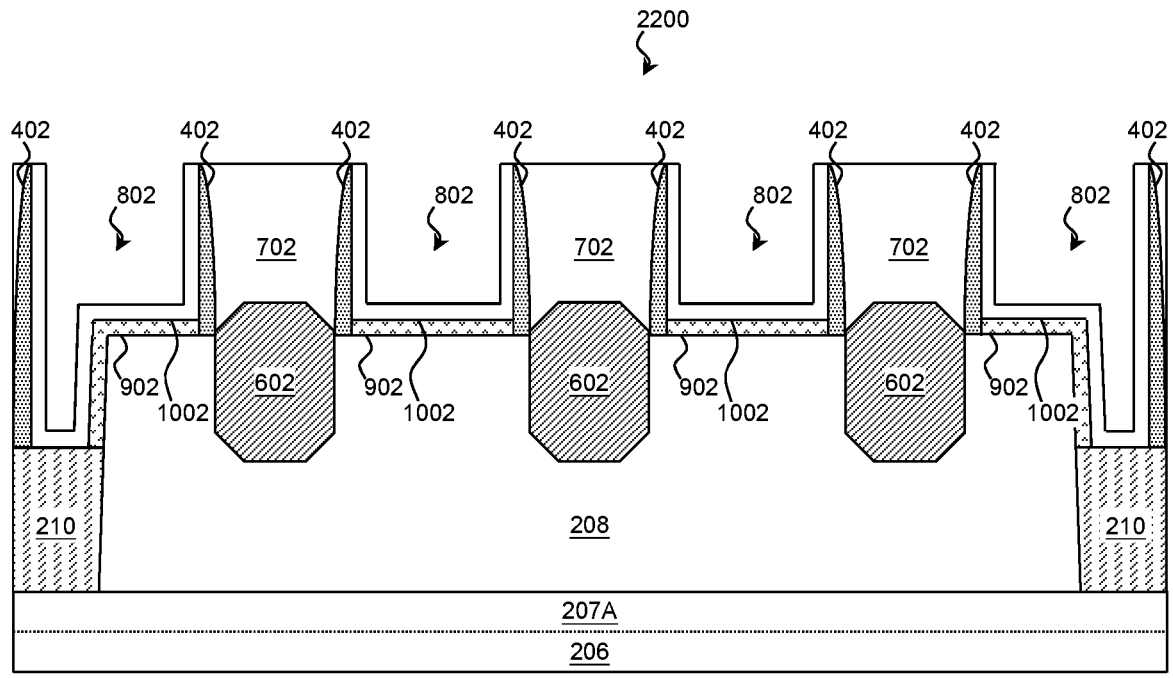
FIGS. 22C, 23C, 24C, 25C, 26C, and 27C are cross-sectional diagrams of the workpiece taken along a fin-length plane at various points in the method of fabrication according to various aspects of the present disclosure.

Referring to block 2102 of FIG. 21 and to FIGS. 22A-22C, a workpiece 2200 is received that includes a substrate 206 having fins 208, isolation features 210, gate spacers 402, source/drain features 602, a first ILD layer 702, and gate recesses 802 disposed on the substrate 206, and an interfacial layer 902 and a gate dielectric 1002 disposed in each of the gate recesses 802. These elements may be substantially similar to those described above and may be formed by any suitable technique including the processes described above in blocks 102-118 of FIG. 1A.

Figure 23A:
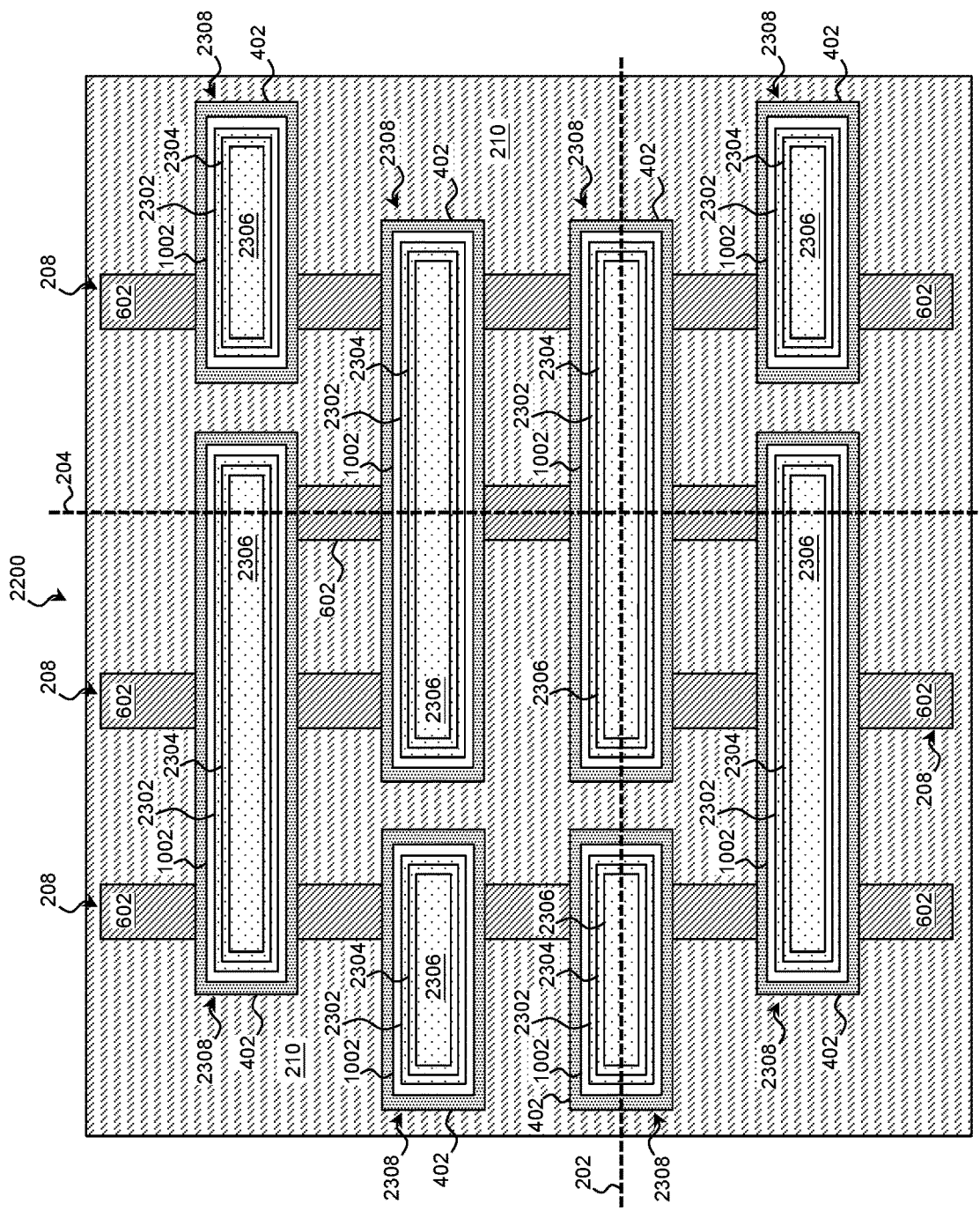
Figure 23B:
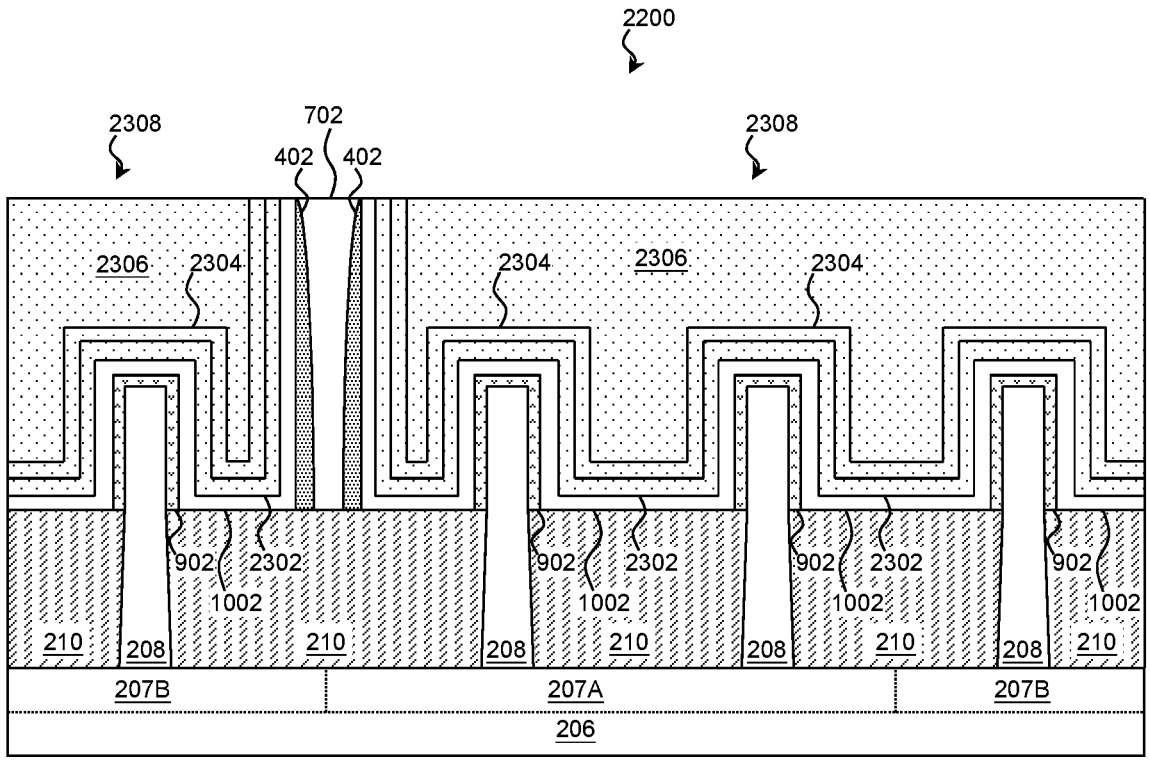
Figure 23C:
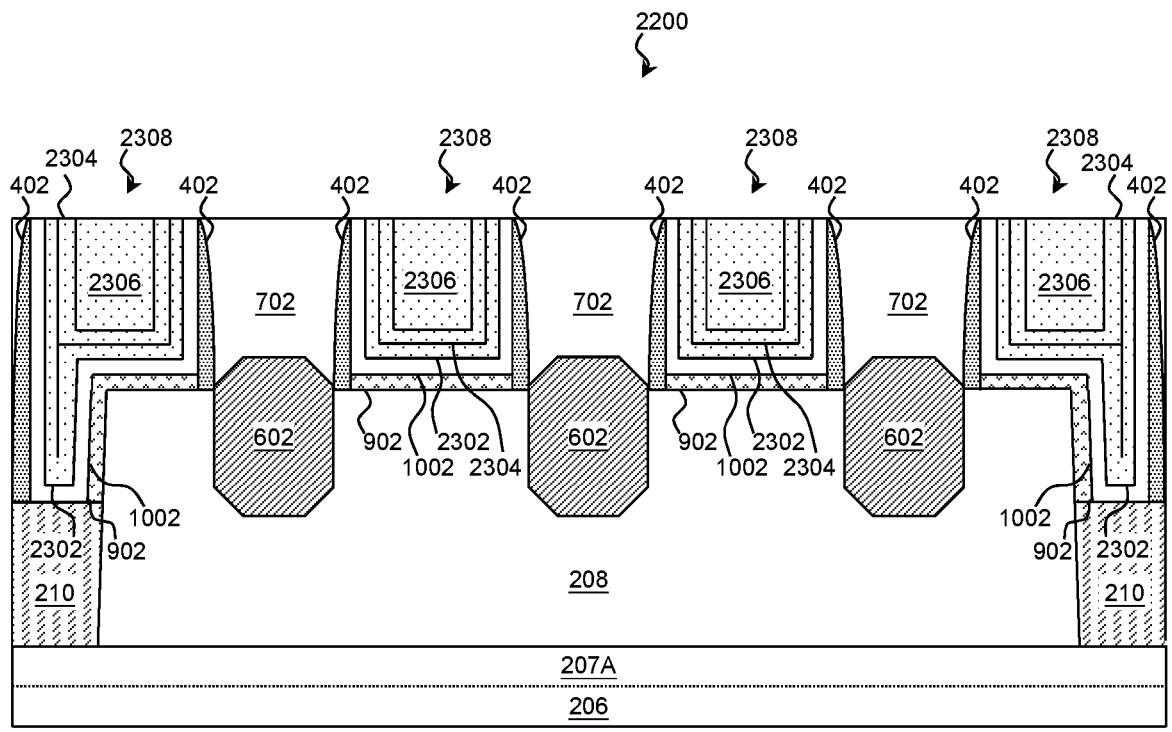

Referring to block 2104 of FIG. 21 and to FIGS. 23A-23C, gate electrodes are formed on the workpiece 2200. This may be performed substantially as described in block 130 of FIG. 1B. However, in block 2104, the gate electrodes are formed on the interfacial layer 902 and on the gate dielectric 1002 in both types of regions (i.e., where the gate electrodes function as gates and where the gate electrodes function as contacts).

The gate electrodes may include a number of different conductive layers. In some examples, forming a gate electrode includes forming a capping layer 2302 on the workpiece 200. The capping layer 2302 may be formed directly on the gate dielectric 1002.

The capping layer 2302 may be substantially similar in composition to capping layer 1502 and may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various embodiments, the capping layer 2302 includes TaSiN, TaN, and/or TiN.

In some examples, forming a gate electrode includes forming one or more work function layers 2304 on the capping layer 2302. The work function layers 2304 may be substantially similar in composition to work function layers 1504 and suitable work function layer 2304 materials include n-type and/or p-type work function materials based on the type of device to which the gate structure 2308 corresponds. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 2304 may be deposited by any suitable technique including ALD, CVD, PE CVD, PEALD, PVD, and/or combinations thereof. Because the p-type and n-type devices may have different work function layers 2304, in some examples, the n-type work function layers 2304 are deposited in a first deposition process that uses a dielectric hard mask to prevent depositing on the electrodes of the p-type devices, and the p-type work function layers 2304 are deposited in a second deposition process that uses a dielectric hard mask to prevent depositing on the electrodes of the n-type devices.

In some examples, forming a gate electrode includes forming an electrode fill 2306 on the work function layer(s) 2304. The electrode fill 2306 may be substantially similar to electrode fill 1506 and may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 2306 may be deposited by any suitable technique including ALD, CVD, PE CVD, PEALD, PVD, and/or combinations thereof.

A CMP process may be performed to remove electrode material (e.g., material of: the capping layer 2302, the work function layer(s) 2304, the electrode fill 2306, etc.) that is outside of the gate structures 2308.

Figure 24A:
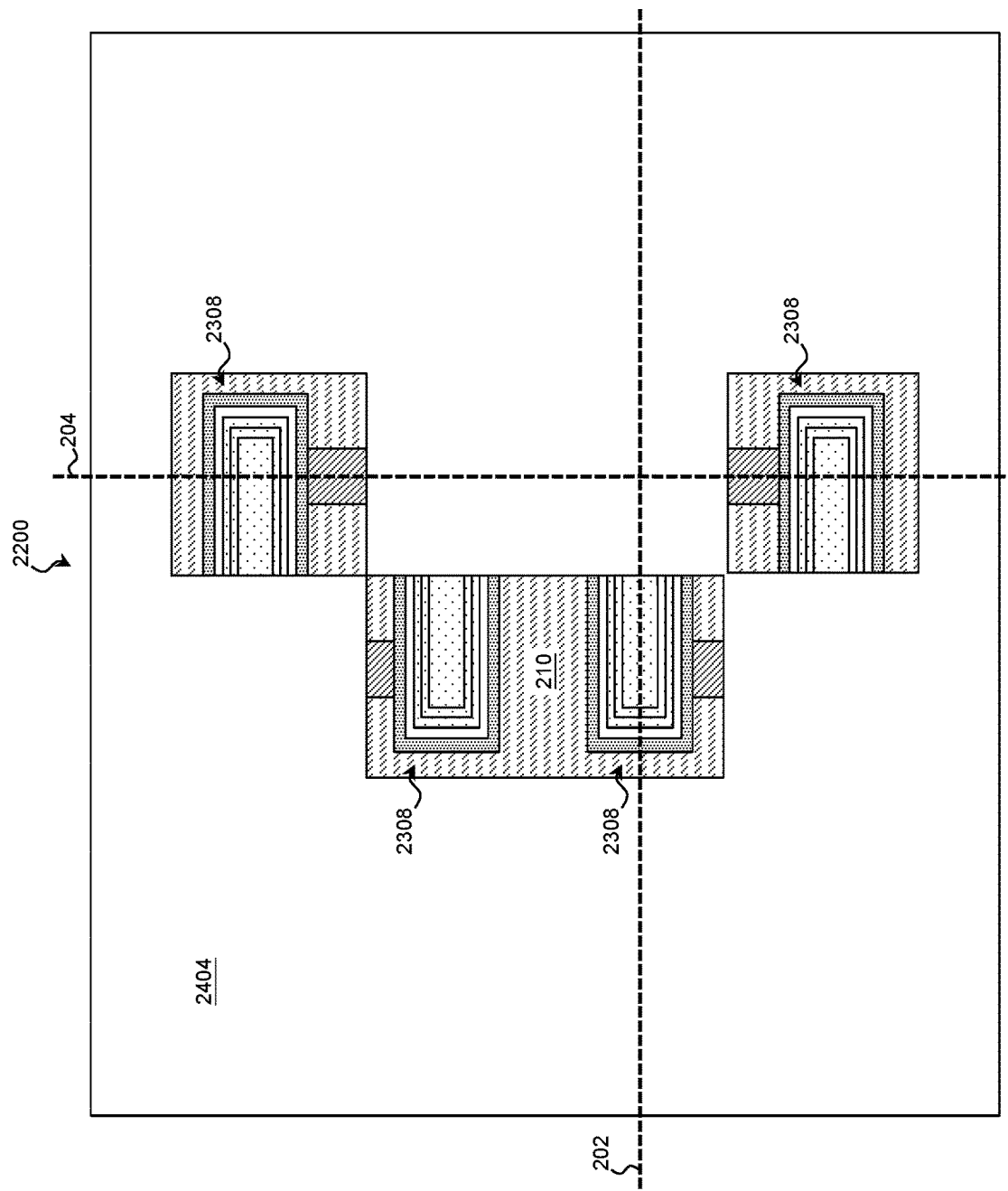
Figure 24B:
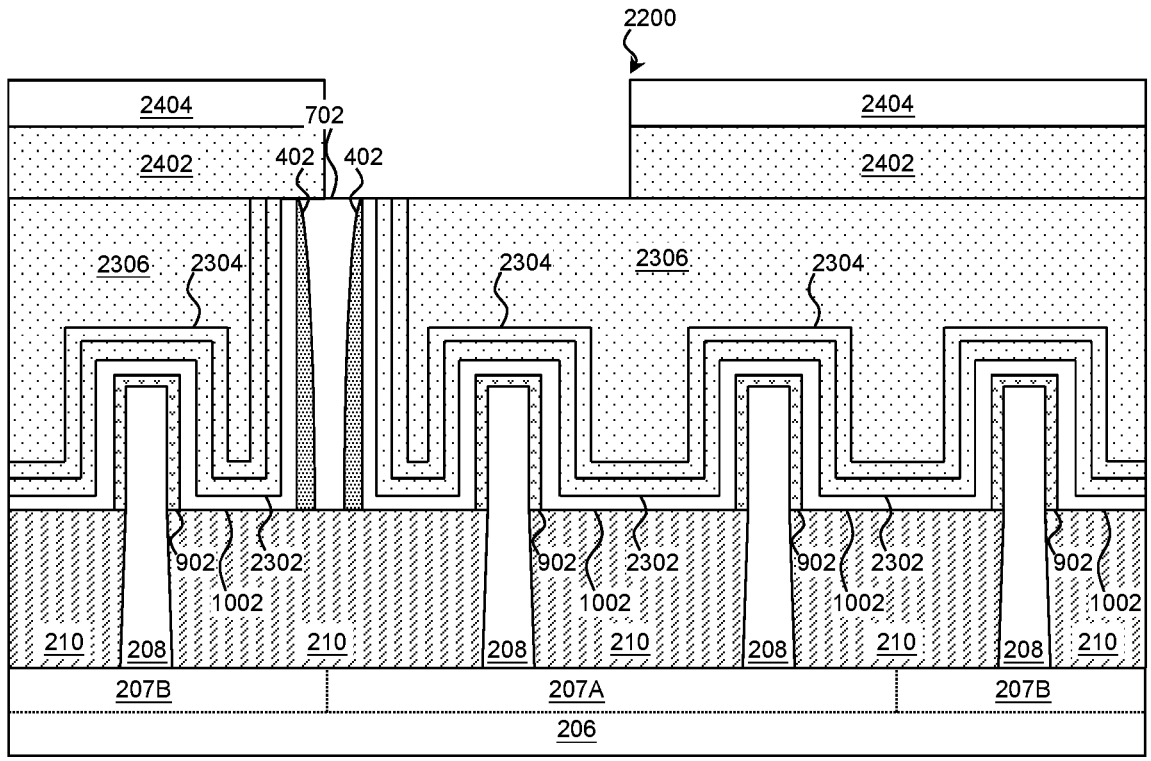
Figure 24C:
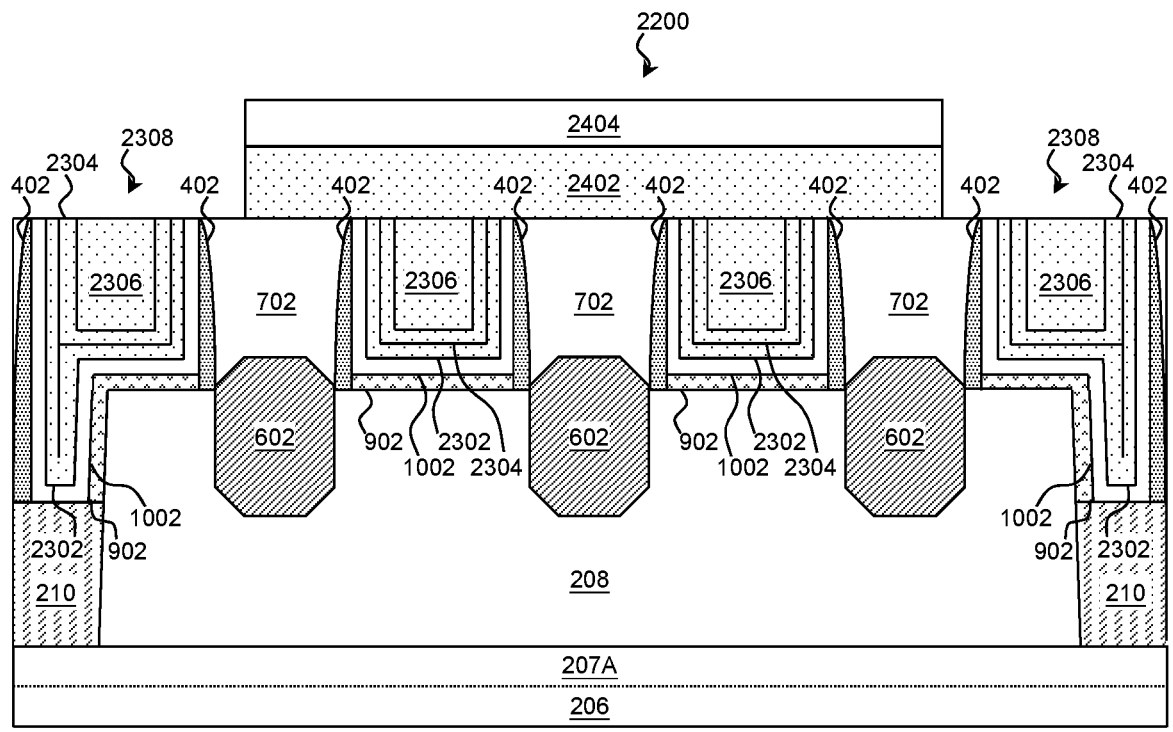

Referring to block 2106 of FIG. 21 and to FIGS. 24A-24C, a patterned hard mask layer 2402 is formed on the workpiece 2200, which may include forming a patterned photoresist layer 2404 on the hard mask layer 2402. The hard mask layer 2402 may include any suitable material, and in various examples includes a dielectric material (e.g., a semiconductor oxide, a semiconductor nitride, a semiconductor oxynitride, a semiconductor carbide, a semiconductor oxycarbonitride, etc.), and/or other suitable material. The hard mask layer 2402 may be formed using any suitable process including CVD, HDP-CVD, PVD, ALD, spin-on deposition, and/or other suitable deposition processes.

The hard mask layer 2402 is patterned to expose those regions where the gate structures 2308 (e.g., electrode fill 2306, work function layers(s) 2304, the capping layer 2302, the gate dielectric 1002, and/or interfacial layer 902) are to be removed so that the forthcoming conductive material electrically contacts the fins 208. In an example, the hard mask layer 2402 is patterned in a photolithographic process that includes: forming the photoresist layer 2404 on the hard mask layer 2402, lithographically exposing the photoresist layer 2404, and developing the exposed photoresist layer 2404 to expose portions of the hard mask layer 2402 to be removed. The photolithographic process may be performed substantially as described in block 104 of FIG. 1A.

Following the photolithographic process, the patterning of block 2106 may include an etching process to remove the exposed regions of the hard mask layer 2402. The etching processes may include any suitable etching technique, such as wet etching, dry etching, RIE, ashing, and/or other etching methods. The etching process may use any suitable etchant including an oxygen-based etchant, a fluorine-based etchant, a chlorine-based etchant, a bromine-based etchant, an iodine-based etchant, other suitable etchant liquids, gases, or plasmas, and/or combinations thereof. In an example, the etching process includes an isotropic etching technique using an etchant configured to remove the material of the hard mask layer 2402 without substantial etching of the photoresist layer 2404 or the surrounding materials such as the gate spacers 402, the first ILD layer 702, and the gate structures 2308. The etching may expose portions of the gate structures 2308 to be removed.

Figure 25A:
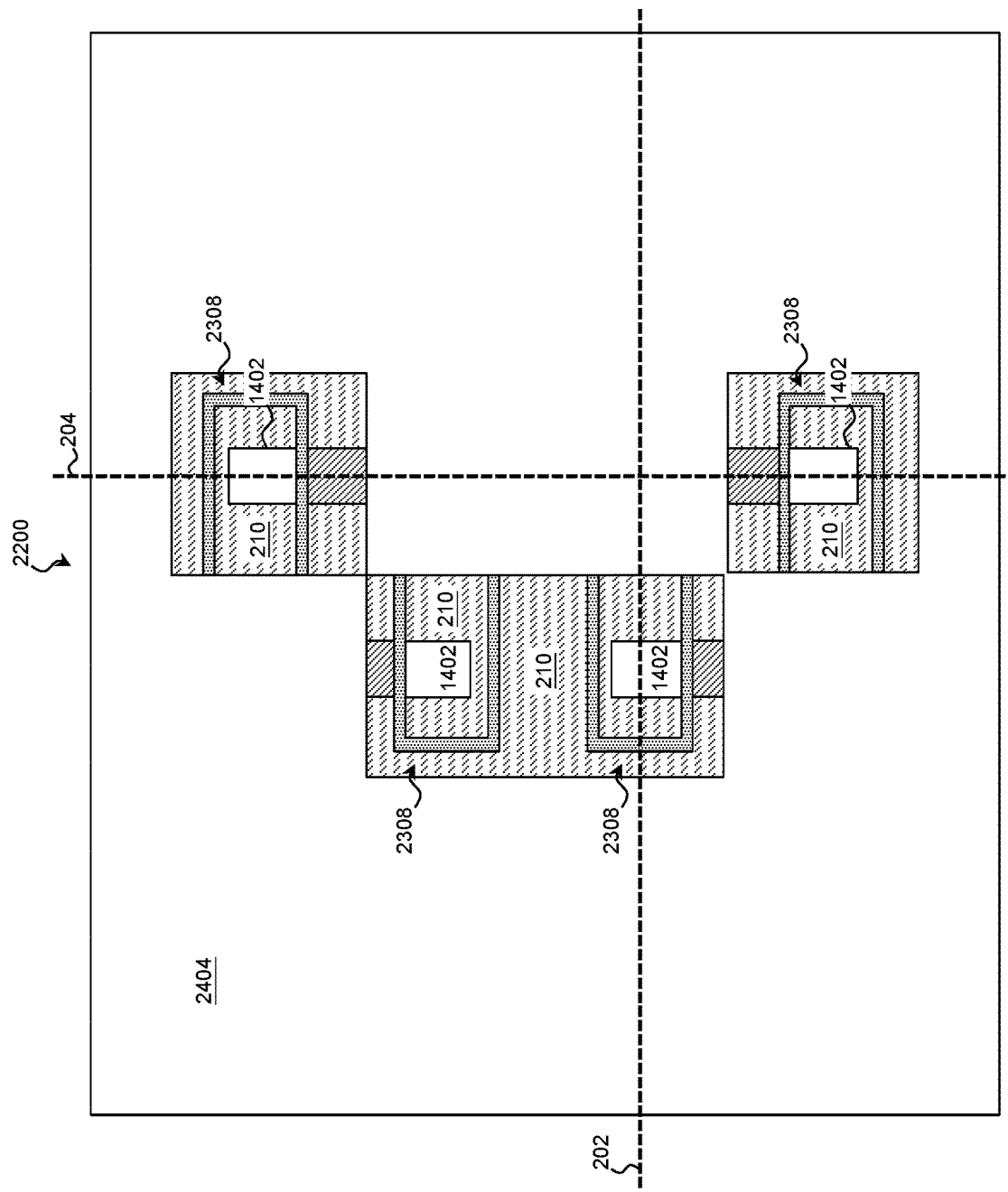
Figure 25B:
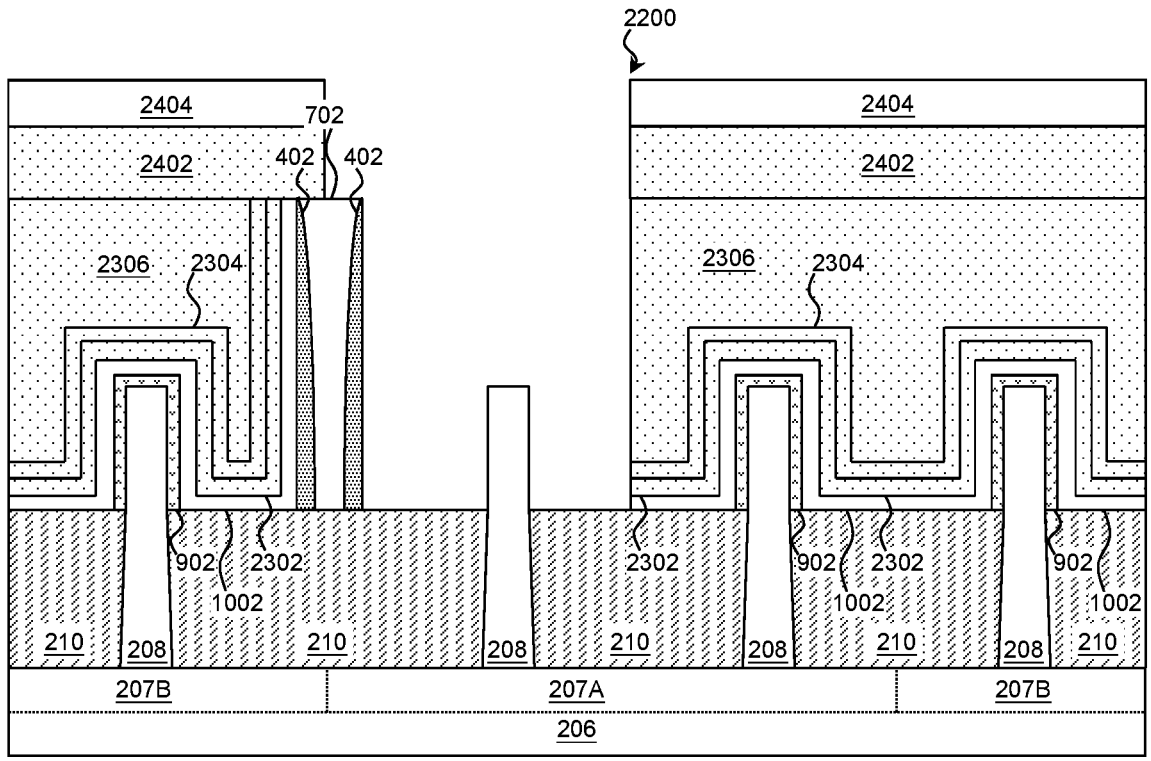
Figure 25C:
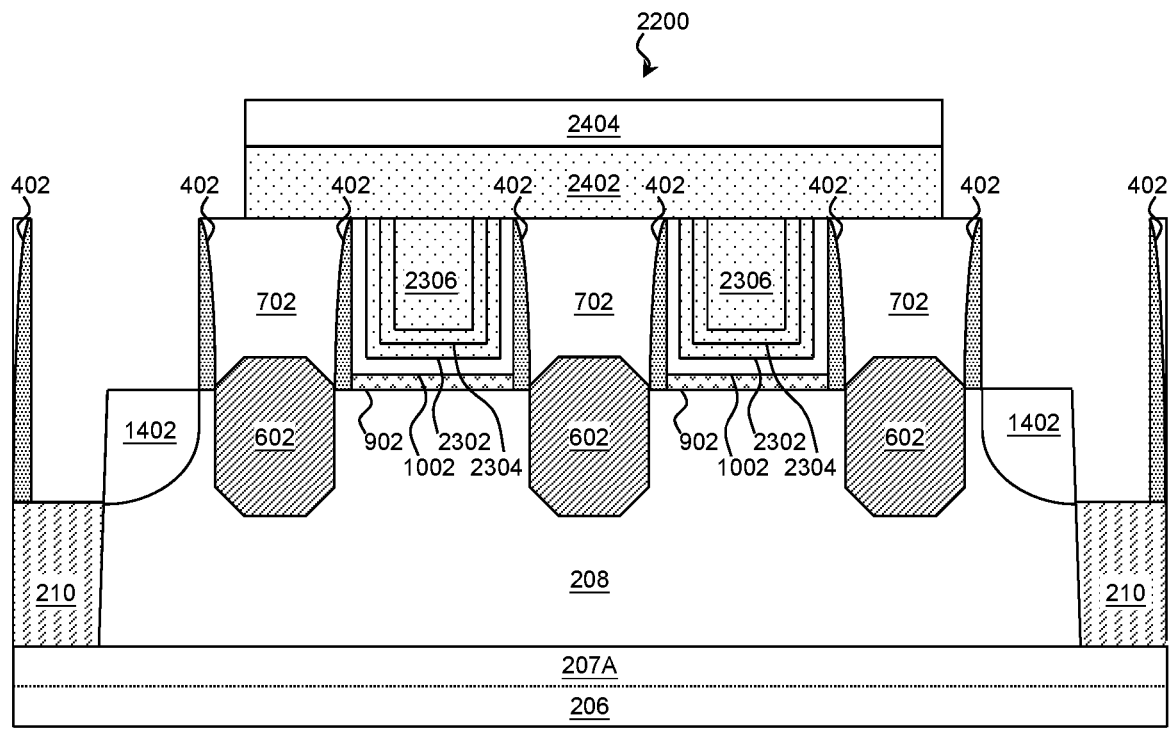

Referring to block 2108 of FIG. 21 and to FIGS. 25A-25C, the exposed portions of the gate electrode, the gate dielectric 1002, and the interfacial layer 902 are removed from the fins 208 at locations where the forthcoming conductive material is to couple to the fins 208. This may include performing an etching process, such as wet etching, dry etching, RIE, ashing, and/or other etching methods. The etching process may use any suitable etchant including an oxygen-based etchant, a fluorine-based etchant, a chlorine-based etchant, a bromine-based etchant, an iodine-based etchant, other suitable etchant liquids, gases, or plasmas, and/or combinations thereof. In one such example, the etching process includes multiple etching steps, each step using an etchant and technique configured to remove a particular material of the gate electrode (e.g., the capping layer 2302, the work function layer(s) 2304, the electrode fill 2306, etc.), the gate dielectric 1002, and the interfacial layer 902 without significant etching of the fins 208, the source/drain features 602, the hard mask layer 2402, the gate spacers 402, or the other surrounding materials.

Referring to block 2110 of FIG. 21 and to referring still to FIGS. 25A-25C, the portions of the fins 208 where the gate electrodes are to make contact are doped to reduce the resistance between the contacting gate electrodes and the adjacent source/drain features 602. The doped regions of the fins 208 may be substantially as described above and are indicated by marker 1402. In some examples, the doped regions 1402 of the fins 208 are doped using an ion implantation process with a dopant species of the same type (e.g., n-type or p-type) as the dopant in the adjacent source/drain features 602, which is the opposite of the type of dopant in the remainder of the fin 208. In such examples where the source/drain features 602 include a p-type dopant such as boron, the doped regions 1402 of the fins 208 are doped to include boron (boron-11, $BF_2$, etc.), indium, or other p-type dopants. In such examples where the source/drain features 602 include an n-type dopant such as phosphorus or arsenic, the regions 1402 of the fins 208 are doped to include phosphorus, arsenic, and/or other n-type dopants. The doped regions 1402 may be doped to any suitable dopant concentration, and in various examples, the dopant concentration is between about $1\times10^{14}$ atoms/$cm^2$ and about $5\times10^{15}$ atoms/$cm^2$. The hard mask layer 2402 and/or the photoresist layer 2404 may be used as implantation masks that protect the remainder of the fins 208 from the dopant species.

Figure 26A:
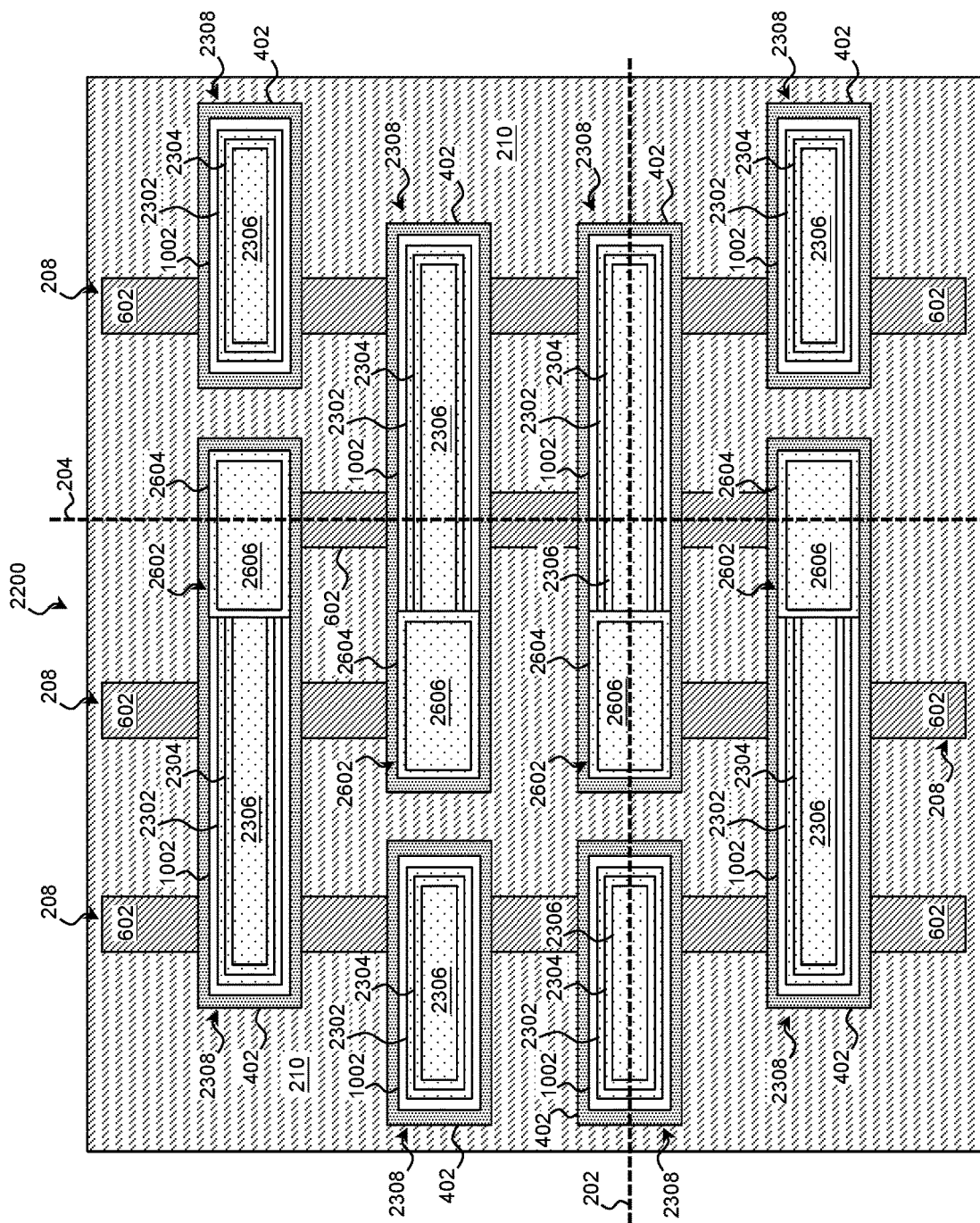
Figure 26B:
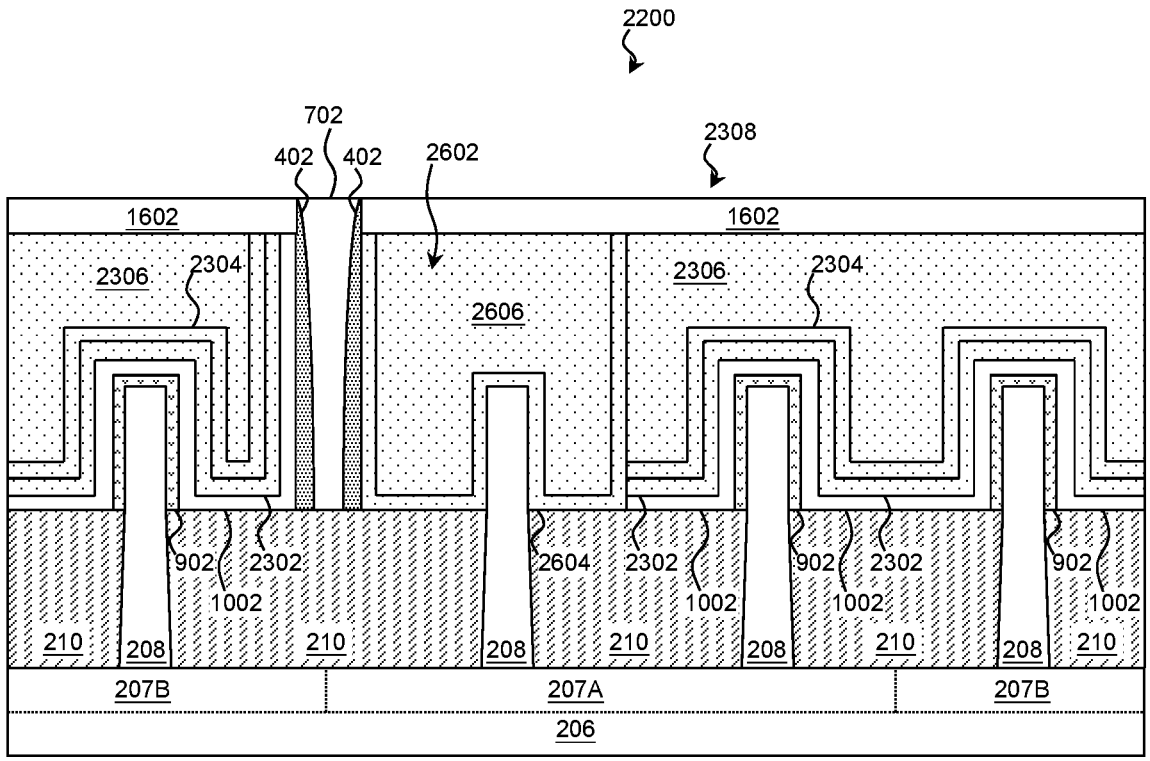
Figure 26C:
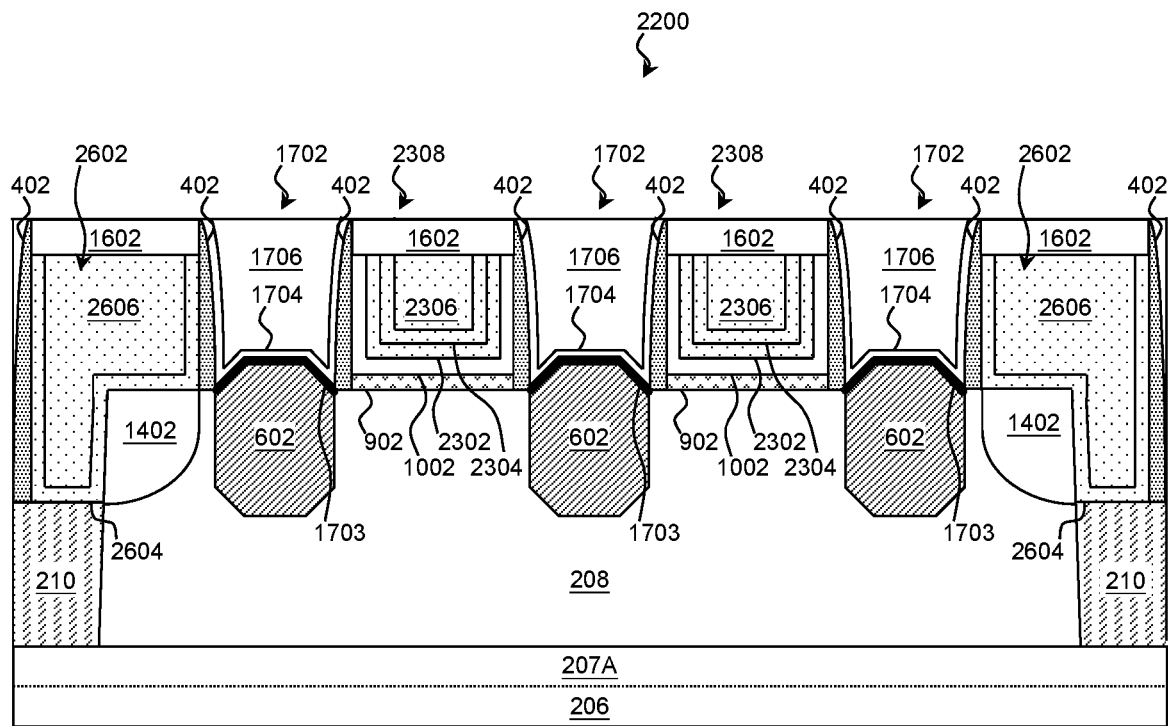

Referring to block 2112 of FIG. 21 and to referring to FIGS. 26A-26C, contact regions 2602 of the gate electrodes are formed on the workpiece 2200. As the name implies, the contact regions 2602 are formed in regions where the gate electrodes function as contacts. The contact regions 2602 may be different in composition and/or materials from the remainder of the gate electrode.

The contact regions 2602 may include a number of different conductive layers. In some examples, forming a contact region 2602 includes forming an interface layer 2604 on the workpiece 2200. The interface layer 2604 may be formed directly on the horizontal top surface and the vertical side surfaces of the fins 208 in regions where the gate electrodes function as contacts. To decrease resistance, a fin 208 may not extend along the fin-length direction through the entire gate electrode. This provides an additional vertical surface at the fin end where the contact region 2602 (e.g., the interface layer thereof) may physically and electrically couple to the fin 208.

The interface layer 2604 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various examples, the interface layer 2604 includes Ti, Co, or Ni, which may be used to form a silicide at an interface with the semiconductor of the fin 208 and thereby reduce the resistance at the interface. In some such examples, an annealing process is performed after depositing the interface layer 2604 to form the silicided interface.

Other conductive layers may be formed on the interface layer 2604. For example, an electrode fill 2606 may be formed on the interface layer 2604. The electrode fill 2606 may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 2606 may be deposited by any suitable technique including ALD, CVD, PE CVD, PEALD, PVD, and/or combinations thereof.

A CMP process may be performed to remove excess material (e.g., material of the interface layer 2604 and/or the electrode fill 2606) that is outside of the gate structures 2308 along with the hard mask layer 2402 and photoresist layer 2404.

In some examples, the process includes recessing the materials of the gate structures 2308 including the contact regions 2602 (e.g., the gate dielectric 1002, the capping layer 2302, the work function layer(s) 2304, the electrode fill 2306, the interface layer 2604, the electrode fill 2606, etc.) and forming a gate cap 1602 on the recessed gate structures 2308. The gate cap 1602 may be substantially similar to that above and may include any suitable material, such as: a dielectric material (e.g., a semiconductor oxide, a semiconductor nitride, a semiconductor oxynitride, a semiconductor carbide, a semiconductor oxycarbonitride, etc.), polysilicon, SOG, TEOS, PE-oxide, HARP-formed oxide, and/or other suitable material. In some examples, the gate cap 1602 includes silicon oxycarbonitride. The gate cap 1602 may be formed to any suitable thickness using any suitable deposition technique (e.g., CVD, HDP-CVD, ALD, etc.). In some examples, the gate cap 1602 has a thickness between about 1 nm and about 10 nm, and is deposited by a CVD and/or ALD process. The gate cap 1602 is not shown in the top view of FIG. 26A to avoid obscuring other elements of the workpiece 2200.

Figure 27A:
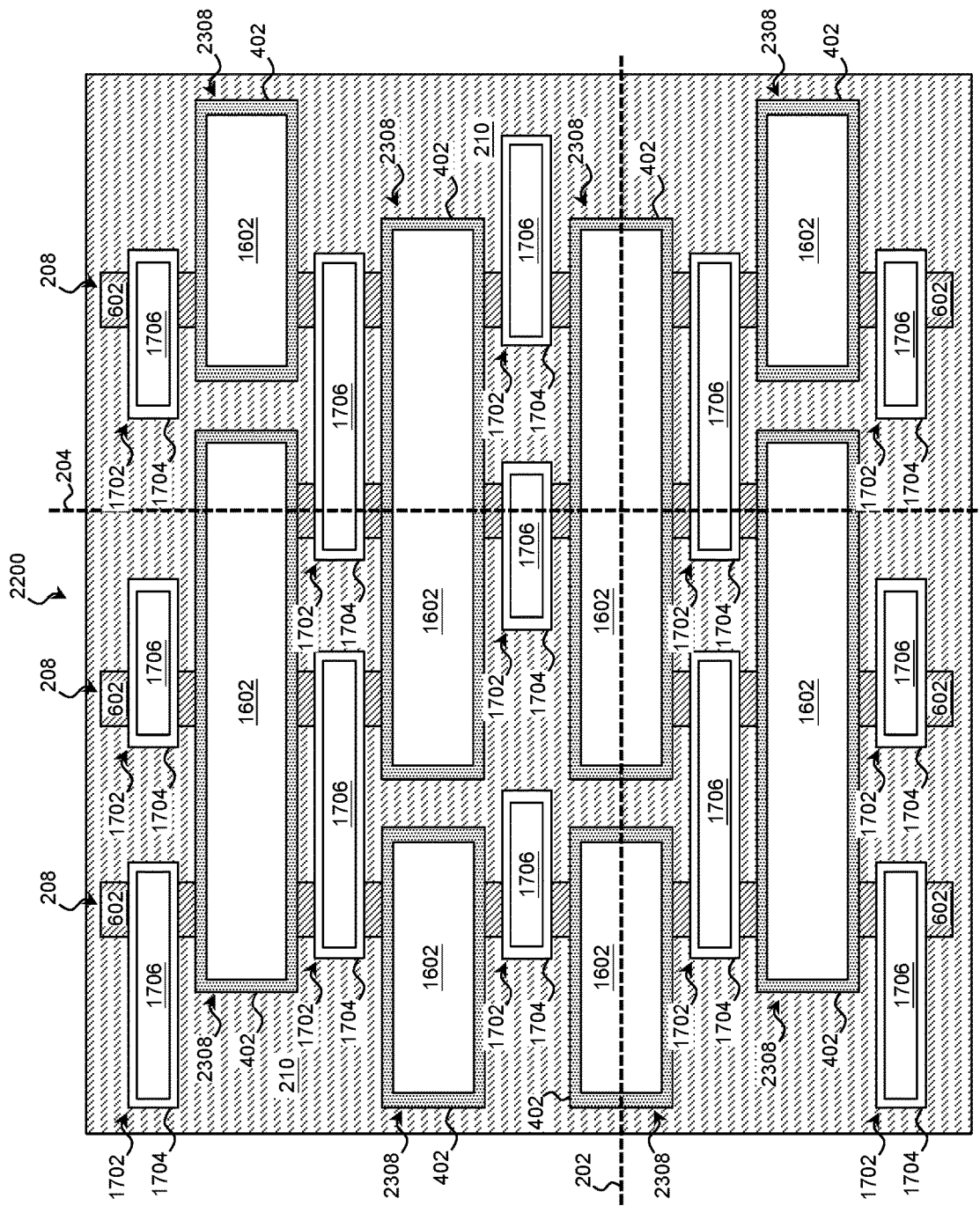
Figure 27B:
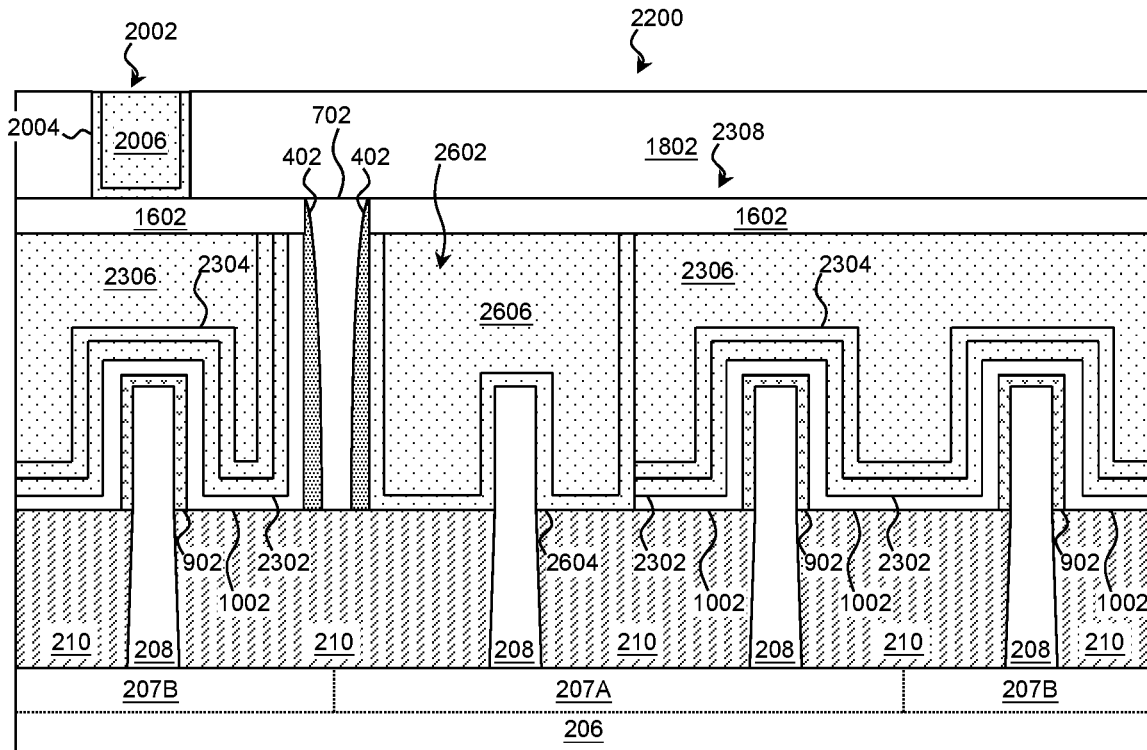
Figure 27C:
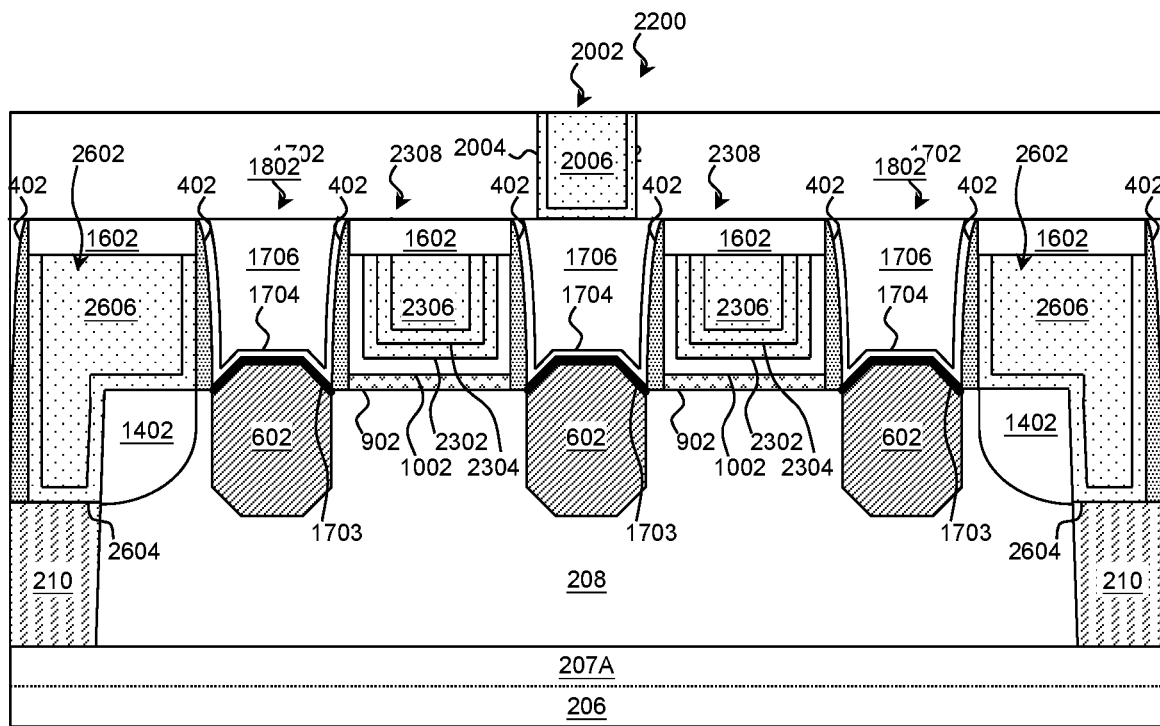

Referring to block 2114 of FIG. 21, the processes of blocks 132-142 of FIG. 1B may be performed on the workpiece 2200. For example, referring to FIGS. 26A-26C, the first ILD layer 702 is patterned to expose portions of the source/drain features 602, and source/drain contacts 1702 are formed that physically and electrically couple to the source/drain features 602 and that extend through the first ILD layer 702. Referring to FIGS. 27A-27C, a second ILD layer 1802 is formed on the workpiece 2200, the second ILD layer 1802 and the gate cap 1602 are patterned to expose portions of the source/drain contacts 1702 and portions of the gate structures 2308, contacts 2002 are formed physically and electrically coupled to the source/drain contacts 1702 and to the gate structures 2308, and the workpiece 2200 is provided for further fabrication. These processes and their respective elements may be substantially as described above.

Figure 28:
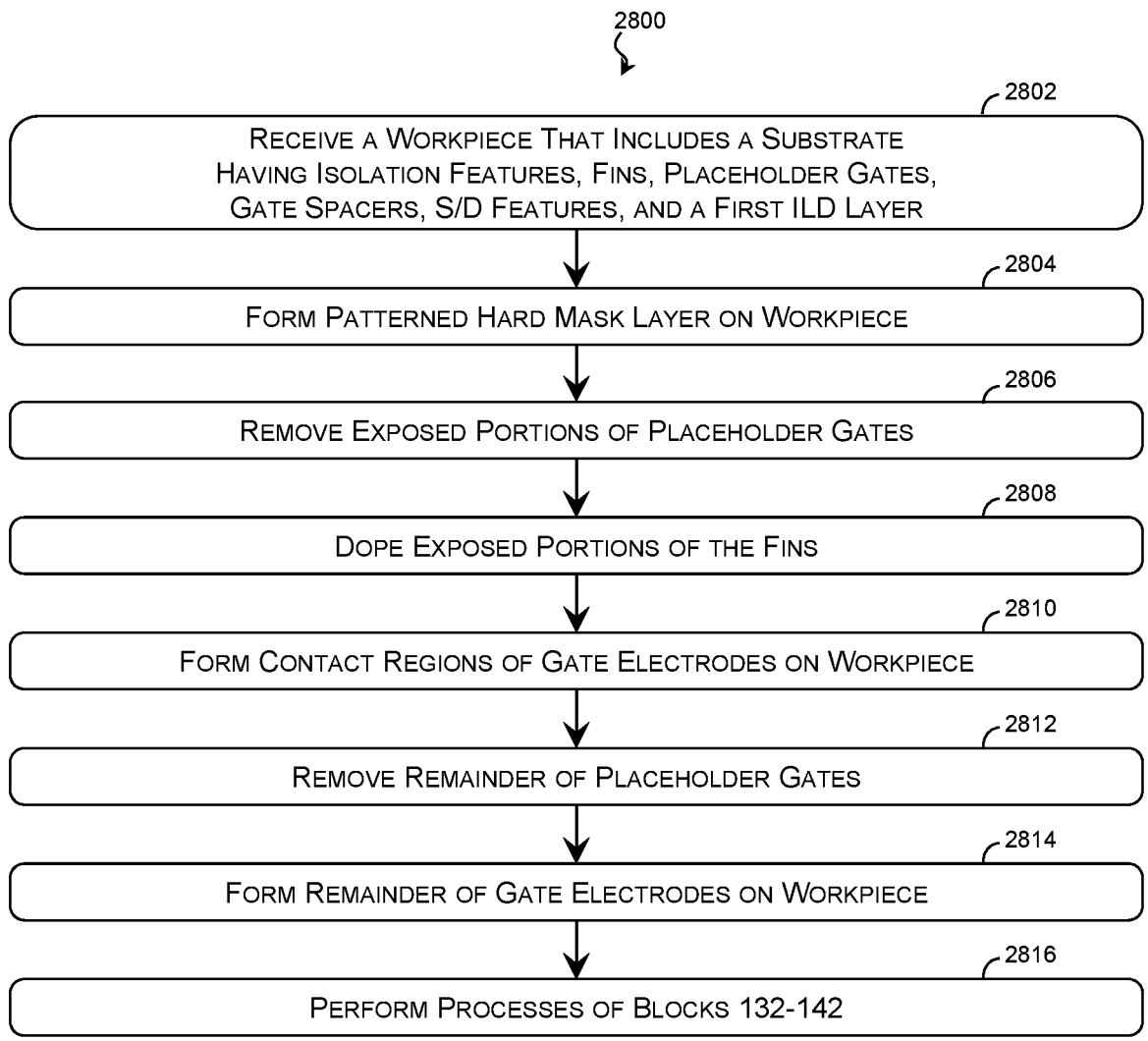
FIG. 28 is a flow diagram of a method of fabricating a workpiece with a contacting gate having a varying composition according to various aspects of the present disclosure.

In the above examples, the portions of the gate electrodes that function as contacts are formed after the portions of the gate electrodes that function as device gates. In further examples, the contact portions of the gate electrodes are formed before the gate portions. FIG. 28 is a flow diagram of a method 2800 of fabricating a workpiece 2900 with a contacting gate having a varying composition according to various aspects of the present disclosure. Additional steps can be provided before, during, and after the method 2800, and some of the steps described can be replaced or eliminated for other embodiments of the method 2800.

FIGS. 29A, 30A, 31A, 32A, 33A, and 34A are top view diagrams of the workpiece 2200 at various points in the method 2800 of fabrication according to various aspects of the present disclosure. FIGS. 29B, 30B, 31B, 32B, 33B, and 34B are cross-sectional diagrams of the workpiece 2200 taken along a gate plane 202 at various points in the method 2800 of fabrication according to various aspects of the present disclosure. FIGS. 29C, 30C, 31C, 32C, 33C, and 34C are cross-sectional diagrams of the workpiece 2200 taken along a fin-length plane 204 at various points in the method 2800 of fabrication according to various aspects of the present disclosure. FIGS. 29A-34C have been simplified for the sake of clarity and to better illustrate the concepts of the present disclosure. Additional features may be incorporated into the workpiece 2900, and some of the features described below may be replaced or eliminated for other embodiments of the workpiece 2900.

Figure 29A:
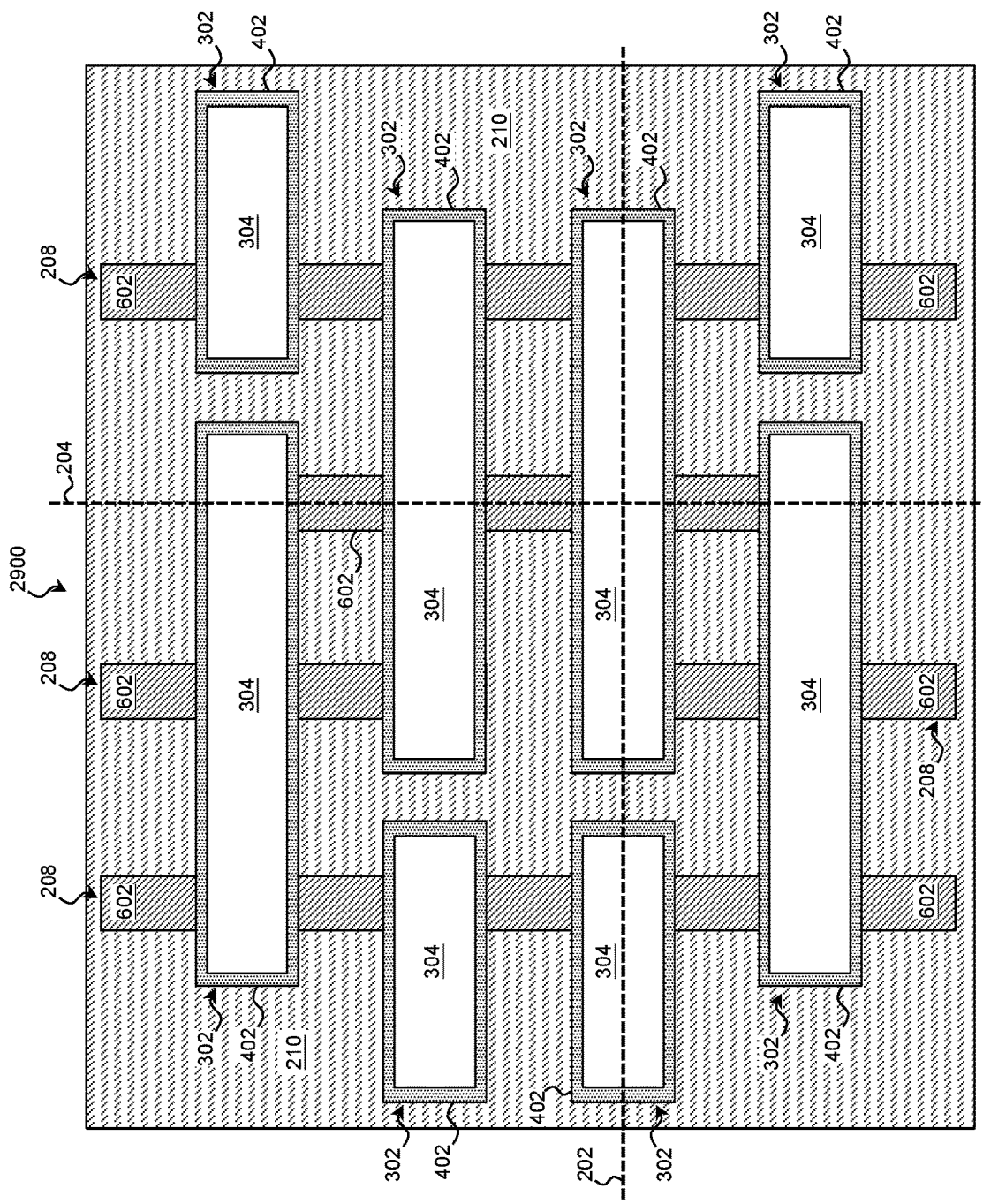
FIGS. 29A, 30A, 31A, 32A, 33A, and 34A are top view diagrams of the workpiece at various points in the method of fabrication according to various aspects of the present disclosure.
Figure 29B:
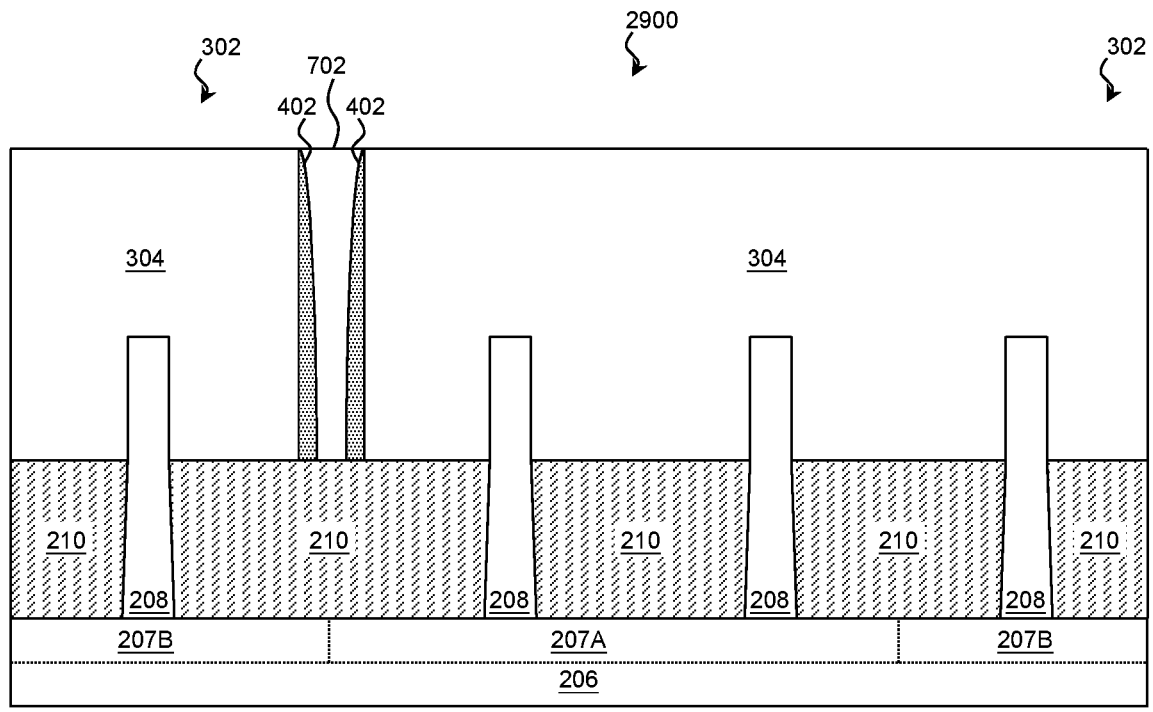
FIGS. 29B, 30B, 31B, 32B, 33B, and 34B are cross-sectional diagrams of the workpiece taken along a gate plane at various points in the method of fabrication according to various aspects of the present disclosure.
Figure 29C:
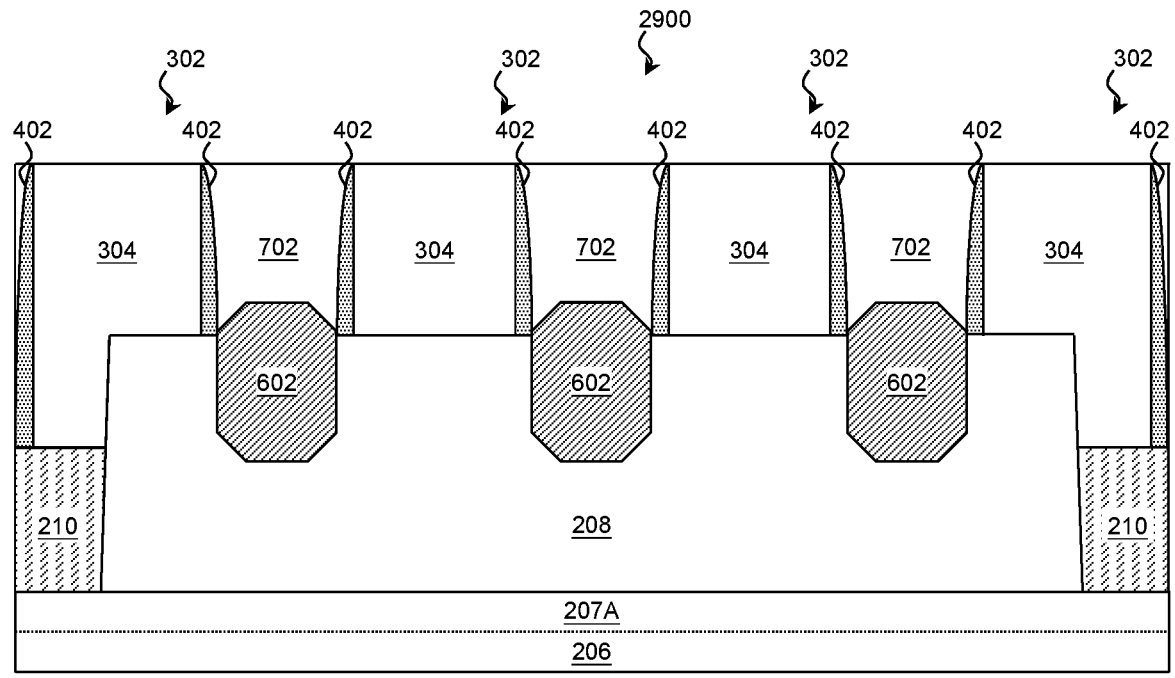
FIGS. 29C, 30C, 31C, 32C, 33C, and 34C are cross-sectional diagrams of the workpiece taken along a fin-length plane at various points in the method of fabrication according to various aspects of the present disclosure.

Referring to block 2802 of FIG. 28 and to FIGS. 29A-29C, a workpiece 2900 is received that includes a substrate 206 having fins 208, isolation features 210, placeholder gates 302, gate spacers 402, source/drain features 602, and a first ILD layer 702 disposed on the substrate 206. These elements may be substantially similar to those described above and may be formed by any suitable technique including the processes described above in blocks 102-112 of FIG. 1A.

Figure 30A:
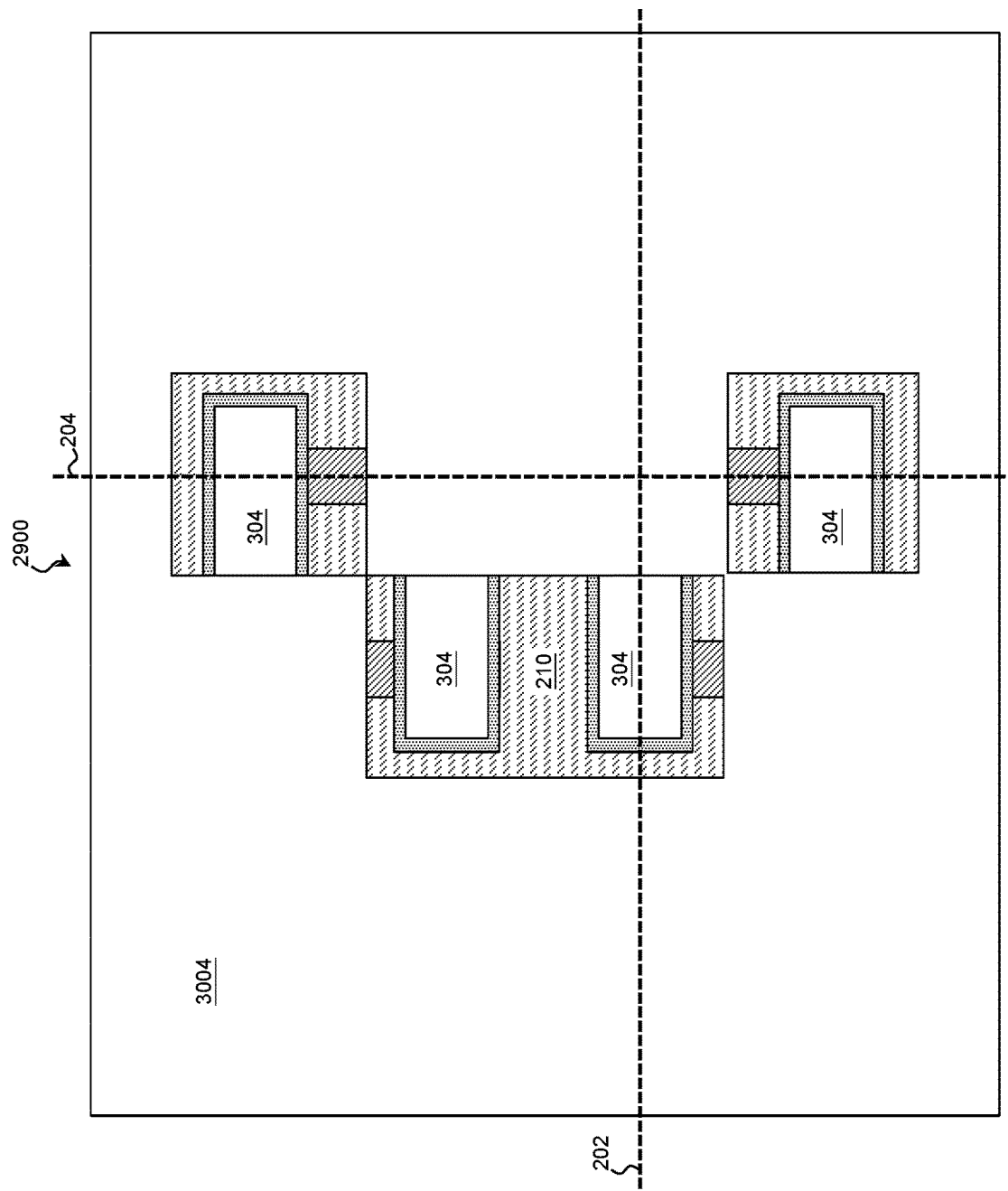
Figure 30B:
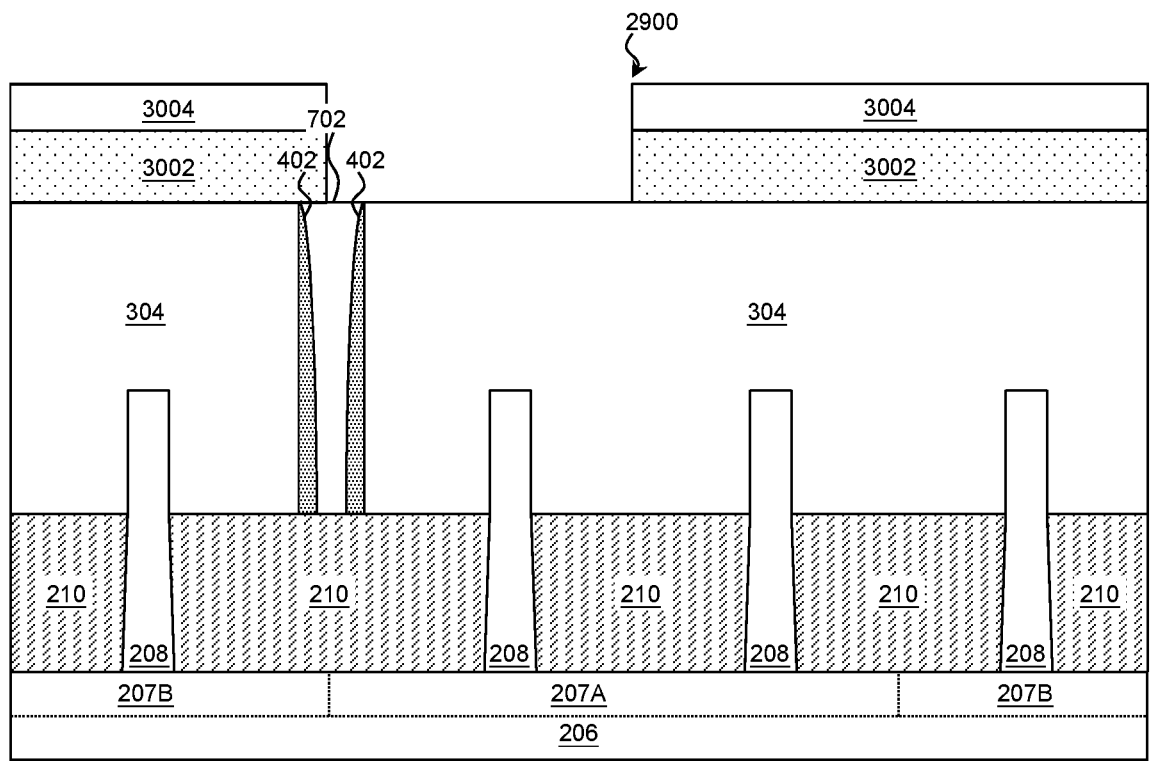
Figure 30C:
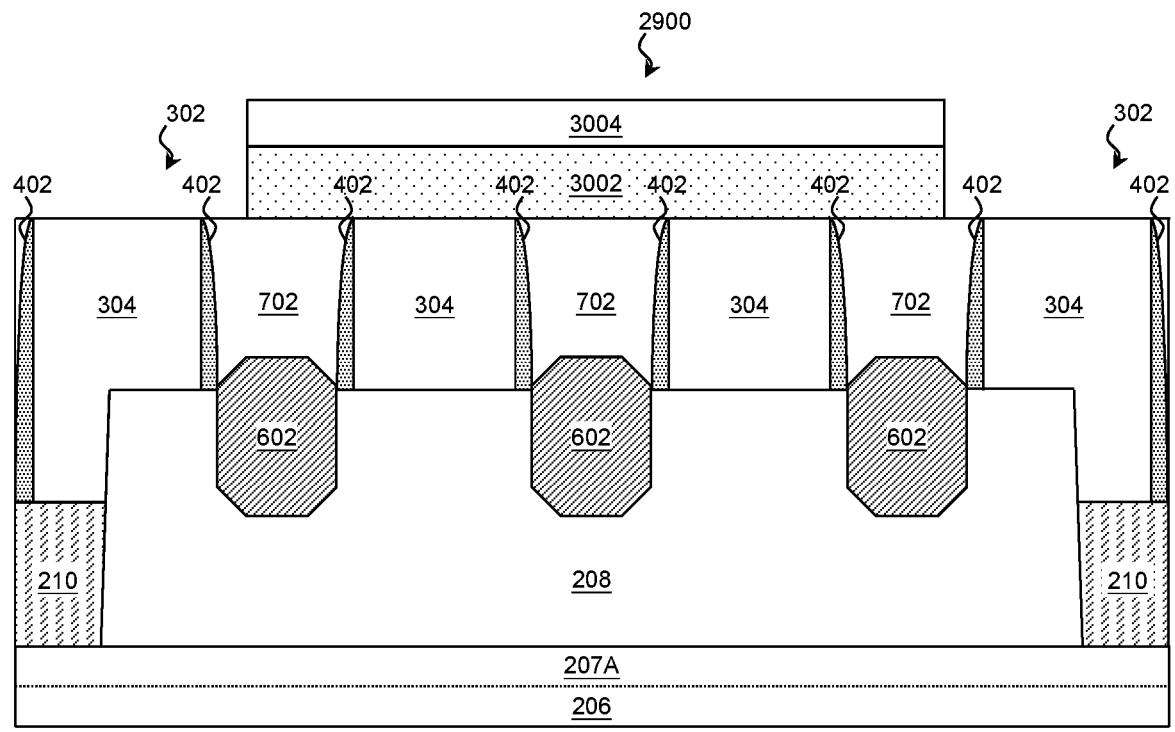

Referring to block 2804 of FIG. 28 and to FIGS. 30A-30C, a patterned hard mask layer 3002 is formed on the workpiece 2900, which may include forming a patterned photoresist layer 3004 on the hard mask layer 3002. The hard mask layer 3002 may include any suitable material, and in various examples includes a dielectric material (e.g., a semiconductor oxide, a semiconductor nitride, a semiconductor oxynitride, a semiconductor carbide, a semiconductor oxycarbonitride, etc.), and/or other suitable material. The hard mask layer 3002 may be formed using any suitable process including CVD, HDP-CVD, PVD, ALD, spin-on deposition, and/or other suitable deposition processes.

The hard mask layer 3002 is patterned to expose those regions where the placeholder gates 302 are to be removed so that the forthcoming conductive material electrically contacts the fins 208. In an example, the hard mask layer 3002 is patterned in a photolithographic process that includes: forming the photoresist layer 3004 on the hard mask layer 3002, lithographically exposing the photoresist layer 3004, and developing the exposed photoresist layer 3004 to expose portions of the hard mask layer 3002 to be removed. The photolithographic process may be performed substantially as described in block 104 of FIG. 1A.

Following the photolithographic process, the patterning of block 2804 may include an etching process to remove the exposed regions of the hard mask layer 3002. The etching processes may include any suitable etching technique, such as wet etching, dry etching, RIE, ashing, and/or other etching methods. The etching process may use any suitable etchant including an oxygen-based etchant, a fluorine-based etchant, a chlorine-based etchant, a bromine-based etchant, an iodine-based etchant, other suitable etchant liquids, gases, or plasmas, and/or combinations thereof. In an example, the etching process includes an isotropic etching technique using an etchant configured to remove the material of the hard mask layer 3002 without substantial etching of the photoresist layer 3004 or the surrounding materials such as the placeholder gates 302, the gate spacers 402, and the first ILD layer 702. The etching may expose portions of the placeholder gate material 304 to be removed.

Figure 31A:
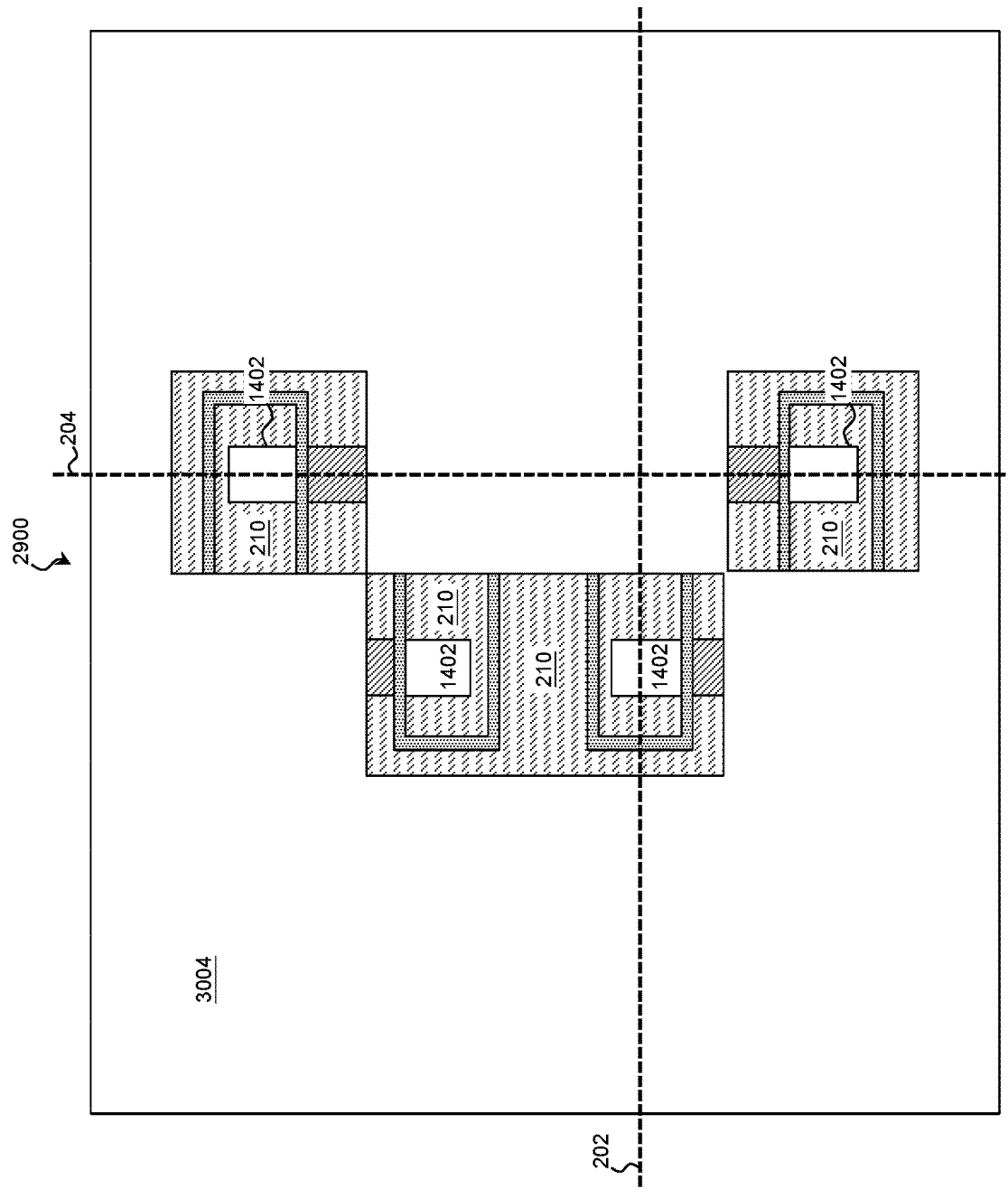
Figure 31B:
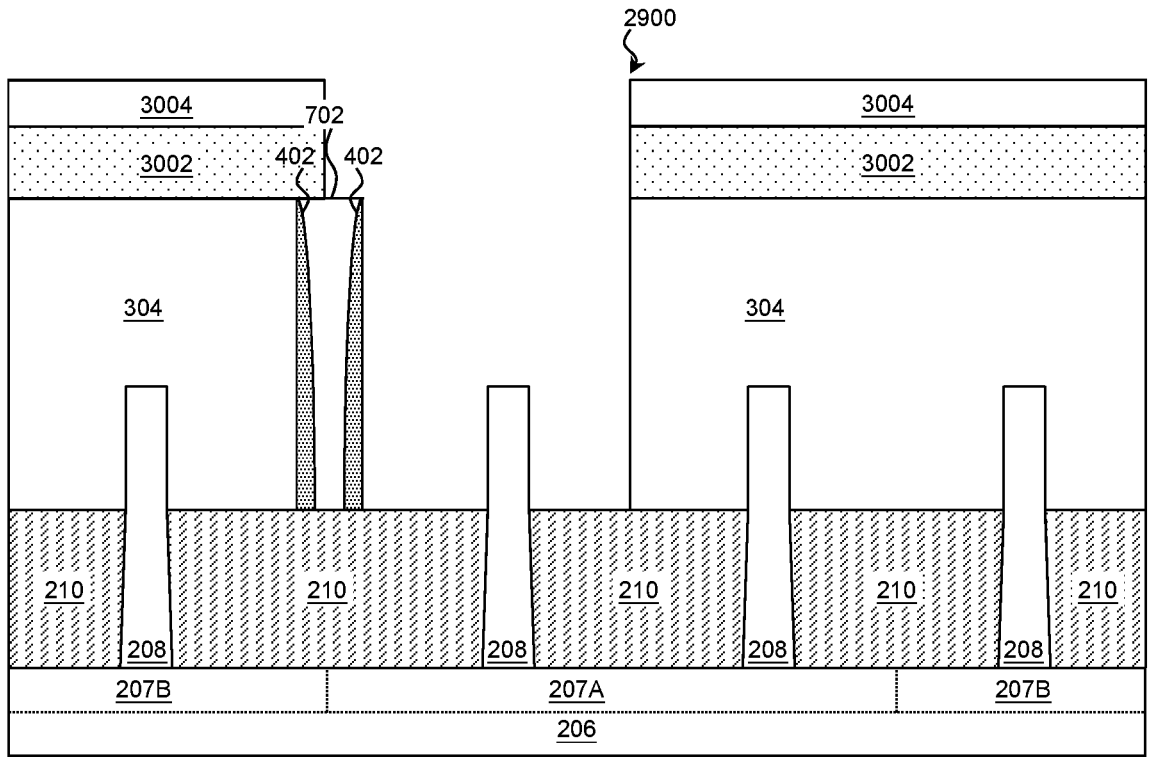
Figure 31C:
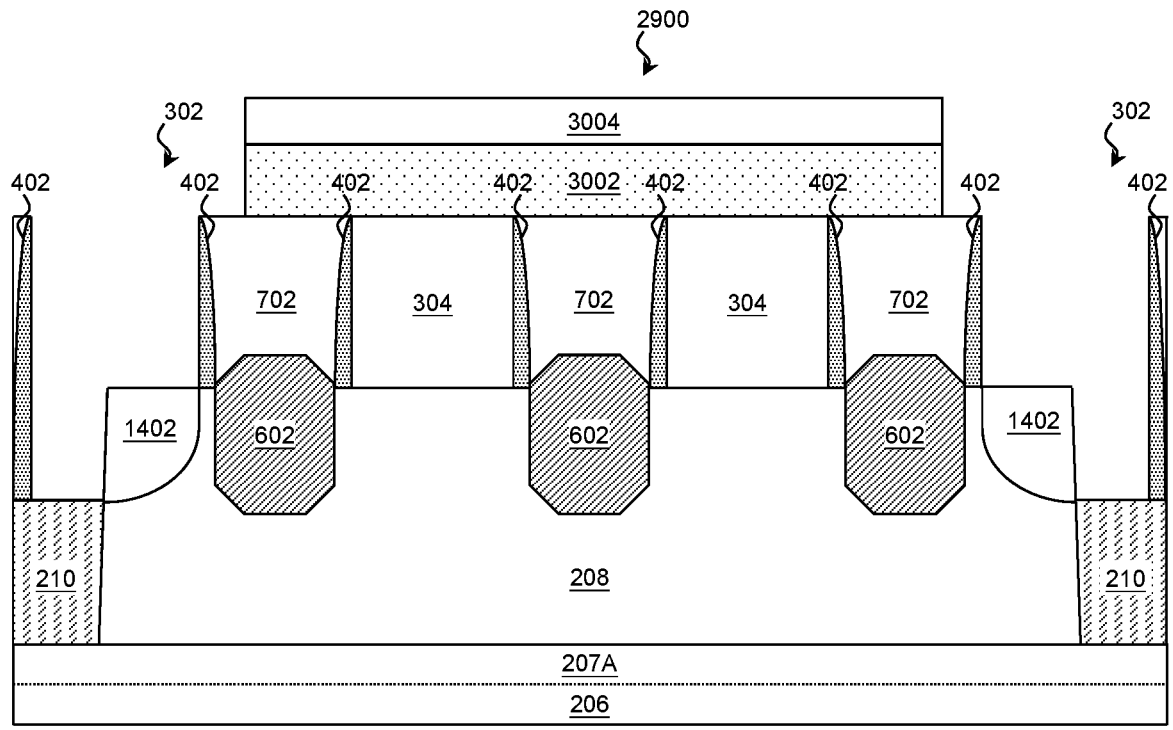

Referring to block 2806 of FIG. 28 and to FIGS. 31A-31C, the exposed portions of the placeholder gate material 304 is removed from the fins 208 at locations where the forthcoming conductive material is to couple to the fins 208. This may include performing an etching process, such as wet etching, dry etching, RIE, ashing, and/or other etching methods. The etching process may use any suitable etchant including an oxygen-based etchant, a fluorine-based etchant, a chlorine-based etchant, a bromine-based etchant, an iodine-based etchant, other suitable etchant liquids, gases, or plasmas, and/or combinations thereof. In one such example, the etching process uses an etchant and technique configured to remove the placeholder gate material 304 without significant etching of the fins 208, the source/drain features 602, the hard mask layer 3002, the gate spacers 402, or the other surrounding materials.

Referring to block 2808 of FIG. 28 and to referring still to FIGS. 31A-31C, the portions of the fins 208 where the gate electrodes are to make contact are doped to reduce the resistance between the contacting gate electrodes and the adjacent source/drain features 602. The doped regions of the fins 208 may be substantially as described above and are indicated by marker 1402. In some examples, the doped regions 1402 of the fins 208 are doped using an ion implantation process with a dopant species of the same type (e.g., n-type or p-type) as the dopant in the adjacent source/drain features 602, which is the opposite of the type of dopant in the remainder of the fin 208. In such examples where the source/drain features 602 include a p-type dopant such as boron, the doped regions 1402 of the fins 208 are doped to include boron (boron-11, $BF_2$, etc.), indium, or other p-type dopants. In such examples where the source/drain features 602 include an n-type dopant such as phosphorus or arsenic, the regions 1402 of the fins 208 are doped to include phosphorus, arsenic, and/or other n-type dopants. The doped regions 1402 may be doped to any suitable dopant concentration, and in various examples, the dopant concentration is between about $1 \times 10^{14}$ atoms/cm$^2$ and about $5 \times 10^{15}$ atoms/cm$^2$. The hard mask layer 3002 and/or the photoresist layer 3004 may be used as implantation masks that protect the remainder of the fins 208 from the dopant species.

Figure 32A:
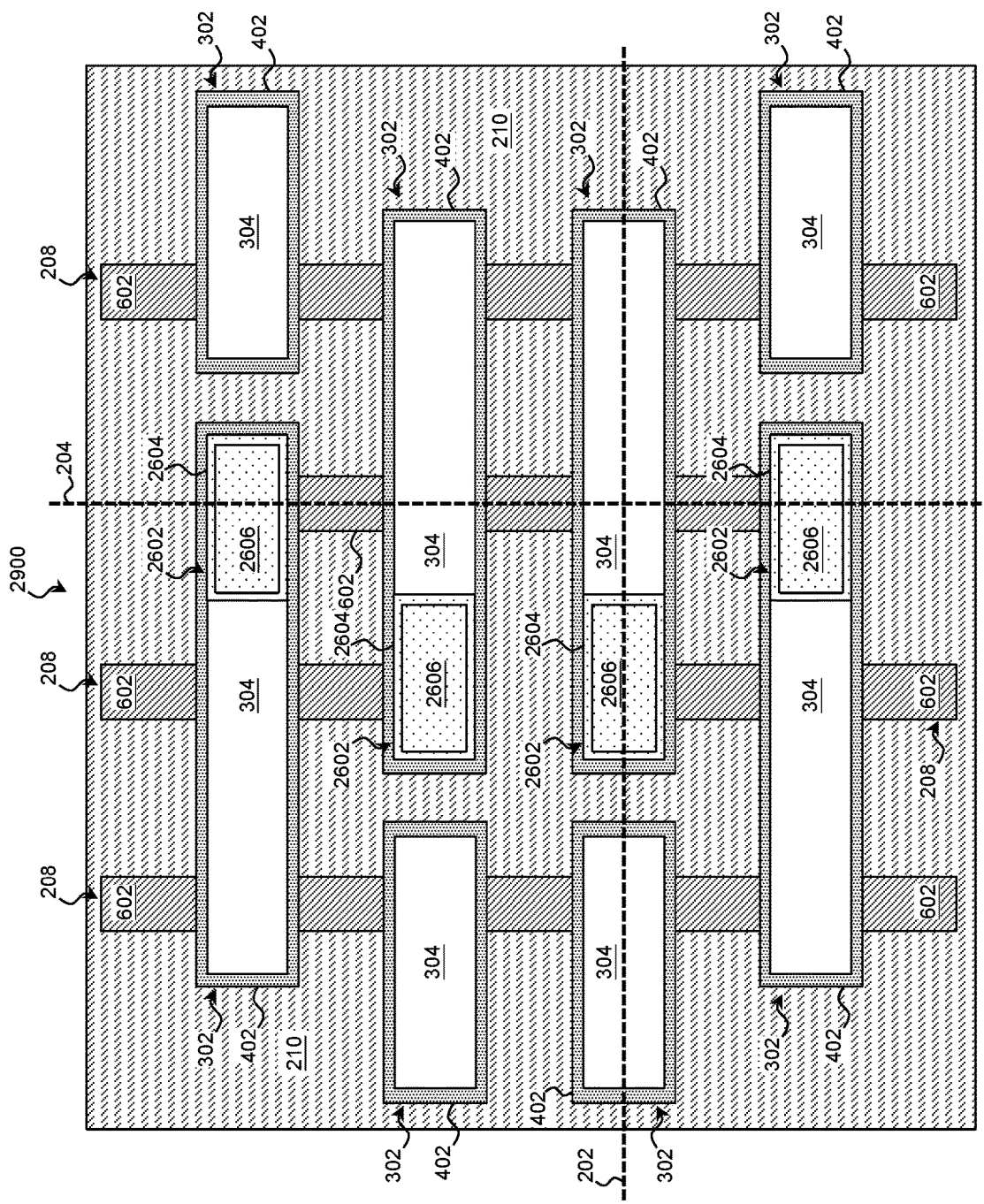
Figure 32B:
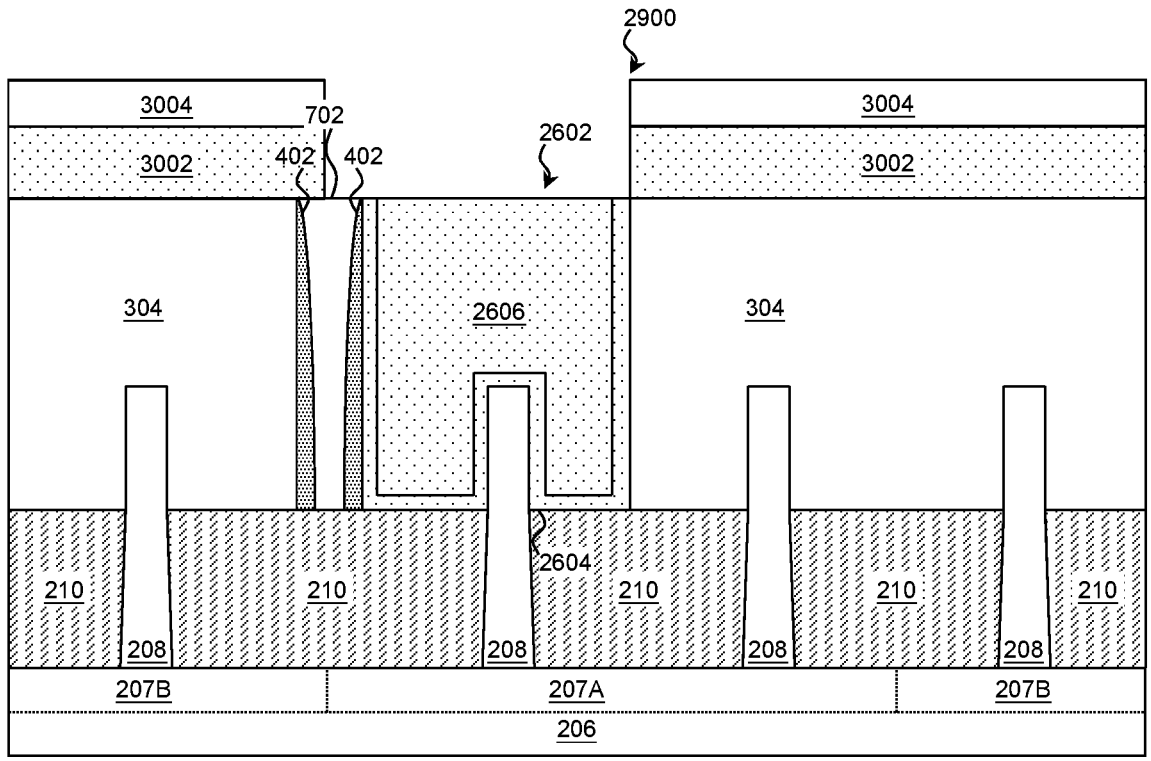
Figure 32C:
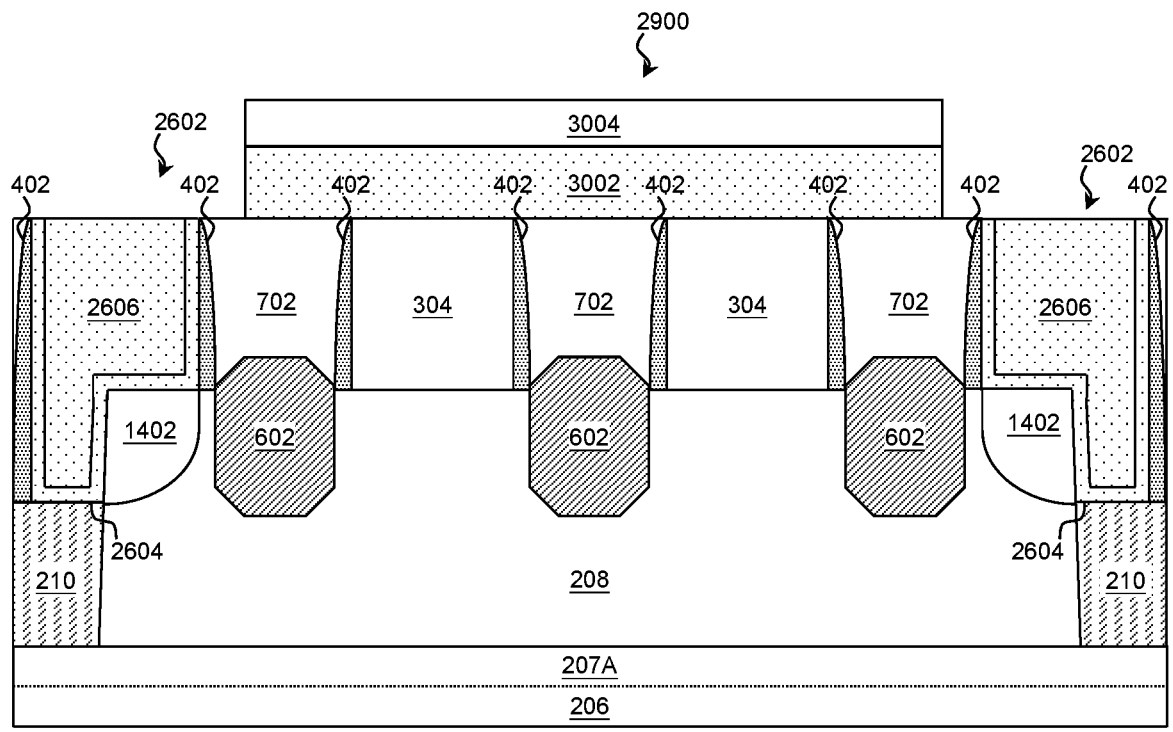

Referring to block 2810 of FIG. 28 and to referring to FIGS. 32A-32C, contact regions 2602 of the gate electrodes are formed on the workpiece 2900. The contact regions 2602 are formed in regions where the gate electrodes function as contacts and may be substantially similar to those described above.

The contact regions 2602 may include a number of different conductive layers. In some examples, forming a contact region 2602 includes forming an interface layer 2604 on the workpiece 2900. The interface layer 2604 may be formed directly on the horizontal top surface and the vertical side surfaces of the fins 208 in regions where the gate electrodes function as contacts. To decrease resistance, a fin 208 may not extend along the fin-length direction through the entire gate electrode. This provides an additional vertical surface at the fin end where the contact region 2602 (e.g., the interface layer thereof) may physically and electrically couple to the fin 208.

The interface layer 2604 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various examples, the interface layer 2604 includes Ti, Co, or Ni, which form a silicide at an interface with a semiconductor such as that of the fin 208 and thereby reduce the resistance at the interface. In some such examples, an annealing process is performed after depositing the interface layer 2604 to form the silicided interface.

Other conductive layers may be formed on the interface layer 2604. For example, an electrode fill 2606 may be formed on the interface layer 2604. The electrode fill 2606 may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 2606 may be deposited by any suitable technique including ALD, CVD, PE CVD, PEALD, PVD, and/or combinations thereof.

A CMP process may be performed to remove excess material (e.g., material of the interface layer 2604 and/or the electrode fill 2606) that is outside of the gate structures 2308 along with the hard mask layer 3002 and photoresist layer 3004.

Figure 33A:
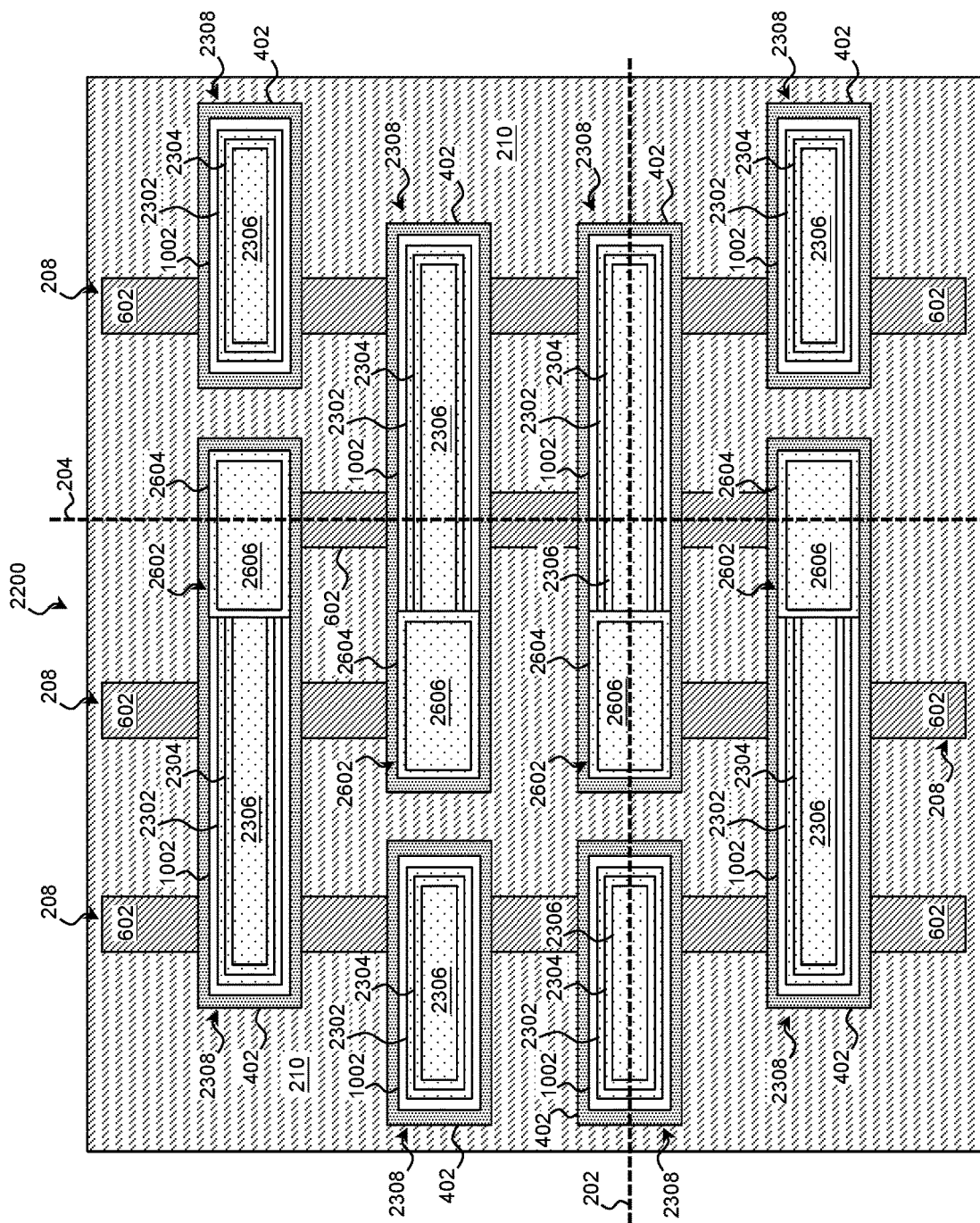
Figure 33B:
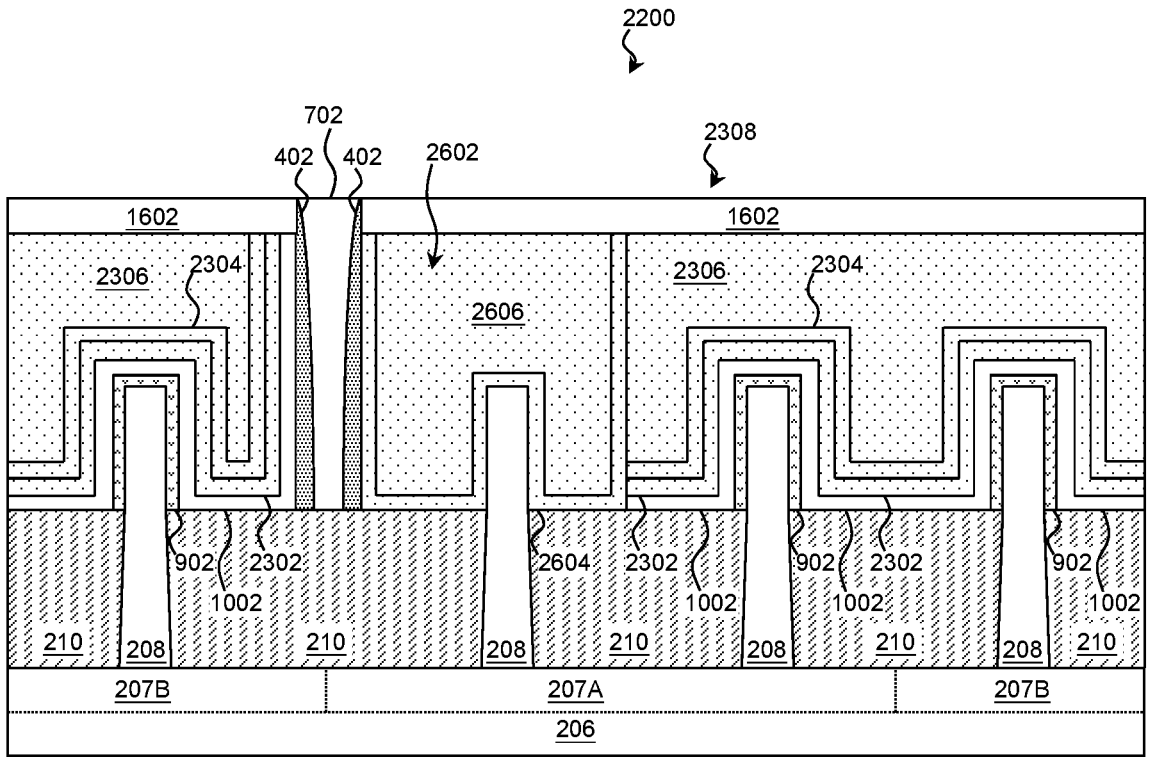
Figure 33C:
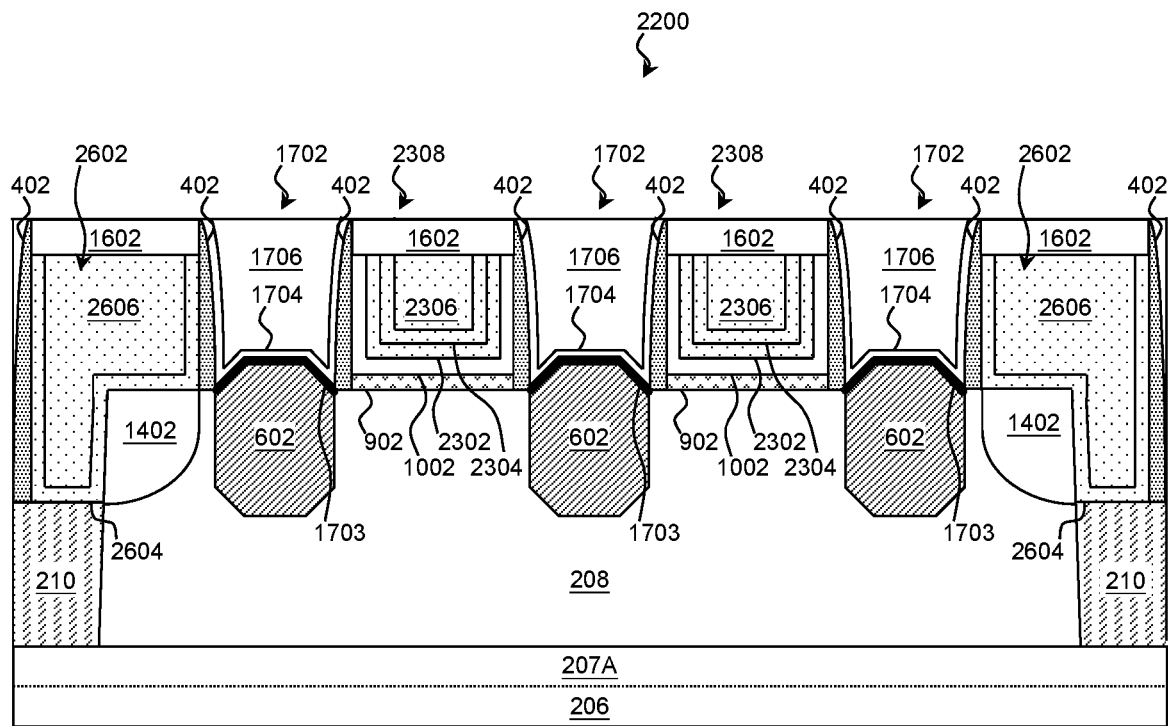

Referring to block 2812 of FIG. 28 and to FIGS. 33A-33C, the remainder of the placeholder gates 302 is removed. This may be performed substantially as described in block 114 of FIG. 1A. Removing the placeholder gate material 304 may include one or more etching processes (e.g., wet etching, dry etching, RIE) using an etchant chemistry configured to selectively etch the placeholder gate material 304 without significant etching of the surrounding materials, such as the fins 208, the source/drain features 602, the gate spacers 402, the first ILD layer 702, the contact regions 2602 of the gate electrodes, etc.

Referring to block 2814 of FIG. 28 and referring still to FIGS. 33A-33C, the remainder of the gate electrodes are formed on the workpiece 2900. This may be performed substantially as described in block 130 of FIG. 1B and/or block 2104 of FIG. 21.

The gate electrodes may include a number of different conductive layers. In some examples, forming a gate electrode includes forming a capping layer 2302 on the workpiece 200. The capping layer 2302 may be formed directly on the gate dielectric 1002.

The capping layer 2302 may be substantially similar in composition to capping layer 1502 and may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various embodiments, the capping layer 2302 includes TaSiN, TaN, and/or TiN.

In some examples, forming a gate electrode includes forming one or more work function layers 2304 on the capping layer 2302. The work function layers 2304 may be substantially similar in composition to work function layers 1504 and suitable work function layer 2304 materials include n-type and/or p-type work function materials based on the type of device to which the gate structure 2308 corresponds. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 2304 may be deposited by any suitable technique including ALD, CVD, PE CVD, PEALD, PVD, and/or combinations thereof. Because the p-type and n-type devices may have different work function layers 2304, in some examples, the n-type work function layers 2304 are deposited in a first deposition process that uses a dielectric hard mask to prevent depositing on the electrodes of the p-type devices, and the p-type work function layers 2304 are deposited in a second deposition process that uses a dielectric hard mask to prevent depositing on the electrodes of the n-type devices.

In some examples, forming a gate electrode includes forming an electrode fill 2306 on the work function layer(s) 2304. The electrode fill 2306 may be substantially similar to electrode fill 1506 and may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 2306 may be deposited by any suitable technique including ALD, CVD, PE CVD, PEALD, PVD, and/or combinations thereof.

A CMP process may be performed to remove electrode material (e.g., material of: the capping layer 2302, the work function layer(s) 2304, the electrode fill 2306, etc.) that is outside of the gate structures 2308.

In some examples, the process includes recessing the materials of the gate structures 2308 including the contact regions 2602 (e.g., the gate dielectric 1002, the capping layer 2302, the work function layer(s) 2304, the electrode fill 2306, the interface layer 2604, the electrode fill 2606, etc.) and forming a gate cap 1602 on the recessed gate structures 2308. The gate cap 1602 may be substantially similar to that above and may include any suitable material, such as: a dielectric material (e.g., a semiconductor oxide, a semiconductor nitride, a semiconductor oxynitride, a semiconductor carbide, a semiconductor oxycarbonitride, etc.), polysilicon, SOG, TEOS, PE-oxide, HARP-formed oxide, and/or other suitable material. In some examples, the gate cap 1602 includes silicon oxycarbonitride. The gate cap 1602 may be formed to any suitable thickness using any suitable deposition technique (e.g., CVD, HDP-CVD, ALD, etc.). In some examples, the gate cap 1602 has a thickness between about 1 nm and about 10 nm, and is deposited by a CVD and/or ALD process. The gate cap 1602 is not shown in the top view of FIG. 33A to avoid obscuring other elements of the workpiece 2900.

Figure 34A:
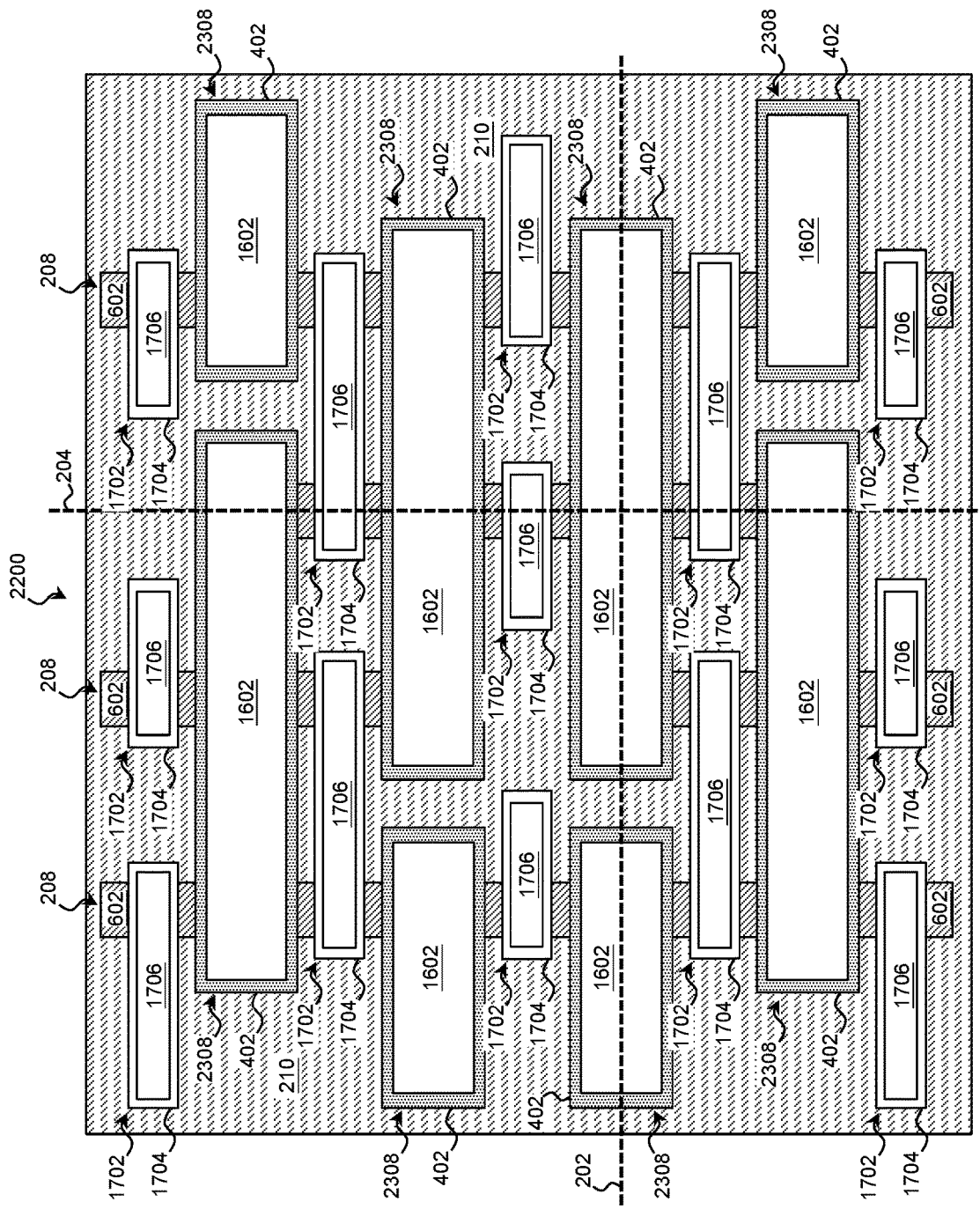
Figure 34B:
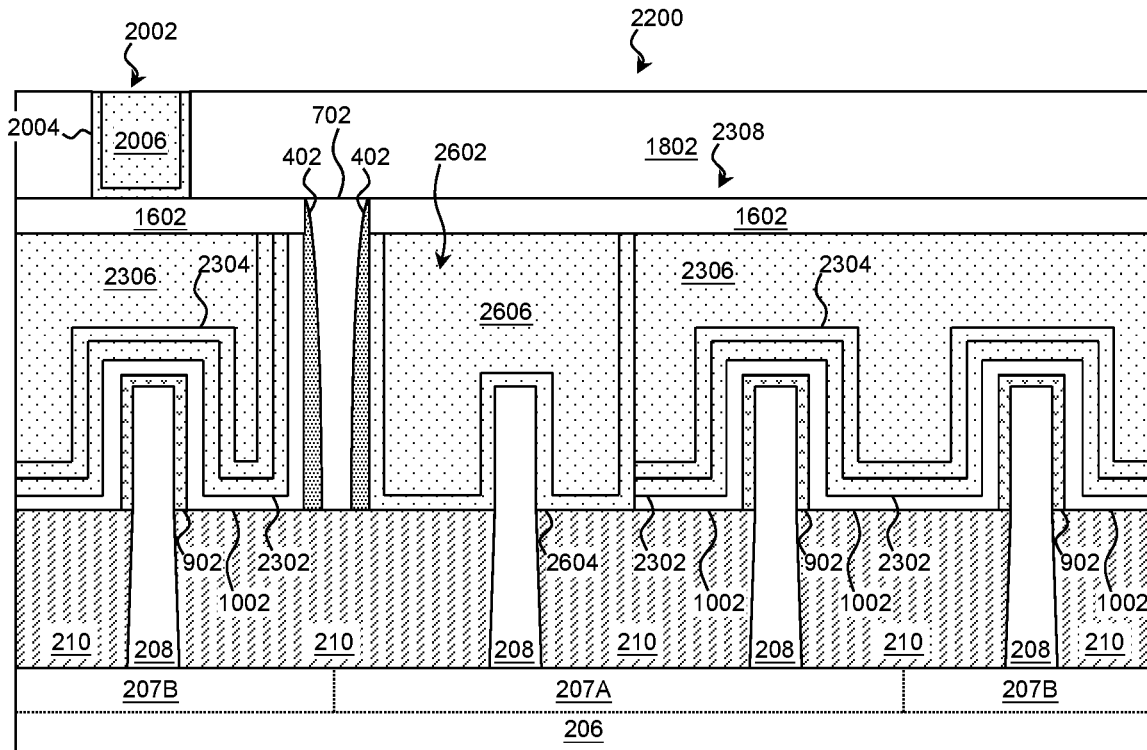
Figure 34C:
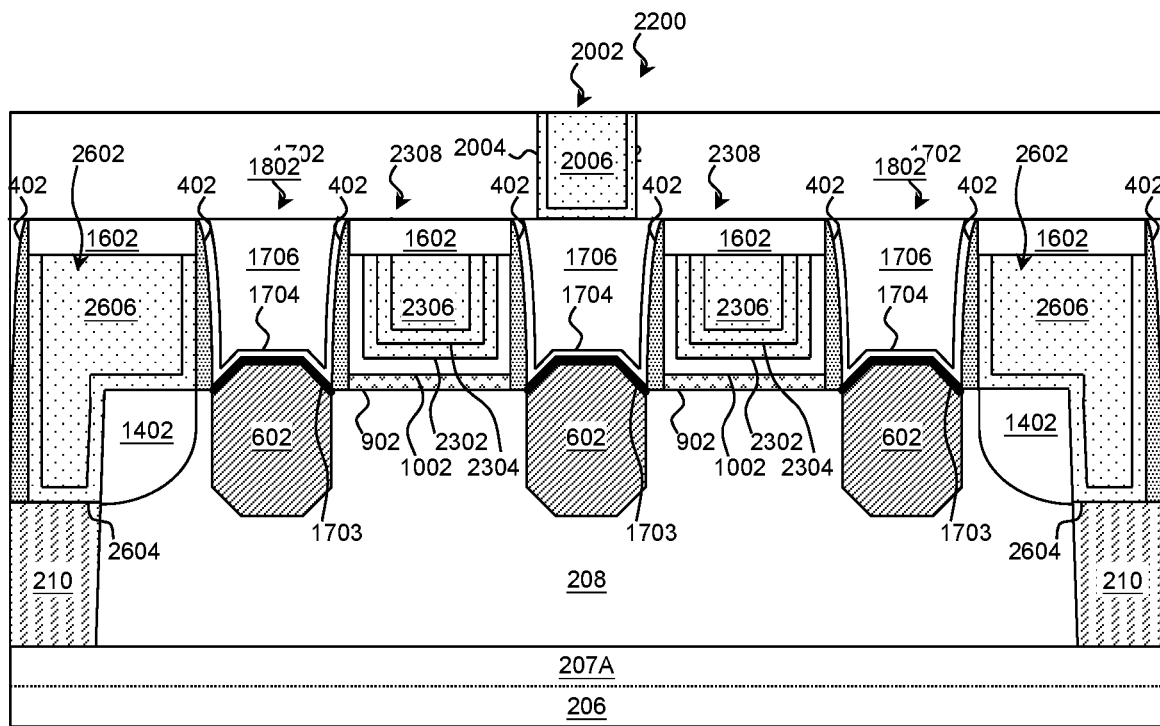

Referring to block 2816 of FIG. 28, the processes of blocks 132-142 of FIG. 1B may be performed on the workpiece 2900. For example, referring to FIGS. 33A-33C, the first ILD layer 702 is patterned to expose portions of the source/drain features 602, and source/drain contacts 1702 are formed that physically and electrically couple to the source/drain features 602 and that extend through the first ILD layer 702. Referring to FIGS. 34A-34C, a second ILD layer 1802 is formed on the workpiece 2900, the second ILD layer 1802 and the gate cap 1602 are patterned to expose portions of the source/drain contacts 1702 and portions of the gate structures 2308, contacts 2002 are formed physically and electrically coupled to the source/drain contacts 1702 and to the gate structures 2308, and the workpiece 2900 is provided for further fabrication. These processes and their respective elements may be substantially as described above.

Thus, the present disclosure provides examples of an integrated circuit with a contacting gate structure and a method for forming the integrated circuit. In some examples, an integrated circuit device includes a memory cell that includes a plurality of fins and a gate extending over a first fin of the plurality of fins and a second fin of the plurality of fins. The gate includes a gate electrode that physically contacts the first fin and a gate dielectric disposed between the gate electrode and the second fin. In some such examples, the first fin includes a source/drain region and a doped region that physically contacts the gate electrode, the source/drain region includes a first dopant of a first type, the doped region includes a second dopant of the first type. In some such examples, a remainder of the first fin includes a third dopant of a second type that is opposite the first type. In some such examples, the gate electrode physically contacts a top surface and a pair of opposing side surfaces of the first fin. In some such examples, the gate electrode extends beyond the first fin in a fin-length direction such that the gate electrode further physically contacts a surface at an end of the first fin. In some such examples, the memory cell includes: a first pull-up device, a second pull-up device, a first pull-down device, a second pull-down device, a first pass-gate device, and a second pass-gate device formed on the plurality of fins. The gate electrode extends over the first pull-down device and the first pull-up device and physically contacts the first fin to couple to a source/drain feature of the second pull-up device. In some such examples, the gate is a first gate and the gate electrode is a first gate electrode. In such examples, the integrated circuit device further includes a second gate that includes a second gate electrode that extends over the second pull-down device and the second pull-up device and physically contacts the second fin to couple to a source/drain feature of the first pull-up device. In some such examples, a silicide is disposed at an interface between the gate electrode and the first fin. In some such examples, a first portion of the gate electrode that physically contacts the first fin has a different composition than a second portion of the gate electrode that extends over the second fin.

In further examples, a device includes: a first transistor disposed on a first fin, and a second transistor disposed on a second fin. The second transistor includes a gate electrode and a gate dielectric disposed between the gate electrode and the second fin, and the gate electrode physically contacts the first fin. In some such examples, the gate electrode is electrically coupled to a source/drain feature of the first transistor disposed on the first fin. In some such examples, the gate electrode is electrically coupled to the source/drain feature of the first transistor by a doped region of the first fin. In some such examples, the doped region includes a dopant of a first type, and the source/drain feature includes a dopant of the first type. In some such examples, a remainder of the first fin includes a dopant of a second type that is opposite the first type. In some such examples, the gate electrode physically contacts a top surface of the first fin. In some such examples, the gate electrode further physically contacts opposing side surfaces of the first fin. In some such examples, the gate electrode further physically contacts a fin end surface of the first fin.

In yet further examples, a method includes receiving a workpiece including a substrate and a plurality of fins extending from the substrate. A gate dielectric is formed on channel regions of the plurality of fins, and the gate dielectric is removed from a first fin of the plurality of fins without removing the gate dielectric from a second fin of the plurality of fins. A gate electrode is formed that physically contacts the first fin and that is separated from the second fin by the gate dielectric. In some such examples, removing the gate dielectric from the first fin includes: forming a hard mask on the gate dielectric, patterning the hard mask to expose a portion of the gate dielectric on the first fin, and etching using the hard mask to remove the exposed portion of the gate dielectric from the first fin. In some such examples, a portion of the first fin is implanted with a dopant using the hard mask, and the forming of the gate electrode forms the gate electrode to physically contact the implanted portion of the first fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
   a memory cell including:
   a plurality of fins; and
   a gate structure extending over a first fin of the plurality of fins and a second fin of the plurality of fins, wherein the gate structure includes:
      a first conductive region that physically contacts the first fin; and
      a second conductive region disposed over a gate dielectric interposed between the second conductive region and the second fin, and
      wherein the first fin includes a source/drain region and a doped region that physically contacts the first conductive region of the gate structure,
      wherein the source/drain region includes a first dopant of a first type; and
      wherein the doped region includes a second dopant of the first type.

2. The integrated circuit device of claim 1, wherein a remainder of the first fin includes a third dopant of a second type that is opposite the first type.

3. The integrated circuit device of claim 1, wherein the first conductive region of the gate structure physically contacts a top surface and a pair of opposing side surfaces of the first fin.

4. The integrated circuit device of claim 3, wherein the gate structure extends beyond the first fin in a fin-length direction such that the first conductive region of the gate structure further physically contacts a surface at an end of the first fin.

5. The integrated circuit device of claim 1, wherein:
   the memory cell includes: a first pull-up device, a second pull-up device, a first pull-down device, a second pull-down device, a first pass-gate device, and a second pass-gate device formed on the plurality of fins; and
   the first conductive region of the gate structure extends over the first pull-down device and the first pull-up device and physically contacts the first fin to couple to a source/drain feature of the second pull-up device.

6. The integrated circuit device of claim 5, wherein the gate structure is a first gate structure and the second conductive region of the first gate structure is a first gate electrode, the integrated circuit device further comprising:
   a second gate structure that includes a second gate electrode that extends over the second pull-down device and the second pull-up device and physically contacts the second fin to couple to a source/drain feature of the first pull-up device.

7. The integrated circuit device of claim 1, wherein the first conductive region of the gate structure has a different composition than the second conductive region of the gate structure.

8. The integrated circuit device of claim 1, wherein the first dopant and the second dopant are the same.

9. The integrated circuit device of claim 1, wherein the first dopant and the second dopant are different.

10. The integrated circuit device of claim 2, wherein a portion of the remainder of the first fin extends between the source/drain region and the doped region.

11. The integrated circuit device of claim 1, further comprising a sidewall spacer disposed along a side surface of the first conductive region such that the sidewall spacer physically contacts the side surface of the first conductive region.

12. The integrated circuit device of claim 11, wherein the gate dielectric extends to the first conductive region of the gate structure.

13. The integrated circuit device of claim 1, wherein the first conductive region is formed of a different material than the second conductive region.

14. The integrated circuit device of claim 1, further comprising an isolation structure interfacing with first fin.

15. The integrated circuit device of claim 14, wherein the first conductive region of the gate structure physically contacts the isolation structure.

16. A device comprising:
   a first transistor disposed on a first fin;
   a second transistor disposed on a second fin; and
   a gate electrode disposed such that a first portion is over the first fin and a second portion is over the second fin, wherein:
      the second transistor includes a gate dielectric disposed between the second portion of the gate electrode and the second fin; and
      the first portion of the gate electrode physically contacts the first fin to couple the first transistor to the second transistor, and
   wherein the gate electrode is electrically coupled to a source/drain feature of the first transistor disposed on the first fin,
   wherein the gate electrode is electrically coupled to the source/drain feature of the first transistor by a doped region of the first fin, and
   wherein the doped region includes a dopant of a first type, and the source/drain feature includes a dopant of the first type.

17. The device of claim 16, wherein a remainder of the first fin includes a dopant of a second type that is opposite the first type.

18. The device of claim 16, wherein the gate electrode physically contacts and surrounds a fin end surface of the first fin.

19. The device of claim 16, wherein the first transistor is a first PMOS pull-up device of an SRAM cell and is disposed over an n-well.

20. The device of claim 19, wherein the second transistor is a second PMOS pull-up device of the SRAM cell and is disposed over the n-well.

* * * * *